United States Patent
Kang et al.

(10) Patent No.: US 9,893,235 B2
(45) Date of Patent: *Feb. 13, 2018

(54) LIGHT EMITTING DEVICE AND LIGHT EMITTING APPARATUS HAVING THE SAME

(71) Applicant: LG INNOTEK CO., LTD., Seoul (KR)

(72) Inventors: Pil Geun Kang, Seoul (KR); Hee Seok Choi, Seoul (KR); Seok Beom Choi, Seoul (KR); Ju Won Lee, Seoul (KR); Deok Ki Hwang, Seoul (KR); Young Ju Han, Seoul (KR)

(73) Assignee: LG INNOTEK CO., LTD, Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/618,599

(22) Filed: Feb. 10, 2015

(65) Prior Publication Data

US 2015/0179884 A1 Jun. 25, 2015

Related U.S. Application Data

(63) Continuation of application No. 13/677,566, filed on Nov. 15, 2012, now Pat. No. 9,397,261.

(30) Foreign Application Priority Data

Nov. 16, 2011 (KR) ........................ 10-2011-0119823

(51) Int. Cl.
*H01L 33/22* (2010.01)
*H01L 33/40* (2010.01)
(Continued)

(52) U.S. Cl.
CPC .............. *H01L 33/22* (2013.01); *H01L 33/20* (2013.01); *H01L 33/40* (2013.01); *H01L 33/405* (2013.01);
(Continued)

(58) Field of Classification Search
CPC ....... H01L 33/36; H01L 33/40; H01L 33/405; H01L 33/42; H01L 33/44; H01L 33/22;
(Continued)

(56) References Cited

U.S. PATENT DOCUMENTS 5,012,969 A 5/1991 Hatada et al.
6,521,914 B2 2/2003 Krames et al.
(Continued)

FOREIGN PATENT DOCUMENTS

CN 1848470 A 10/2006
CN 1947222 A 4/2007
(Continued)

OTHER PUBLICATIONS

Translation of CN102130285, translated Apr. 2014.*
(Continued)

*Primary Examiner* — Lauren R Bell
(74) *Attorney, Agent, or Firm* — KED & Associates, LLP

(57) ABSTRACT

A light emitting device is provided a transmissive substrate; a first pattern portion including a protrusions; a second pattern portion including a concaves having a width smaller than a width of each protrusion; a light emitting structure including a first conductive semiconductor layer, a second conductive semiconductor layer and an active layer, under the transmissive substrate; a first electrode under the first conductive semiconductor layer; a reflective electrode layer under the second conductive semiconductor layer; a second electrode under the reflective electrode layer; a first connection electrode under the first electrode; a second connection electrode under the second electrode; and an insulating support member around the first electrode and the first connection electrode and around the second electrode and the second connection electrode. A transmissive resin layer is on the transmissive substrate and an insulating layer is
(Continued)

between the insulating support member and the reflective electrode layer.

20 Claims, 21 Drawing Sheets

(51) Int. Cl.
*H01L 33/44* (2010.01)
*H01L 33/64* (2010.01)
*H01L 33/20* (2010.01)
*H01L 33/62* (2010.01)
*H01L 33/50* (2010.01)

(52) U.S. Cl.
CPC .............. *H01L 33/44* (2013.01); *H01L 33/50* (2013.01); *H01L 33/62* (2013.01); *H01L 33/642* (2013.01); *H01L 33/644* (2013.01); *H01L 33/641* (2013.01); *H01L 2224/16245* (2013.01); *H01L 2924/01322* (2013.01)

(58) Field of Classification Search
CPC ....... H01L 33/20; H01L 33/64; H01L 33/641; H01L 33/642; H01L 33/644
See application file for complete search history.

(56) References Cited

U.S. PATENT DOCUMENTS

| | | | |
|---|---|---|---|
| 6,614,172 | B2 | 9/2003 | Chiu et al. |
| 6,642,652 | B2 | 11/2003 | Collins et al. |
| 8,012,779 | B2 | 9/2011 | Choi et al. |
| 2005/0194605 | A1 | 9/2005 | Shelton et al. |
| 2006/0204865 | A1* | 9/2006 | Erchak ............ H01L 33/20 430/7 |
| 2006/0231854 | A1 | 10/2006 | Chae et al. |
| 2007/0182323 | A1* | 8/2007 | Ogata ............ H01L 33/56 313/512 |
| 2008/0035953 | A1 | 2/2008 | Beom et al. |
| 2009/0078954 | A1 | 3/2009 | Shim et al. |
| 2009/0179207 | A1 | 7/2009 | Chitnis et al. |
| 2009/0236621 | A1 | 9/2009 | Chakraborty |
| 2010/0006888 | A1 | 1/2010 | Watanabe et al. |
| 2010/0140640 | A1 | 6/2010 | Shimokawa et al. |
| 2011/0018022 | A1 | 1/2011 | Okabe et al. |
| 2011/0156071 | A1* | 6/2011 | Cheng ............ H01L 33/44 257/98 |
| 2011/0198635 | A1 | 8/2011 | Kim et al. |
| 2011/0220910 | A1 | 9/2011 | Kojima et al. |
| 2011/0233586 | A1 | 9/2011 | Kojima et al. |
| 2011/0272706 | A1 | 11/2011 | Kwak et al. |
| 2011/0297986 | A1* | 12/2011 | Nishiuchi ........ H01L 33/0079 257/98 |
| 2011/0297987 | A1* | 12/2011 | Koizumi ........ H01L 33/44 257/98 |
| 2012/0100645 | A1 | 4/2012 | Lee et al. |
| 2012/0138999 | A1 | 6/2012 | Okabe et al. |
| 2012/0235204 | A1 | 9/2012 | Hodota et al. |
| 2013/0214245 | A1 | 8/2013 | Chang et al. |
| 2013/0234154 | A1 | 9/2013 | Kojima et al. |
| 2014/0008688 | A1 | 1/2014 | Shimokawa et al. |
| 2014/0124814 | A1 | 5/2014 | Cho et al. |

FOREIGN PATENT DOCUMENTS

| | | | |
|---|---|---|---|
| CN | 101127382 | | 2/2008 |
| CN | 102130285 A * | | 7/2011 ............ H01L 33/20 |
| EP | 1 855 327 A2 | | 11/2007 |
| EP | 2 194 586 A1 | | 6/2010 |
| EP | 2 216 834 A1 | | 8/2010 |
| EP | 2 226 855 A1 | | 9/2010 |
| EP | 2 369 642 | | 9/2011 |
| EP | 2 408 025 | | 1/2012 |
| JP | 2001-217467 | | 8/2001 |
| JP | 2003-007929 A | | 1/2003 |
| JP | 2003-282957 A | | 10/2003 |
| JP | 2008-47861 | | 2/2008 |
| JP | 2011-009572 | | 1/2011 |
| JP | 2011-061192 | | 3/2011 |
| JP | 2011-187679 | | 9/2011 |
| JP | 2011-1199193 A | | 10/2011 |
| KR | 10-1009744 | | 1/2011 |
| TW | 201138153 A1 | | 11/2011 |
| WO | WO 2010/082286 | | 7/2010 |
| WO | WO 2011/055249 | | 5/2011 |

OTHER PUBLICATIONS

U.S. Final Office Action issued in co-pending U.S. Appl. No. 13/677,566, dated Sep. 25, 2015.
European Office Action issued in Application No. 12192706.5 dated Jul. 3, 2015.
U.S. Office Action issued in U.S. Appl. No. 13/677,566, dated Jun. 25, 2015.
European Search Report dated Nov. 11, 2014, issued in Application No. 12192706.5 (English translation).
Office Action dated Jul. 1, 2014, issued in U.S. Appl. No. 13/677,566.
Final Office Action dated Oct. 30, 2014, issued in U.S. Appl. No. 13/677,566.
Chinese Office Action dated May 3, 2016 issued in Application 201210466543.3.
European Search Report dated Jul. 13, 2016 for Application EP 16 16 4199.
Japanese Office Action for Application 2012-249944 dated Aug. 1, 2016 (full Japanese text).
Chinese Office Action dated Oct. 17, 2016 issued in Application No. 201210466543.3 (with English translation).
Japanese Office Action dated Dec. 6, 2016 issued in Application No. 2012-249944.

* cited by examiner

LIGHT EMITTING DEVICE AND LIGHT EMITTING APPARATUS HAVING THE SAME

CROSS-REFERENCE TO RELATED APPLICATIONS

This present application is a Continuation of U.S. patent application Ser. No. 13/677,566 filed on Nov. 15, 2012, which claims priority under 35 U.S.C. § 119(a) of Korean Patent Application No. 10-2011-0119823 filed on Nov. 16, 2011, which is hereby incorporated by reference in its entirety.

BACKGROUND

The embodiment relates to a light emitting device and a light emitting apparatus having the same.

Groups III-V nitride semiconductors have been extensively used as main materials for light emitting devices, such as a light emitting diode (LED) or a laser diode (LD), due to the physical and chemical characteristics thereof. In general, the groups III-V nitride semiconductors include a semiconductor material having a compositional formula of $In_xAl_yGa_{1-x-y}N$ ($0 \leq x \leq 1$, $0 \leq y \leq 1$, and $0 \leq x+y \leq 1$).

The LED is a semiconductor device, which transmits/receives signals by converting an electric signal into infrared ray or light using the characteristics of compound semiconductors. The LED is also used as a light source.

The LED or the LD using the nitride semiconductor material is mainly used for the light emitting device to provide the light. For instance, the LED or the LD is used as a light source for various products, such as a keypad light emitting part of a cellular phone, an electric signboard, and a lighting device.

SUMMARY

The embodiment provides a light emitting device having a novel light extracting structure.

The embodiment provides a light emitting device including a concavo-convex pattern having micro concavo-convex portions on a top surface of a substrate.

The embodiment provides a light emitting device including a concavo-convex pattern having micro concavo-convex portions on a top surface of a light emitting structure.

The embodiment provides a wafer-level packaged light emitting device.

The embodiment provides a light emitting device including a support member having a ceramic-based additive formed on a peripheral surface of an electrode connected to a light emitting structure and a method of manufacturing the same.

The embodiment provides a light emitting apparatus having the light emitting device, a light emitting device package and a lighting device.

A light emitting device according to the embodiment includes a transmissive substrate; a first pattern portion disposed on a top surface of the transmissive substrate and including a plurality of protrusions; a second pattern portion disposed on the top surface of the transmissive substrate and including a plurality of concaves each of which has a width smaller than a width of each protrusion; a light emitting structure disposed under the transmissive substrate and including a first conductive semiconductor layer, a second conductive semiconductor layer and an active layer between the first and second conductive semiconductor layers; a first electrode under the first conductive semiconductor layer; a reflective electrode layer under the second conductive semiconductor layer; a second electrode under the reflective electrode layer; a first connection electrode under the first electrode; a second connection electrode under the second electrode; and an insulating support member disposed around the first electrode and the first connection electrode and around the second electrode and the second connection electrode and including a ceramic-based thermal diffusion agent.

A light emitting device according to the embodiment includes a first conductive semiconductor layer; an active layer under the first conductive semiconductor layer; a second conductive semiconductor layer under the active layer; a first pattern portion disposed on a top surface of the first conductive semiconductor layer and including a plurality of protrusions; a second pattern portion disposed on the top surface of the first conductive semiconductor layer and including a plurality of concaves each of which has a width smaller than a width of each protrusion; a first electrode under the first conductive semiconductor layer; a reflective electrode layer under the second conductive semiconductor layer; a second electrode under the reflective electrode layer; a first connection electrode under the first electrode; a second connection electrode under the second electrode; and an insulating support member disposed around the first electrode and the first connection electrode and around the second electrode and the second connection electrode and including a ceramic-based thermal diffusion agent.

A light emitting apparatus according to the embodiment includes a light emitting device including a support member formed at a lower portion of the light emitting device and first and second connection electrodes exposed to a bottom surface of the support member; a plurality of lead frames on which the first and second connection electrodes of the light emitting device are mounted; and a body on which the lead frames are installed, wherein the light emitting device includes a transmissive substrate; a first pattern portion disposed on a top surface of the transmissive substrate and including a plurality of protrusions; a second pattern portion disposed on the top surface of the transmissive substrate and including a plurality of concaves each of which has a width smaller than a width of each protrusion; a light emitting structure disposed under the transmissive substrate and including a first conductive semiconductor layer, a second conductive semiconductor layer and an active layer between the first and second conductive semiconductor layers; a first electrode between the first conductive semiconductor layer and the first connection electrode; a reflective electrode layer under the second conductive semiconductor layer; and a second electrode between the reflective electrode layer and the second connection electrode, and wherein the support member is disposed around the first electrode and the first connection electrode and around the second electrode and the second connection electrode and including a ceramic-based thermal diffusion agent, and the first and second connection electrodes of the light emitting device and the bottom surface of the support member have an interval corresponding to a top surface of the lead frames.

DETAILED DESCRIPTION OF THE EMBODIMENTS

Figure 1:
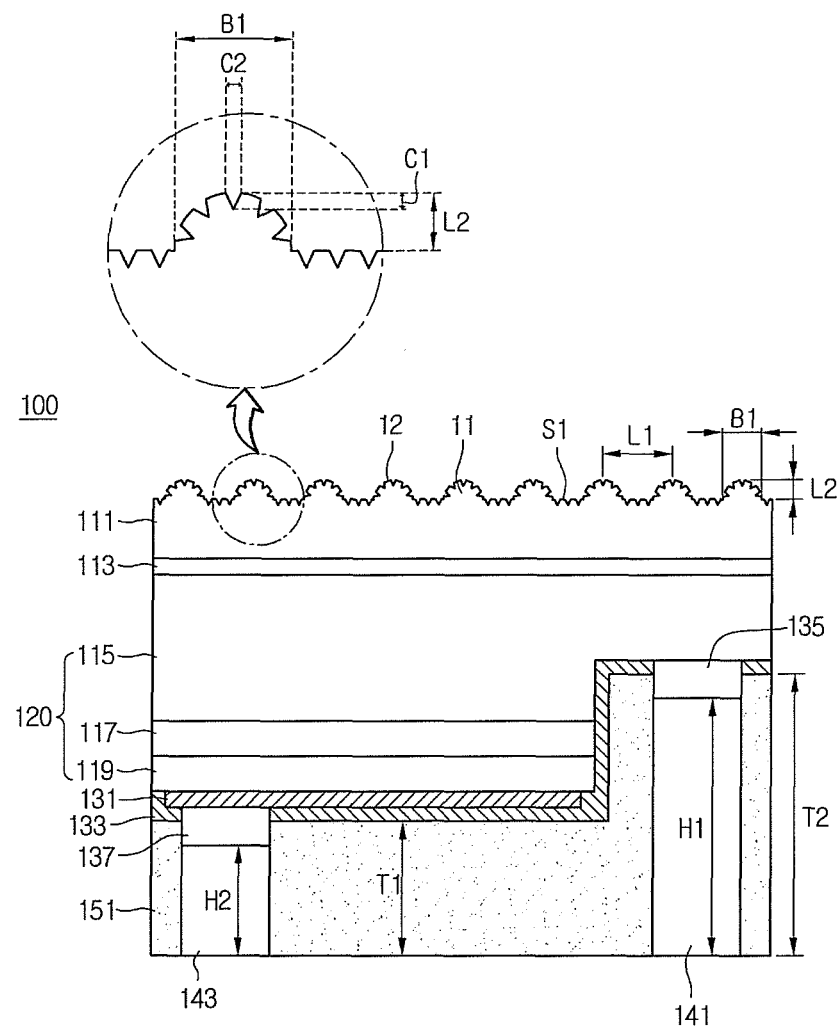
FIG. 1 is a side sectional view of a light emitting device according to the first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, embodiments will be described with reference to accompanying drawings.

Figure 2:
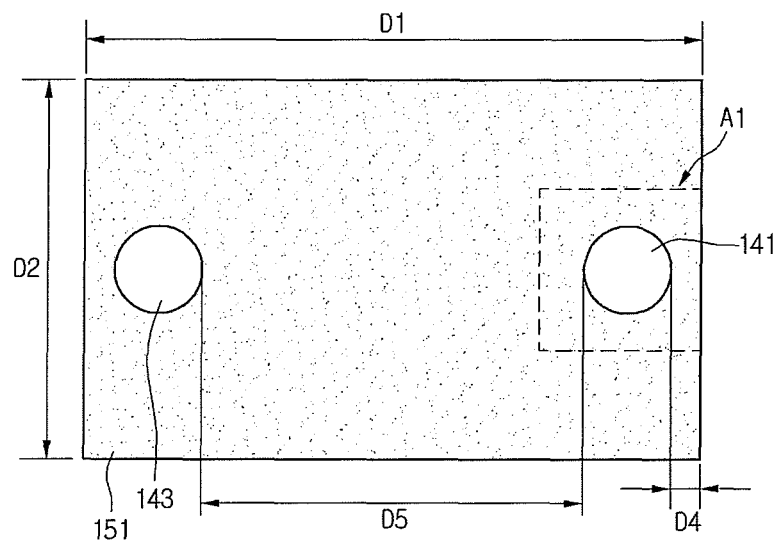
FIG. 2 is a bottom view of the light emitting device shown in FIG. 1.

FIG. 1 is a side sectional view of a light emitting device according to the first embodiment, and FIG. 2 is a bottom view of the light emitting device shown in FIG. 1.

Referring to FIGS. 1 and 2, the light emitting device 100 includes a substrate 111, a first semiconductor layer 113, a first conductive semiconductor layer 115, an active layer 117, a second conductive semiconductor layer 119, a reflective electrode layer 131, an insulating layer 133, a first electrode 135, a second electrode 137, a first connection electrode 141, a second connection electrode 143, and a support member 151.

The substrate 111 may include a transmissive substrate, an insulating substrate or a conductive substrate. For instance, the substrate 111 may include at least one of $Al_2O_3$, SiC, Si, GaAs, GaN, ZnO, Si, GaP, InP, Ge, and $Ga_2O_3$. A light extracting structure, such as a concavo-convex pattern, may be disposed on a bottom surface of the substrate 111. The concavo-convex pattern can make contact with the first semiconductor layer 113. The concavo-convex pattern can be formed by a concavo-convex structure disposed on a bottom surface of the substrate 111 or can be formed as a roughness pattern. The concavo-convex pattern may have a stripe shape or a convex lens shape.

The substrate 111 is disposed on a top surface S1 thereof with a first pattern portion having a first concavo-convex structure including a plurality of protrusions 11 and a second pattern portion having a second concavo-convex structure disposed on the first concavo-convex structure and including a plurality of concaves 12. The second concavo-convex structure is disposed on the first concavo-convex structure and defined by a micro concavo-convex configuration having a size smaller than a size of the protrusions 11.

The protrusions 11 can be formed by etching the top surface S1 of the substrate 111, so the protrusions 11 may be formed by using a material the same as that of the substrate 111. The second pattern portion can be formed by etching the top surface S1 and the protrusions 11 of the substrate 111 or can be formed by using a separate material.

The protrusions 11 of the first pattern portion may protrude from the top surface S1 of the substrate 111 or may have an embossing shape. The top surface S1 of the substrate 111 may be recessed relative to the protrusions 11. In addition, the first pattern portion may be recessed or engraved lower than the top surface S1 of the substrate 111.

The concaves 12 of the second pattern portion may be disposed on the surface of the protrusions 11 and the top surface S1 of the substrate 111 with a size smaller than a size of the protrusions 11. The concaves 12 may have an intaglio shape, a recess shape or a depressed shape. In addition, the second pattern portion may have an embossing shape or a convex shape and may be formed with micro protrusions having a size smaller than that of the protrusions 11.

The first pattern portion includes the concavo-convex structure including the protrusions 11 having the embossing shape and the top surface S1 having the intaglio shape, and the second pattern portion includes micro concavo-convex structure disposed on the first concavo-convex structure and having the intaglio shape and/or the embossing shape with a width smaller than a width of the protrusions 11.

When viewed from the top of the substrate 111, the protrusions 11 of the first pattern portion may be arranged in the form of a matrix or a lattice.

For the purpose of convenience of explanation, according to the first embodiment, the first pattern portion will be described as protrusions 11 and the second pattern portion will be described as concaves 12, but the embodiment is not limited thereto.

The first semiconductor layer 113 is disposed on the bottom surface of the substrate 111. A plurality of protrusions 11 protrude upward from the top surface S1 of the substrate 111, which is opposite to the bottom surface of the substrate 111, and the concaves 12 are formed in the protrusions 11. The protrusions 11 may have a side sectional shape of a hemisphere, a cone, a polygonal cone, a column such as a cylinder or a polygonal column, or a truncated cone. When viewed from the top, each protrusion 11 may have a circular shape, a polygonal shape, or a mixed shape of a sphere and a surface.

The concaves 12 are concaved down with respect to the surface of each protrusion 11. The concaves 12 may have a side sectional shape of a hemisphere, a cone, a polygonal cone, a column such as a cylinder or a polygonal column, or a truncated cone. When viewed from the top, each concave 12 may have a circular shape, a polygonal shape, or a mixed shape of a sphere and a surface. The concaves 12 may be concaved down from the top surface S1 of the substrate 111. A width C2 of the concave 12 may be smaller than a width B1 of the protrusion 11.

A depth C1 or the width C2 of the concave 12 may be equal to or smaller than 50% based on a height L2 or the width B1 of the protrusion 11. For instance, the depth C1 or the width C2 of the concave 12 may be in the range of ½ to 1/100 based on the height L2 or the width B1 of the protrusion 11. The widths C2 and B1 may be the maximum width.

The size of the concaves 12 or micro concavo-convex structures may be equal to or smaller than 50% based on the size of the protrusion 11. The width B1 of the protrusion 11 may be at least one of a maximum width, a length of one lateral side, a radius, a thickness and a height L2 of the protrusion 11 and the size of the concave 12 may be at least one of a maximum width, a length of each lateral side, a height, a radius and a thickness of the concave 12.

The width B1 or the height L2 of the protrusion 11 may be in the range of 0.1 μm to 10 μm, for instance, may be smaller than the thickness of the substrate 111. The width B1 of the protrusion 11 may be larger than the height L2 of the protrusion 11, but the embodiment is not limited thereto. The depth C1 or the width C2 of the concave 12 is in the range of 0.1 nm to 100 nm or 0.1 nm to 100 μm. A pitch L1 between two protrusions 12 may be in the range of 0.1 μm to 100 μm, and a pitch between two concaves 12 may be ½ or less based on the pitch L1 of the protrusions 11, for instance, in the range of 0.1 μm to 100 μm.

The protrusions 11 may change the critical angle of light incident through the substrate 111 and the concaves 12 may change the critical angle of light incident onto the protrusions 11 and the top surface S1 of the substrate 111. If the first and second patterns are disposed on the substrate 111 with different sizes from each other, the total reflection rate of the incident light may be lowered so that the light extraction efficiency can be improved.

The protrusions 11 may be arranged in a regular interval or a random interval. In addition, the concaves 12 may be arranged in a regular interval or a random interval.

The first semiconductor layer 113 may be disposed on the bottom surface of the substrate 111. The first semiconductor layer 113 may include a group II to VI compound semiconductor. In detail, the first semiconductor layer 113 can be formed in a single layer or multiple layers by using the group II-VI or group III-V compound semiconductor. For instance, the first semiconductor layer 113 may include a group III-V compound semiconductor including at least one of GaN, InN, AlN, InGaN, AlGaN, InAlGaN and AlInN. The first semiconductor layer 113 may include an oxide, such as ZnO, but the embodiment is not limited thereto.

The first semiconductor layer 113 may be prepared as a buffer layer. The buffer layer can reduce the lattice mismatch between the substrate 111 and the nitride semiconductor layer.

The first semiconductor layer 113 may be prepared as a first conductive semiconductor layer or an undoped semiconductor layer. The undoped semiconductor layer may be prepared as a GaN-based semiconductor layer including the group III-V compound semiconductor. The undoped semiconductor layer may have a first conductive property even if the conductive dopant is not intentionally added in the manufacturing process. In addition, the undoped semiconductor layer has a dopant concentration lower than that of the conductive dopant of the first conductive semiconductor layer 115.

The first semiconductor layer 113 may include at least one of the buffer layer and the undoped semiconductor layer, but the embodiment is not limited thereto. In addition, the first semiconductor layer 113 may be omitted.

A light emitting structure 120 may be formed under the first semiconductor layer 113. The light emitting structure 120 includes the group III-V compound semiconductor. For instance, the light emitting structure 120 includes the semiconductor having the compositional formula of $In_xAl_yGa_{1-x-y}N$ ($0 \le x \le 1$, $0 \le y \le 1$, $0 \le x+y \le 1$) and can emit the light having a predetermined peak wavelength in the wavelength range of an ultraviolet ray band to a visible ray band.

The light emitting structure 120 includes a first conductive semiconductor layer 115, a second conductive semiconductor layer 119, and an active layer 117 between the first conductive semiconductor layer 115 and the second conductive semiconductor layer 119.

The first conductive semiconductor layer 115 is formed under the substrate 111 or the first semiconductor layer 113. The first conductive semiconductor layer 115 may include a group III-V compound semiconductor doped with a first conductive dopant. The first conductive semiconductor layer 115 is an n type semiconductor layer and the first conductive dopant is an n type dopant including Si, Ge, Sn, Se or Te.

A superlattice structure including various semiconductor layers alternately stacked on each other may be formed between the first conductive semiconductor layer 115 and the first semiconductor layer 113. The superlattice structure may reduce the lattice defect. Each layer of the superlattice structure may have a thickness of about few Å or more.

A first conductive clad layer is formed between the first conductive semiconductor layer 115 and the active layer 117. The first conductive clad layer may include a GaN-based semiconductor and have a bandgap higher than that of the active layer 117. The first conductive clad layer confines the carriers.

The active layer 117 is formed under the first conductive semiconductor layer 115. The active layer 117 selectively includes a single quantum well structure, a multiple quantum well structure, a quantum wire structure or a quantum dot structure and may have a periodicity of the well layer and the barrier layer. The well layer may have a compositional formula of $In_xAl_yGa_{1-x-y}N$ ($0 \leq x \leq 1$, $0 \leq y \leq 1$, $0 \leq x+y \leq 1$) and the barrier layer may have a compositional formula of $In_xAl_yGa_{1-x-y}N$ ($0 \leq x \leq 1$, $0 \leq y \leq 1$, $0 \leq x+y \leq 1$).

The well layer/barrier layer may have at least one periodicity by using the stack structure of InGaN/GaN, AlGaN/GaN, InGaN/AlGaN, or InGaN/InGaN. The barrier layer may include a semiconductor material having a bandgap higher than that of the well layer.

The second conductive semiconductor layer 119 is formed under the active layer 117. The second conductive semiconductor layer 119 may include a semiconductor doped with a second conductive dopant. For instance, the second conductive semiconductor layer 119 may include a compound semiconductor, such as GaN, InN, AlN, InGaN, AlGaN, InAlGaN, or AlInN. The second conductive semiconductor layer 119 is a p type semiconductor layer and the second conductive dopant is a p type dopant, such as Mg, Zn, Ca, Sr or Ba.

The second conductive semiconductor layer 119 may include a superlattice structure, such as InGaN/GaN or AlGaN/GaN. The superlattice structure of the second conductive semiconductor layer 119 may diffuse the current abnormally contained in the voltage, thereby protecting the active layer 117.

In addition, in the light emitting structure 120, the first conductive semiconductor layer 115 may be prepared as a p type semiconductor layer and the second conductive semiconductor layer 119 may be prepared as an n type semiconductor layer. A third conductive semiconductor layer having polarity opposite to that of the second conductive semiconductor layer 119 may be disposed on the second conductive semiconductor layer 119.

The light emitting structure 120 of the light emitting device 100 may be defined by the first conductive semiconductor layer 115, the active layer 117 and the second conductive semiconductor layer 119. The light emitting structure 120 may have one of an n-p junction structure, a p-n junction structure, an n-p-n junction structure, and a p-n-p junction structure. In this case, the symbols "n" and "p" represent n and p type semiconductor layers, respectively, and the symbol "-" represents that two layers are directly or indirectly stacked on each other. Hereinafter, the second conductive semiconductor layer 119 will be referred to as the uppermost layer of the light emitting structure 120 for the purpose of convenience of explanation.

The reflective electrode layer 131 is formed under the second conductive semiconductor layer 119. For instance, the reflective electrode layer 131 may have a single layer structure or a multi-layer structure. If the reflective electrode layer 131 has the multi-layer structure, the reflective electrode layer 131 includes at least one of an ohmic contact layer, a reflective layer, a diffusion barrier layer and a protective layer. The reflective electrode layer 131 may include the structure of the ohmic contact layer/reflective layer/diffusion barrier layer/protective layer, the reflective layer/diffusion barrier layer/protective layer, the ohmic contact layer/reflective layer/protective layer, the reflective layer/diffusion barrier, or the reflective layer. The structure of the reflective electrode layer 131 will be described in detail with reference to FIG. 21.

The reflective electrode layer 131 may include the stack structure of a transmissive electrode layer/a reflective layer. The transmissive electrode layer may include one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), SnO, InO, InZnO, ZnO, IrOx, and RuOx. The reflective layer may be formed under the transmissive electrode layer. The reflective layer includes a first layer having a first refractive index and a second layer having a second refractive index. The reflective layer may include the stack structure in which at least two pairs of the first and second layers are alternately stacked. The first refractive index is different from the second refractive index and the first and second layers may include a material having the refractive index in the range of 1.5 to 2.4. For instance, the first and second layers may include a conductive material or an insulating material. Such a structure may be defined as a DBR (Distributed Bragg Reflection) structure.

A light extracting structure, such as a roughness, can be disposed on a surface of at least one of the second conductive semiconductor layer 119 and the reflective electrode layer 131. The light extracting structure may vary the critical angle of the incident light to improve the light extraction efficiency.

A first electrode 135 is formed under a predetermined region A1 of the first conductive semiconductor layer 115 and a second electrode 137 is formed under the reflective electrode layer 131. A first connection electrode 141 is formed under the first electrode 135 and a second connection electrode 143 is formed under the second electrode 137.

The first electrode 135 is electrically connected to the predetermined region A1 of the first conductive semiconductor layer 115. The first electrode 135 may include an electrode pad, but the embodiment is not limited thereto.

The first electrode 135 is spaced apart from the lateral sides of the active layer 117 and the second conductive semiconductor layer 119 and has an area smaller than the predetermined region A1 of the first conductive semiconductor layer 115.

The second electrode 137 can be physically and/or electrically connected to the second conductive semiconductor layer 119 through the reflective electrode layer 131. The second electrode 137 includes an electrode pad.

The first and second electrodes 135 and 137 may have a single layer structure or a multi-layer structure. In the case of the multi-layer structure, the first and second electrodes 135 and 137 may include at least one of an adhesive layer, a reflective layer, a diffusion barrier layer and a bonding layer. The adhesive layer makes ohmic-contact with a bottom surface of the predetermined region A1 of the first conductive semiconductor layer 115. The adhesive layer may include one selected from the group consisting of Cr, Ti, Co, Ni, V, Hf and an alloy thereof and have a thickness of about 1 to 1,000 Å. The reflective layer is formed under the adhesive layer and includes one selected from the group consisting of Ag, Al, Ru, Rh, Pt, Pd and an alloy thereof. The reflective layer has a thickness of about 1 to 10,000 Å. The diffusion barrier layer is formed under the reflective layer and includes one selected from the group consisting of Ni, Mo, W, Ru, Pt, Pd, La, Ta, Ti and an alloy thereof. The diffusion barrier layer has a thickness of about 1 to 10,000 Å. The bonding layer is bonded to the first connection electrode 141 and includes one selected from the group consisting of Al, Ru, Rh, Pt and an alloy thereof. The bonding layer has a thickness of about 1 to 10,000 Å.

The first and second electrodes 135 and 137 may have the same stack structure or different stack structures. The stack structure of the second electrode 137 may be smaller than the stack structure of the first electrode 135. For instance, the first electrode 135 may have the stack structure of the adhesive layer/reflective layer/diffusion barrier layer/bonding layer or the adhesive layer/diffusion barrier layer/bonding layer, and the second electrode 137 may have the stack structure of the adhesive layer/reflective layer/diffusion barrier layer/bonding layer or the adhesive layer/diffusion barrier layer/bonding layer.

A top surface area of the second electrode 137 is equal to a bottom surface area of the reflective electrode layer 131 or at least larger than a top surface area of the second connection electrode 143.

At least one of the first and second electrodes 135 and 137 may include a current diffusion pattern having an arm structure or a finger structure branching from the electrode pad. In addition, the first and second electrodes 135 and 137 may include one electrode pad or a plurality of electrode pads, but the embodiment is not limited thereto.

The first and second connection electrodes 141 and 143 may serve as a lead for supplying power and a heat dissipation path. The first and second connection electrodes 141 and 143 may have a column shape. For instance, the first and second connection electrodes 141 and 143 may have a spherical shape, a cylindrical shape, a polygonal column shape or a random shape. The polygonal column shape may be an equiangular column shape or not, and the embodiment is not limited thereto. The top and bottom surfaces of the first and second connection electrodes 141 and 143 may have a circular shape or a polygonal shape, but the embodiment is not limited thereto. The bottom surface area of the first and second connection electrodes 141 and 143 may be different from the top surface area of the first and second connection electrodes 141 and 143. For instance, the bottom surface area of the first and second connection electrodes 141 and 143 may be larger or smaller than the top surface area of the first and second connection electrodes 141 and 143.

At least one of the first and second connection electrodes 141 and 143 is smaller than a width of a bottom surface of the light emitting structure 120 and larger than a diameter or a width of a bottom surface of the first and second electrodes 135 and 137.

The diameter or the width of the first and second connection electrodes 141 and 143 is in the range of 1 µm~100,000 µm and the height of first and second connection electrodes 141 and 143 is in the range of 1 µm~100,000 µm. The height H1 of the first connection electrode 141 may be longer than the height H2 of the second connection electrode 143 and bottom surfaces of the first and second connection electrodes 141 and 143 may be aligned on the same plane (that is, horizontal plane).

The first and second connection electrodes 141 and 143 may be prepared as a single layer by using one metal or an alloy. The width and the height of the single layer is in the range of 1 µm~100,000 µm. For instance, the single layer has the thickness larger than the thickness of the second connection electrode 143. The first and second connection electrodes 141 and 143 may further include at least one protective layer coated or plated on a surface of a metal or an alloy, but the embodiment is not limited thereto.

The first and second connection electrodes 141 and 143 may include one selected from the group consisting of Ag, Al, Au, Cr, Co, Cu, Fe, Hf, In, Mo, Ni, Si, Sn, Ta, Ti, W and an alloy thereof. In order to improve the adhesive strength with respect to the first and second electrodes 135 and 137, the first and second connection electrodes 141 and 143 may be plated with a metal including one selected from the group consisting of In, Sn, Ni, Cu and an alloy thereof. At this time, the plating thickness may be in the range of 1~100,000 Å.

At least one plating layer can be further disposed on the surfaces of the first and second connection electrodes 141 and 143. The plating layer may include Tin or an alloy thereof, Ni or an alloy thereof, or a Tin-Ag—Cu alloy. At this time, the plating layer may have a thickness of about 0.5 µm~10 µm. The plating layer can improve the bonding strength with respect to other bonding layers.

The insulating layer 133 may be formed under the reflective electrode layer 131. In detail, the insulating layer 133 can be disposed on the bottom surface of the second conductive semiconductor layer 119, lateral sides of the second conductive semiconductor layer 119 and the active layer 117, and the bottom surface of the predetermined region A1 of the first conductive semiconductor layer 115. The insulating layer 133 is disposed on the lower region of the light emitting structure 120 except for the region for the reflective electrode layer 131, the first electrode 135 and the second electrode 137 to electrically protect the lower portion of the light emitting structure 120.

The insulating layer 133 includes an insulating material or an insulating resin formed by using oxide, nitride, fluoride or sulfide including at least one of Al, Cr, Si, Ti, Zn and Zr. For instance, the insulating layer 133 may include one selected from the group consisting of $SiO_2$, $Si_3N_4$, $Al_2O_3$ and $TiO_2$. The insulating layer 133 may be prepared as a single layer or multiple layers, but the embodiment is not limited thereto. The insulating layer 133 prevents the layer-to-layer short of the light emitting structure 120 when a metal structure is formed under the light emitting structure for the purpose of flip bonding.

The insulating layer 133 may not be disposed on the bottom surface of the reflective electrode layer 131. Since the support member 151 having the insulating property is disposed on the bottom surface of the reflective electrode layer 131, the insulating layer 133 may not need to extend to the bottom surface of the reflective electrode layer 131.

The insulating layer 133 has the DBR structure in which the first and second layers having refractive indexes different from each other are alternately aligned. In detail, the first layer includes one of SiO2, Si3N4, Al2O3, and TiO2 and the second layer includes materials except for the materials of the first layer. In this case, the reflective electrode layer may be omitted.

The insulating layer 133 may have the thickness in the range of 100 to 10,000 Å. If the insulating layer 133 is prepared as the multiple layers, each layer may have the thickness in the range of 1 to 50,000 Å or 100 to 10,000 Å. The thickness of each layer of the insulating layer 133 having the multiple layers may vary the reflective efficiency according to the emission wavelength.

The first and second connection electrodes 141 and 143 may include Ag, Al, Au, Cr, Co, Cu, Fe, Hf, In, Mo, Ni, Si, Sn, Ta, Ti, W and an alloy thereof. In addition, the first and second connection electrodes 141 and 143 may have a plating layer including In, Sn, Ni, Cu and an alloy thereof to improve the adhesive strength with respect to the first and second electrodes 135 and 137. In this case, the plating layer has the thickness in the range of 1~100,000 Å. The first and second connection electrodes 141 and 143 may be bonded through eutectic bonding and used as a solder ball or a metal bump, but the embodiment is not limited thereto.

The first and second connection electrodes 141 and 143 may include Ag, Al, Au, Cr, Co, Cu, Fe, Hf, In, Mo, Ni, Si, Sn, Ta, Ti, W and an alloy thereof. In addition, the first and second connection electrodes 141 and 143 may have a plating layer including In, Sn, Ni, Cu and an alloy thereof to improve the adhesive strength with respect to the first and second electrodes 135 and 137. In this case, the plating layer has the thickness in the range of 1~100,000 Å. The first and second connection electrodes 141 and 143 may be used as a single metal, such as a solder ball or a metal bump, but the embodiment is not limited thereto.

The support member 151 serves as a support layer to support the light emitting device 100. The support member 151 includes an insulating material. For instance, the insulating material may be a resin including silicon or epoxy. In addition, the insulating material may include paste or insulating ink. The insulating material may also include a resin selected from the group consisting of a polyacrylate resin, an epoxy resin, a phenolic resin, a polyamides resin, a polyimide resin, an unsaturated polyesters resin, a polyphenylene ether resin (PPE), a polyphenylene oxide resin (PPO), a polyphenylene sulfides resin, a cyanate ester resin, benzocyclobutene (BCB), Polyamido-amine Dendrimers (PAMAM), Polypropylene-imine, Dendrimers (PPI), PAMAM-OS (organosilicon) having an internal structure of PAMAM and an outer surface of organosilicon, and a combination thereof. The material for the support member 151 may be different from the material for the insulating layer 133.

At least one of compounds, such as oxide, nitride, fluoride or sulfide including at least one of Al, Cr, Si, Ti, Zn and Zr, can be added to the support member 151. The compound added to the support member 151 may be a thermal diffusion agent. The thermal diffusion agent is a powder particle having a predetermined size, a grain, filler or an additive. In the following description, the support member 151 including the thermal diffusion agent will be described for the purpose of convenience of the explanation. The thermal diffusion agent may include an insulating material or a conductive material having a size of 1 Å~100,000 Å. In order to improve the thermal diffusion efficiency, the thermal diffusion agent may have a size of 1,000 Å ~50,000 Å. The grain of the thermal diffusion agent may have a spherical shape or an irregular shape, but the embodiment is not limited thereto.

The thermal diffusion agent includes a ceramic material. The ceramic material includes at least one of LTCC (low temperature co-fired ceramic), HTCC (high temperature co-fired ceramic), alumina, quartz, calcium zirconate, forsterite, SiC, graphite, fused-silica, mullite, cordierite, zirconia, beryllia, and aluminum nitride. The ceramic material may include metal nitride having thermal conductivity higher than that of nitride or oxide. For instance, the metal nitride may include a material having the thermal conductivity equal to or higher than 140 W/mK. For example, the ceramic material includes one selected from the group consisting of $SiO_2$, $Si_xO_y$, $Si_3N_4$, $Si_xN_y$, $SiO_xN_y$, $Al_2O_3$, BN, $Si_3N_4$, SiC(SiC—BeO), BeO, CeO, and AlN. The thermal conductive material may include C-component, such as diamond or CNT.

The support member 151 can be prepared as a single layer or multiple layers, and the embodiment is not limited thereto. The support member 151 is provided therein with ceramic powder, so the strength and the thermal conductivity of the support member 151 can be improved.

In addition, the amount of the thermal diffusion agent added to the support member 151 may be 1~99 wt %. In order to improve the thermal diffusion efficiency, 50~99 wt % of the thermal diffusion agent can be added to the support member 151. Since the thermal diffusion agent is added to the support member 151, the thermal conductivity can be more improved at the interior of the support member 151. In addition, the support member 151 has the thermal expansion coefficient of 4-11 [$\times 10^6/°$ C.]. The above thermal expansion coefficient is equal or similar to the thermal expansion coefficient of the substrate 111, such as the sapphire substrate, so the wafer may not be warped or damaged caused by the difference in the thermal expansion coefficient between the support member 151 and the light emitting structure 120 formed under the substrate 111, thereby improving the reliability of the light emitting device.

The bottom surface area of the support member 151 is substantially equal to the top surface area of the support member 151. In addition, the bottom surface area of the support member 151 is substantially equal to the top surface area of the first conductive semiconductor layer 115. Further, the width of the bottom surface of the support member 151 may be equal to the width of the top surface of the substrate 111 and the width of the top surface of the first conductive semiconductor layer 115. Thus, since the individual chips are divided after the support member 151 has been formed, the lateral sides of the support member 151, the substrate 111 and the first conductive semiconductor layer 115 can be aligned on the same plane. In addition, the bottom surface area of the support member 151 may be larger or smaller than the area of the top surface S1 of the substrate 111, but the embodiment is not limited thereto.

Referring to FIG. 2, a length D1 of a first lateral side of the support member 151 is substantially the same as a length of a first lateral side of the substrate 111 corresponding to the first lateral side of the support member 151, and a length D2 of a second lateral side of the support member 151 is substantially the same as a length of a second lateral side of the substrate 111 corresponding to the second lateral side of the support member 151. Further, the lengths D1 and D2 of the first and second lateral sides of the support member 151 may be longer or shorter than the length of each lateral side of the substrate 111, but the embodiment is not limited thereto. In addition, a distance D5 between the first and second connection electrodes 141 and 143 is an interval between two adjacent electrode pads and corresponds to ½ or more based on the length of one lateral side of the light emitting device, but the embodiment is not limited thereto.

The bottom surface of the support member 151 is a substantially flat surface or an irregular surface, but the embodiment is not limited thereto.

A thickness T1 of the support member 151 is at least thicker than a thickness H2 of the second connection electrode 143. Alternatively, the thickness T1 of the support member 151 may be thinner than the thickness H2 of the second connection electrode 143. If the thickness of the insulating layer 133 is thicker than the thickness of the second connection electrode 143, the thickness of the support member 151 may become thin. A thickness T2 of a predetermined region of the support member 151 may be thicker than a thickness of the first connection electrode 141. The support member 151 may have the thickness in the range of 1 μm~100,000 μm or 50 μm~1,000 μm.

The bottom surface of the support member 151 is lower than the bottom surfaces of the first and second electrodes 135 and 137 and is aligned on the same plane (that is, horizontal plane) with the bottom surfaces of the first and second connection electrodes 141 and 143.

The support member 151 makes contact with outer peripheral surfaces of the first and second electrodes 135 and 137 and first and second connection electrodes 141 and 143. Thus, heat induced from the first and second electrodes 135 and 137 and first and second connection electrodes 141 and 143 can be diffused and dissipated through the support member 151. The thermal conductivity of the support member 151 can be improved by the thermal diffusion agent contained in the support member 151, so that the support member 151 can dissipate the heat through the whole surface of the support member 151. Thus, the reliability of the light emitting device 100 can be improved against heat.

In addition, the lateral side of the support member 151 can be aligned on the same plane (that is, vertical plane) with the lateral sides of the light emitting structure 120 and the substrate 111. Further, one lateral side or at least one lateral side of the support member 151 may protrude more than the lateral sides of the light emitting structure 120 and the substrate 111, but the embodiment is not limited thereto.

The light emitting device 100 is mounted through the flip scheme, so the most of light is emitted toward the top surface of the substrate 111 and some light is emitted through the lateral sides of the substrate 111 and the light emitting structure 120. Thus, the light loss caused by the first and second electrodes 135 and 137 can be reduced. Accordingly, the light extraction efficiency can be improved by the first and second patterns portions of the substrate 111 disposed on the light emitting device 100 and heat dissipation efficiency can be improved by the support member 151.

A phosphor layer or a transmissive resin layer having no phosphor may be disposed on the substrate 111, but the embodiment is not limited thereto.

FIGS. 3 to 9 are sectional views showing the manufacturing process for the light emitting device according to the first embodiment. Although the following description is made based on the individual device to facilitate the explanation, the light emitting device is manufactured in the wafer level and the individual device is manufactured through the process described later. However, the manufacture of the individual device is not limited to the process described later, but the process steps may be increased or reduced to manufacture the individual device.

Figure 3:
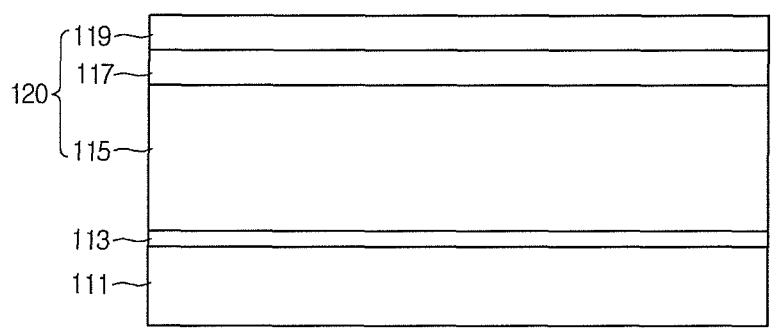
FIGS. 3 to 9 are sectional views showing the manufacturing process for the light emitting device according to the first embodiment.

Referring to FIG. 3, the substrate 111 is loaded in growth equipment, and the compound semiconductor including group II to VI elements is disposed on the substrate 111 in the form of a layer or a pattern. The substrate 111 serves as a growth substrate.

The substrate 111 may include a transmissive substrate, an insulating substrate or a conductive substrate. For instance, the substrate 111 may include one selected from the group consisting of Al2O3, GaN, SiC, ZnO, Si, GaP, InP, Ga2O3, and GaAs. The substrate 111 may be disposed on the top surface thereof with a light extracting structure, such as a concavo-convex pattern. The concavo-convex pattern varies the critical angle of the light, thereby improving the light extraction efficiency.

The growth equipment includes an E-beam evaporator, PVD (physical vapor deposition) equipment, CVD (chemical vapor deposition) equipment, PLD (plasma laser deposition) equipment, a dual-type thermal evaporator, sputtering equipment, or MOCVD (metal organic chemical vapor deposition) equipment, but the embodiment is not limited thereto.

The first semiconductor layer 113 is disposed on the substrate 111. The first semiconductor layer 113 can be formed by using the compound semiconductor including the group III-V elements. The first semiconductor layer 113 may serve as a buffer layer to reduce the lattice mismatch with respect to the substrate. The first semiconductor layer 113 may be an undoped semiconductor layer including a GaN-based semiconductor, which is not intentionally doped.

The light emitting structure 120 is disposed on the first semiconductor layer 113. The light emitting structure 120 includes the first conductive semiconductor layer 115, the active layer 117 and the second conductive semiconductor layer 119, which are sequentially formed.

The first conductive semiconductor layer 115 includes the group III-V compound semiconductor doped with the first conductive dopant. In detail, the first conductive semiconductor layer 115 may include one selected from the group consisting of GaN, AlN, AlGaN, InGaN, InN, InAlGaN, AlInN, AlGaAs, GaP, GaAs, GaAsP, and AlGaInP. If the first conductive semiconductor layer 115 is an n type semiconductor layer, the first conductive dopant includes the n type dopant such as Si, Ge, Sn, Se or Te. The first conductive semiconductor layer 115 can be prepared as a single layer or multiple layers, but the embodiment is not limited thereto. The first conductive semiconductor layer 115 may further include a superlattice structure including various materials, but the embodiment is not limited thereto.

The active layer 117 is disposed on the first conductive semiconductor layer 115. The active layer 117 includes at least one of a single quantum well structure, a multiple quantum well structure, a quantum wire structure and a quantum dot structure. The active layer 117 can be formed by using the semiconductor material of the group III-V elements such that the active layer 117 may have a periodicity of the well layer and the barrier layer having the compositional formula of $In_xAl_yGa_{1-x-y}N$ ($0 \leq x \leq 1$, $0 \leq y \leq 1$, $0 \leq x+y \leq 1$). For instance, the active layer 117 may have the periodicity of the InGaN well layer/GaN barrier layer, the InGaN well layer/AlGaN barrier layer, or the InGaN well layer/InGaN barrier layer, but the embodiment is not limited thereto.

A conductive clad layer can be disposed on and/or under the active layer 117. The conductive clad layer may include an AlGaN-based semiconductor. The barrier layer of the active layer 117 has a bandgap higher than that of the well layer and the conductive clad layer has the bandgap higher than that of the barrier layer.

The second conductive semiconductor layer 119 is disposed on the active layer 117. The second conductive semiconductor layer 119 includes the group III-V compound semiconductor doped with second conductive dopant. For instance, the second conductive semiconductor layer 119 may include one selected from the group consisting of GaN, AlN, AlGaN, InGaN, InN, InAlGaN, AlInN, AlGaAs, GaP, GaAs, GaAsP, and AlGaInP. If second conductive semiconductor layer 119 is a p type semiconductor layer, the second conductive dopant includes the p type dopant such as Mg or Zn. The second conductive semiconductor layer 119 can be prepared as a single layer or multiple layers, but the embodiment is not limited thereto. The second conductive semiconductor layer 119 may further include a superlattice structure including various materials, but the embodiment is not limited thereto.

The light emitting structure 120 may be defined by the first conductive semiconductor layer 115, the active layer 117 and the second conductive semiconductor layer 119. In addition, a third conductive semiconductor layer having polarity opposite to that of the second conductive semiconductor layer 119, that is, the n type semiconductor layer may be disposed on the second conductive semiconductor layer 119. Thus, the light emitting structure 120 may have one of an n-p junction structure, a p-n junction structure, an n-p-n junction structure, and a p-n-p junction structure.

Figure 4:
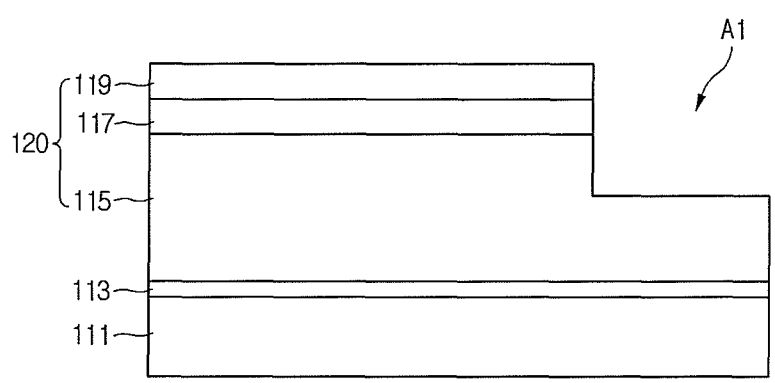

Referring to FIG. 4, the predetermined region A1 of the light emitting structure 120 is etched. The predetermined region A1 of the light emitting structure 120 exposes the first conductive semiconductor layer 115 and the exposed portion of the first conductive semiconductor layer 115 is lower than the top surface of the active layer 117.

During the etching process, the predetermined region A1 of the light emitting structure 120 is dry-etched after masking the top surface of the light emitting structure 120 using the mask pattern. The dry etching can be performed by using at least one of ICP (Inductively Coupled Plasma) equipment, RIE (Reactive Ion Etching) equipment, CCP (Capacitive Coupled Plasma) equipment, and ECR (Electron Cyclotron Resonance) equipment. The etching process may be performed through the wet etching process and the embodiment is not limited thereto.

The predetermined region A1 of the light emitting structure 120 is an etching region and one or a plurality of predetermined regions A1 may be formed.

Figure 5:
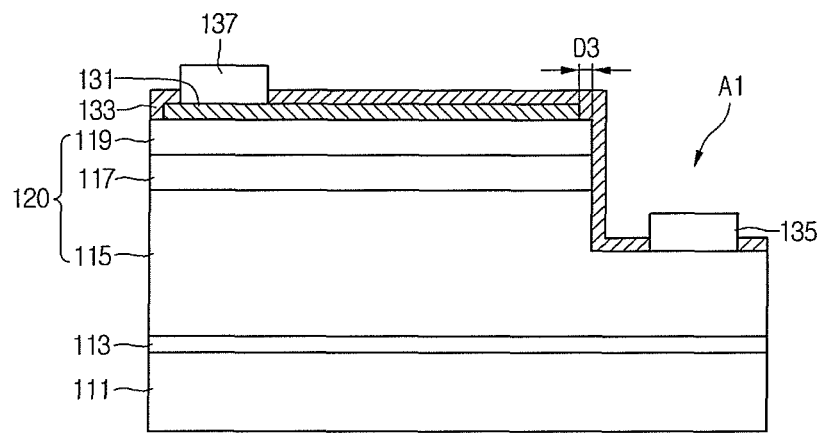

Referring to FIG. 5, the reflective electrode layer 131 is disposed on the light emitting structure 120. The reflective electrode layer 131 has an area smaller than a top surface area of the second conductive semiconductor layer 119 to prevent the short when the reflective electrode layer 131 is manufactured. The reflective layer 131 is deposited by using sputter equipment and/or deposition equipment after masking the region, which is spaced apart from the upper edge by a predetermined distanced D3, and the predetermined region A1 of the light emitting structure 120 using the mask.

The reflective electrode layer 131 may include a metallic material having the reflectivity of at least 70% or 90%.

The reflective electrode layer 131 may include the structure of the ohmic contact layer/reflective layer/diffusion barrier layer/protective layer, the reflective layer/diffusion barrier layer/protective layer, the ohmic contact layer/reflective layer/protective layer, or the reflective layer. The material and the thickness of each layer have been described in the description of FIG. 1.

The second electrode 137 is disposed on the first reflective electrode layer 131 after forming the first electrode 135 on the first conductive semiconductor layer 115. The first and second electrodes 135 and 137 can be formed by using sputter equipment and/or deposition equipment after masking the region except for the electrode region using the mask, but the embodiment is not limited thereto. The first and second electrodes 135 and 137 may include one selected from the group consisting of Cr, Ti, Co, Ni, V, Hf, Ag, Al, Ru, Rh, Pt, Pd, Ni, Mo, W, La, Ta, Ti and an alloy thereof. The first and second electrodes 135 and 137 may be prepared as multiple layers. For instance, the first and second electrodes 135 and 137 may include at least two of the adhesive layer/the reflective layer/the diffusion barrier layer/the bonding layer formed by using the above elements. The first and second electrodes 135 and 137 can be formed to have the same stack structure through the same manufacturing process, but the embodiment is not limited thereto.

The second electrode 137 may physically make contact with the reflective electrode layer 131 and the second conductive semiconductor layer 119.

The insulating layer 133 is disposed on the reflective electrode layer 131 through the sputtering or deposition process. The insulating layer 133 is formed over the whole area of the reflective electrode layer 131 except for the regions for the first and second electrodes 135 and 137, thereby covering the top surfaces of the reflective electrode layer 131 and the second conductive semiconductor layer 119 and the exposed portion of the first conductive semiconductor layer 115.

The insulating layer 133 includes an insulating material or an insulating resin formed by using oxide, nitride, fluoride or sulfide including Al, Cr, Si, Ti, Zn or Zr. For instance, the insulating layer 133 may include one selected from the group consisting of $SiO_2$, $Si_3N_4$, $Al_2O_3$ and $TiO_2$. The insulating layer 133 may be prepared as a single layer or multiple layers, but the embodiment is not limited thereto. The process for forming the electrodes 135 and 137 can be interchanged with the process for forming the insulating layer 133.

Figure 6:
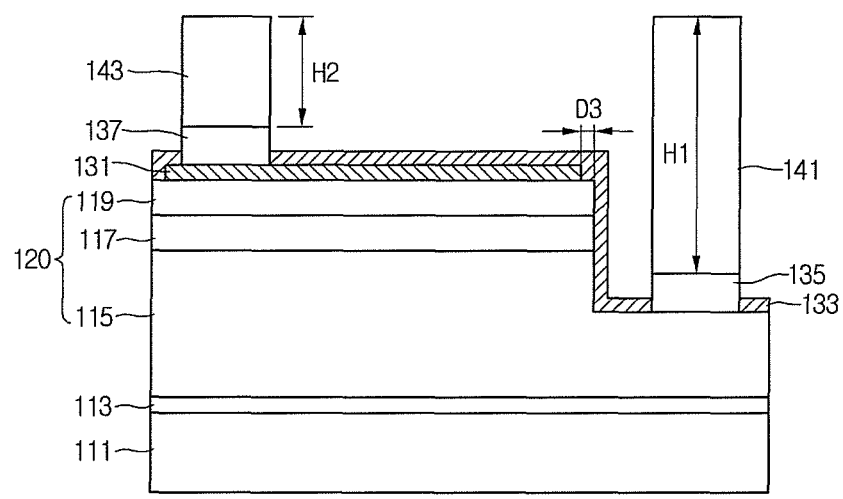

Referring to FIG. 6, the first connection electrode 141 is bonded onto the first electrode 135 and the second connection electrode 143 is bonded onto the second electrode 137. The first connection electrode 141 includes a conductive pad, such as a solder ball and/or a metal bump and is bonded onto the first electrode 135. The first connection electrode 141 can be aligned vertically to the top surface of the first conductive semiconductor layer 115. The second connection electrode 143 includes a conductive pad, such as a solder ball and/or a metal bump and is bonded onto the second electrode 137. The second connection electrode 143 can be aligned vertically to the top surface of the second conductive semiconductor layer 119.

The height H1 of the first connection electrode 141 is longer than the height H2 of the second connection electrode 143. The bottom surfaces of the first and second connection electrodes 141 and 143 are disposed on different planes and the top surfaces of the first and second connection electrodes 141 and 143 are aligned on the same plane (that is, the same horizontal plane).

Figure 7:
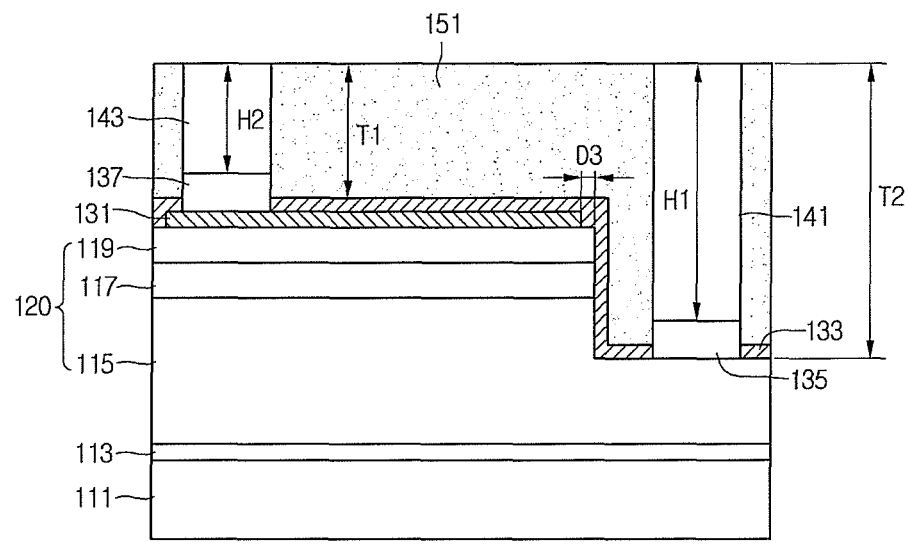

Referring to FIG. 7, the support member 151 is disposed on the insulating layer 133 through the squeeze scheme and/or the dispensing scheme. The support member 151 is prepared as an insulating support layer by adding the thermal diffusion agent into a resin, such as silicon or epoxy. The thermal diffusion agent may include at least one of oxide, nitride, fluoride and sulfide including Al, Cr, Si, Ti, Zn or Zr. For instance, the thermal diffusion agent may include a ceramic material. The thermal diffusion agent may be defined as a powder particle having a predetermined size, a grain, filler or an additive. The thermal diffusion agent includes the ceramic material. The ceramic material includes the LTCC (low temperature co-fired ceramic) or the HTCC (high temperature co-fired ceramic). The ceramic material may include metal nitride having thermal conductivity higher than that of nitride or oxide. For instance, the metal nitride may include a material having the thermal conductivity equal to or higher than 140 W/mK. For example, the ceramic material includes one selected from the group consisting of $SiO_2$, $Si_xO_y$, $Si_3N_4$, $Si_xN_y$, $SiO_xN_y$, $Al_2O_3$, BN, $Si_3N_4$, SiC(SiC—BeO), BeO, CeO, and AlN. The thermal conductive material may include C-component, such as diamond or CNT. In addition, the amount of the thermal diffusion agent added to the support member 151 may be 1~99 wt %. In order to improve the thermal diffusion efficiency, at least 50 wt % of the thermal diffusion agent can be added to the support member 151.

The support member 151 can be formed by mixing polymer with ink or paste using the ball mill, the planetary ball mill, the impellor mixing, the bead mill or the basket mill. In this case, a solvent and a dispersing agent can be used to uniformly distribute the mixture. The solvent is added to adjust the viscosity. In the case of ink, 3 to 400 Cps of the solvent is added. In addition, in the case of paste, 100 to one million Cps of the solvent is added. The solvent may include one selected from the group consisting of water, methanol, ethanol, isopropanol, butylcabitol, MEK, toluene, xylene, diethyleneglycol (DEG), formamide (FA), α-terpineol (TP), γ-butylrolactone (BL), Methylcellosolve (MCS), Propylmethylcellosolve (PM), and a combination thereof. In order to reinforce the coupling strength between particles, silane-based additives, such as 1-Trimethylsilylbut-1-yne-3-ol, Allytrimethylsilane, Trimethylsilyl methanesulfonate, Trimethylsilyl tricholoracetate, Methyl trimethylsilylacetate, or Trimethylsilyl propionic acid, can be added to the solvent. In this case, gelation may occur, so the addition of the silane-based additives must be seriously considered.

In the manufacturing process, the connection electrode, such as the solder bump, is previously manufactured and bonded and the support member is provided around the connection electrode. In contrast, after printing or dispensing the insulating layer including the ink or the paste, the insulating layer is cured, and then a conductive material is filled in a hole corresponding to the connection electrode, thereby forming the connection electrode.

The support member 151 has the height corresponding to the top surface of the first and second connection electrodes 141 and 143.

The support member 151 is filled around the first and second connection electrodes 141 and 143 and the first and second electrodes 135 and 137. The top surfaces of the first and second connection electrodes 141 and 143 are exposed through the top surface of the support member 151.

The support member 151 is an insulating support layer that supports the connection electrodes 141 and 143. In detail, the connection electrodes 141 and 143 are inserted into the support member 151.

The support member 151 has the thickness T sufficient for exposing the top surfaces of the first and second connection electrodes 141 and 143. The support member 151 is cured at the predetermined temperature. For instance, the support member 151 is cured at the temperature of 200□±100□, which may not exert influence upon the semiconductor layer.

The substrate 111 has the thickness of about 30 µm or above. The substrate 111 may have the thickness in the range of 30 µm to 150 µm by polishing the bottom surface of the substrate 111. Since the support member 151 is provided in the light emitting device 100 in opposition to the substrate 111, the substrate 111 can be used as a light emitting layer, so that the thickness of the substrate 111 may become thin. The CMP (chemical mechanical polishing) can be performed with respect to the surfaces of the support member 151 and the first and second connection electrodes 141 and 143. In addition, after the support member 151 has been formed, electrode holes are formed in the support member 151 and the first and second connection electrodes can be formed through the electrode holes.

Figure 8:
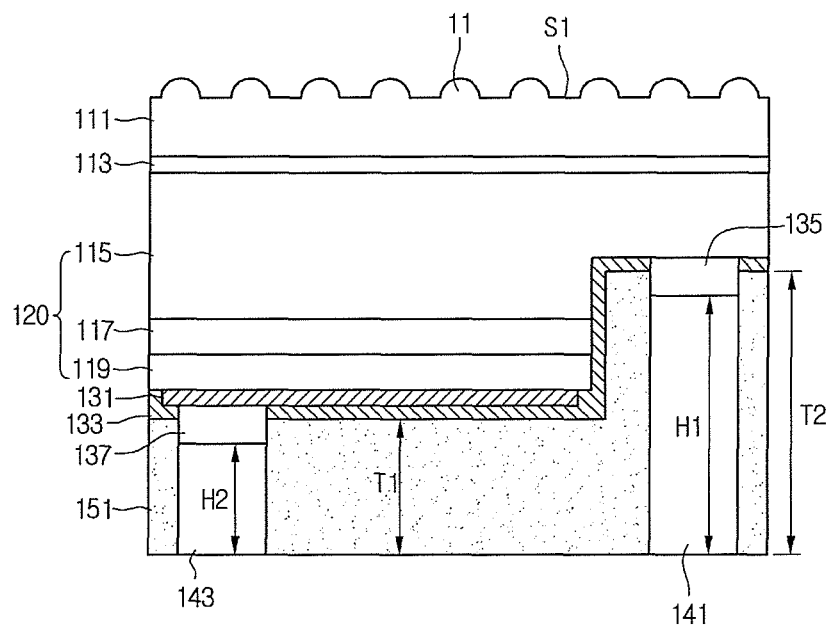

After rotating the light emitting device manufactured as shown in FIG. 7 by an angle of 180°, the first pattern portion having a plurality of protrusions 11 are disposed on the top surface S1 of the substrate 111 through the first etching scheme as shown in FIG. 8, that is, the first pattern portion is disposed on the surface opposite to the bottom surface of the substrate 111 where the semiconductor layer is formed. The first etching scheme includes at least one of a wet etching and a dry etching. If the first pattern portion has been formed, the upper portion of the substrate 111 is processed through a second etching scheme to form the second pattern portion having a plurality of concaves 12. The second etching scheme includes at least one of a wet etching and a dry etching. The concaves 12 are formed in the protrusions 11 as well as in a flat region of the top surface of the substrate 111. The concave 12 may have a size equal to ½ (50%) or less based on a size of the protrusion 11 and detailed description thereof is included in the description of FIG. 1. The concaves or the protrusions having the irregular interval can be formed through the wet etching process and the concaves or the protrusions having the periodic or regular interval can be formed through the dry etching process.

Figure 9:
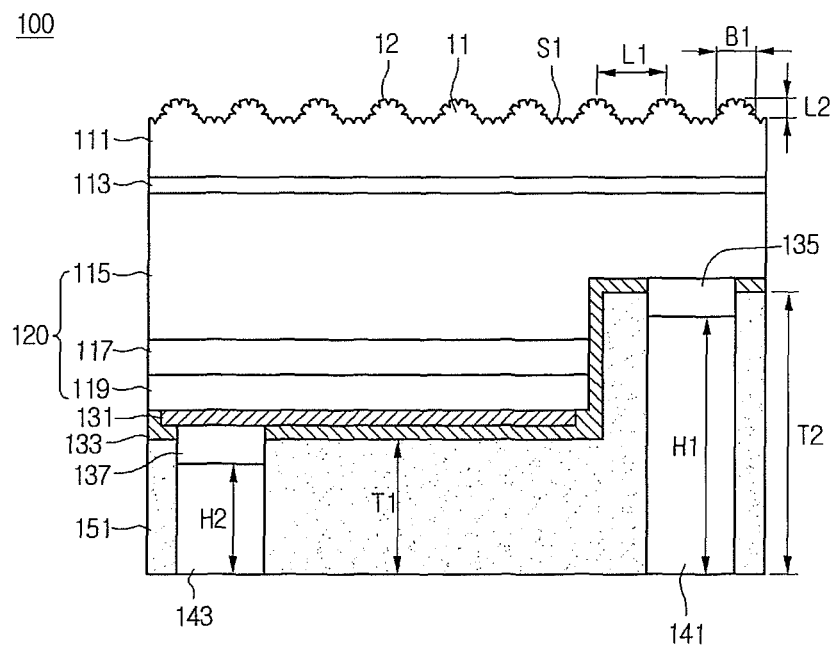

The light emitting device shown in FIG. 9 can be divided into individual light emitting devices as shown in FIG. 1 through the scribing, breaking and/or cutting work. The light emitting device is packaged in the wafer level, so that the light emitting device can be mounted on the module substrate through the flip bonding scheme without using the wire. The light emitting device shown in FIG. 9 can be mounted on a module substrate 170 as shown in FIG. 10 so that the light emitting device can be used as a light emitting module.

The top surface area of the support member 151 may be equal to the bottom surface area of the substrate 111 and the height of the support member 151 may be higher than the top surfaces of the first and second electrodes 135 and 137.

Figure 10:
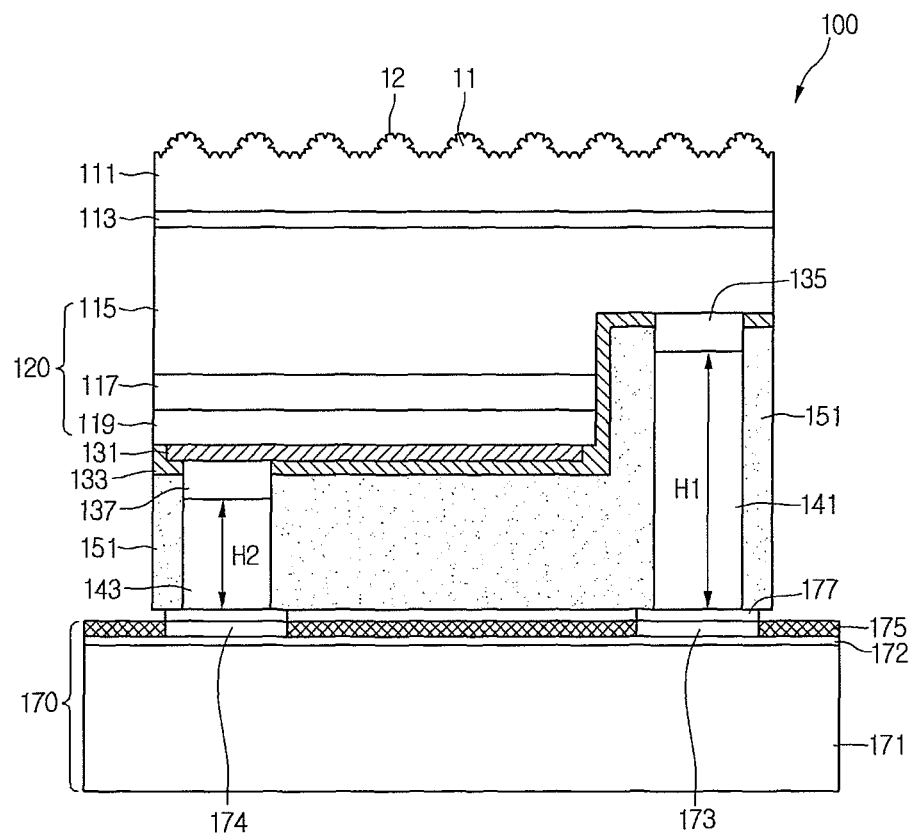
FIG. 10 is a side sectional view of a light emitting apparatus having the light emitting device shown in FIG. 1.

FIG. 10 is a side sectional view showing a light emitting apparatus having the light emitting device shown in FIG. 1.

Referring to FIG. 10, the light emitting device 100 is mounted on a module substrate 170 through a flip scheme.

An insulating layer 172 is disposed on a metal layer 171 of the module substrate 170 and first and second electrode pads 173 and 174 are disposed on the insulating layer 172. The first and second electrode pads 173 and 174 are land patterns for supplying power. A protective layer 175 is disposed on the insulating layer 172 except for a region for the first and second electrode pads 173 and 174. The protective layer 175 is a solder resist layer and includes a white protective layer or a green protective layer as a reflective layer or an insulating layer. The protective layer 175 effectively reflects the light, so that the quantity of reflected light can be increased.

The module substrate 170 may include a printed circuit board (PCB) having a circuit pattern (not shown). The module substrate 170 may also include a resin PCB, a metal core PCB (MCPCB), or a flexible PCB (FPCB), but the embodiment is not limited thereto.

The first connection electrode 141 of the light emitting device 100 is aligned corresponding to the top surface of the first electrode pad 173, and the second connection electrode 143 of the light emitting device 100 is aligned corresponding to the top surface of the second electrode pad 174. The first electrode pad 173 is bonded with the first connection electrode 141 by a bonding material 177, and the second electrode pad 174 is bonded with the second connection electrode 143 by the bonding material 177.

The light emitting device 100 is operated as power is applied thereto from the first and second electrode pads 173 and 174. The heat generated from the light emitting device 100 is transferred through the first and second connection electrodes 141 and 143 and then dissipated to the outside through the entire surface of the support member 151. The bottom surface of the support member 151 is spaced apart from the top surface of the module substrate 170 by a predetermined distance corresponding to the thickness of the bonding material 177.

A distance between the bottom surfaces of the first and second connection electrodes 141 and 143 of the light emitting device 100 and the top surface of the module substrate 170 is equal to a distance between the bottom surface of the support member 151 and the top surface of the module substrate 170.

Although it has been described that one light emitting device 100 is mounted on the module substrate 170, a plurality of light emitting devices can be arrayed on the module substrate 170, and the embodiment is not limited thereto.

Figure 11:
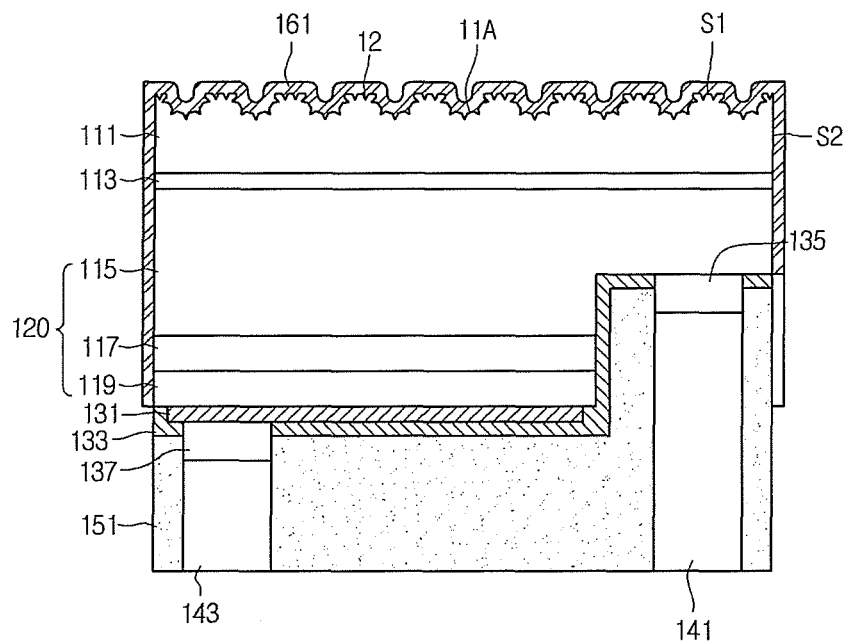
FIG. 11 is a side sectional view of a light emitting device according to the second embodiment.

FIG. 11 is a side sectional view showing a light emitting device according to the second embodiment.

Referring to FIG. 11, the light emitting device includes a phosphor layer 161 disposed on a surface of the substrate in opposition to the support member 151, that is, disposed on the light exit surface. The phosphor layer 161 may include a phosphor film or a coated layer and can be prepared as a single layer or multiple layers.

The phosphor layer 161 includes a transmissive resin layer containing phosphor materials. The transmissive resin layer includes silicon or epoxy, and the phosphor material includes one selected from the group consisting of YAG, TAG, silicate, nitride, and oxy-nitride-based material. The phosphor material includes at least one of a red phosphor material, a yellow phosphor material and a green phosphor material and excites a part of the light emitted from the active layer 117 to convert the wavelength of the light.

The phosphor layer 161 is disposed on the top surface S1 of the substrate 111 and at least one lateral side S2 of the substrate 111 and the light emitting structure 120. The phosphor layer 161 has the thickness in the range of 1~100,000 μm or 1~10,000 μm.

The phosphor layer 161 may include various phosphor layers different from each other, in which a first layer is one of red, yellow and green phosphor layers, and a second layer is disposed on the first layer and different from the first layer. Two different phosphor layers can be disposed on first and second regions, which are not overlapped with each other, respectively. A protective layer including a transmissive resin material can be disposed on the lateral sides of the phosphor layer 161 and the light emitting structure, but the embodiment is not limited thereto.

The first and second pattern portions are formed between the substrate 111 and the phosphor layer 161, in which the first pattern portion has the first concavo-convex structure including a first concave 11A concaved down with a first depth from the top surface of the substrate 111 and the second pattern portion has the second concavo-convex structure including a second concave 11B having a size equal to or less than 50% based on a size of the first concave 11A. The first concave 11A may be defined as a groove or a recess and the second concave 11B includes micro concavo-convex parts or a roughness convexly or concavely disposed on the first concave 11A and the top surface S1. Thus, the top surface S1 of the substrate 111 can be formed with the micro concavo-convex structure in addition to the concavo-convex structure including the plural first concaves 11A. The interval of the micro concavo-convex structure may be narrower than the interval of the first concaves 11A. The phosphor layer 161 may be disposed in the second concave 12.

The orientation angle of the light may be changed by the first and second concaves 11A and 12 so that the quantity of light extracted through the upper portion of the substrate 111 may be increased. Thus, the light extraction efficient at the upper portion of the substrate 111 can be improved, so that the color mixture by the phosphor layer 161 can be improved.

Figure 12:
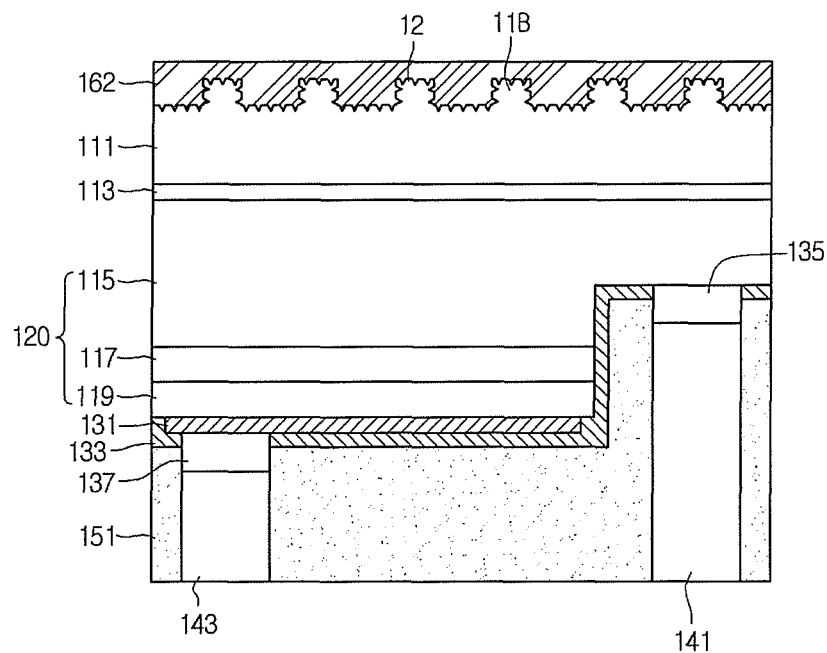
FIG. 12 is a side sectional view of a light emitting device according to the third embodiment.

FIG. 12 is a side sectional view showing a light emitting device according to the third embodiment.

Referring to FIG. 12, a plurality of protrusions 11B are formed at an upper portion of the substrate 111. The protrusions 11B protrude in opposition to the support member 151 to change the critical angle of the light incident through the substrate 111. Thus, the light extraction efficiency of the light emitting device can be improved. The protrusions 11B may have hemispherical lens shapes or polygonal shapes and are arranged in the form of a stripe pattern. The second pattern portion having a plurality of concaves 12 may be disposed on the surface of the protrusion 11B and the top surface of the substrate 111. The second pattern portion may have the micro concavo-convex parts or the roughness, but the embodiment is not limited thereto. A phosphor layer 162 may be disposed in the concave 12.

The phosphor layer 162 is disposed on the top surface of the substrate 111. A bottom surface of the phosphor layer 162 has a concavo-convex shape extending along the protrusions 112 and a top surface of the phosphor layer 162 has a flat shape or a concavo-convex shape. The bottom surface of the phosphor layer 162 may make contact with the top surface of the substrate 111 or may be separated therefrom, and the embodiment is not limited thereto.

The phosphor layer 162 can be formed only on the top surface of the substrate 111 or can be additionally disposed on the lateral sides of the substrate 111 and the light emitting structure 120, but the embodiment is not limited thereto.

Figure 13:
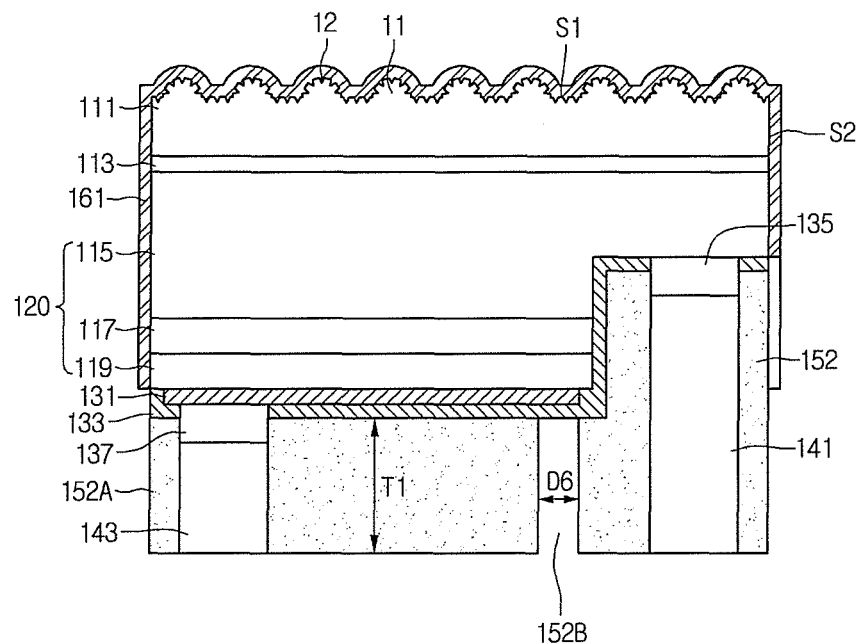
FIGS. 13 and 14 are a side sectional view and a bottom view of a light emitting device according to the fourth embodiment, respectively.
Figure 14:
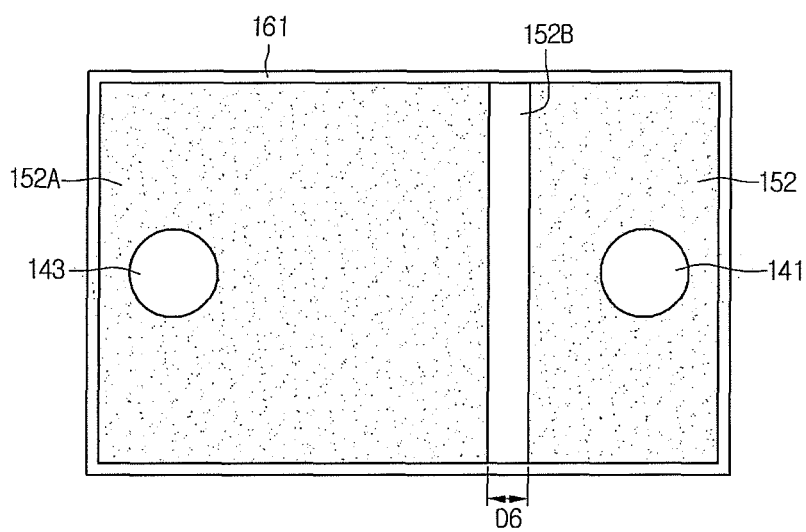

FIG. 13 is a view showing a light emitting device according to the fourth embodiment and FIG. 14 is a bottom view of FIG. 13.

Referring to FIGS. 13 and 14, a division slot 152B is formed between support members 152 and 152A. The division slot 152B divides the support members 152 and 152A from each other. The first support member 152 is disposed under one side of the light emitting structure 120 around the first connection electrode 141. The second support member 152A is disposed under the other side of the light emitting structure 120 around the second connection electrode 143.

The division slot 152B physically and electrically separates the first support member 152 from the second support member 152A and exposes the insulating layer 133 formed under the division slot 152B.

The first and second support members 152 and 152A may include the insulating material or the conductive material. The insulating material includes a resin material having the thermal diffusion agent. The conductive material includes carbon, SiC or a metal. If the first and second support members 152 and 152A include the conductive material, the first and second electrodes 141 and 142 include materials different from the conductive material.

Since the first and second support members 152 and 152A including the conductive material are separated from each other by the division slot 152B, the electric short can be prevented.

The division slot 152B has a width D6 corresponding to a distance between the first and second support members 152 and 152A, and a depth corresponding to the height T1 of the second support member 152A. The division slot 152B prevents the electric interference between the first and second support members 152 and 152A.

The bottom surfaces of the first and second support members 152 and 152A are aligned on the same plane with the bottom surfaces of the first and second connection electrodes 141 and 143. The first and second support members 152 and 152A can be mounted through the first and second connection electrodes 141 and 143 even if the first and second support members 152 and 152A include the conductive materials.

An insulating material including a ceramic material can be further disposed between first and second support members 152 and 152A. In this case, the ceramic material is aligned on the same horizontal plane with the bottom surfaces of the first and second support members 152 and 152A.

The substrate 111 is disposed on the top surface S1 thereof with the first pattern portion including a plurality of protrusions 11 and the second pattern portion including a plurality of concaves 12 having a size smaller than a size of the protrusions 11. The phosphor layer 161 disposed on the substrate 111 may make contact with or may be separate from the top surface S1 of the substrate 111, and the embodiment is not limited thereto. The phosphor layer 161 may be disposed in the concaves 12.

Figure 15:
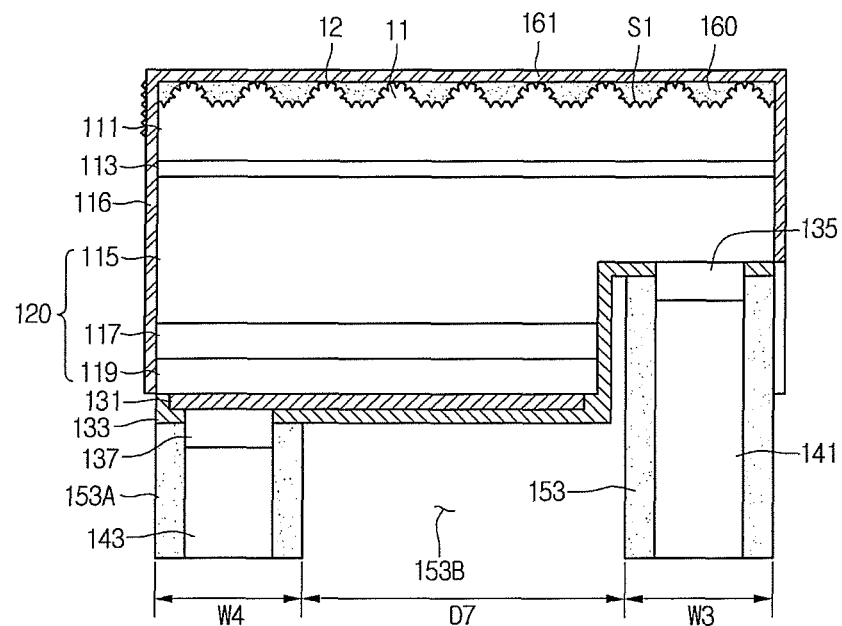
FIGS. 15 and 16 are a side sectional view and a bottom view of a light emitting device according to the fifth embodiment, respectively.
Figure 16:
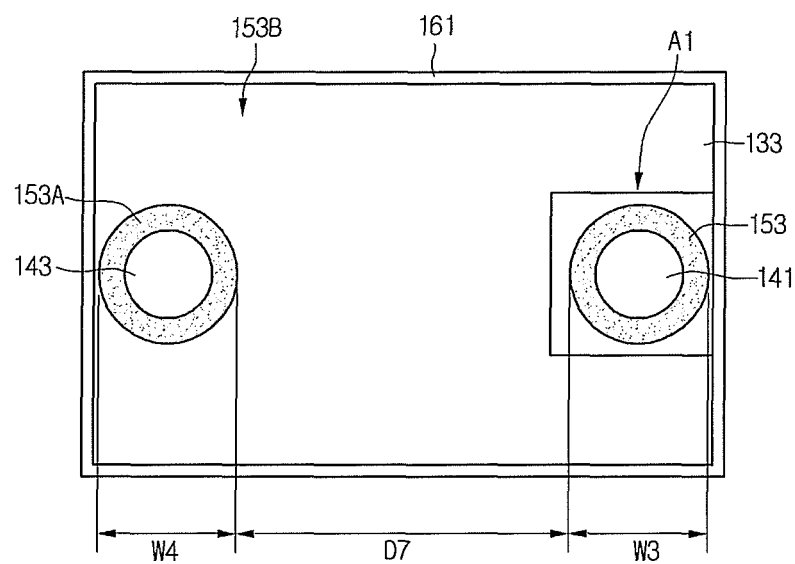

FIG. 15 is a view showing a light emitting device according to the fifth embodiment and FIG. 16 is a bottom view of FIG. 15.

Referring to FIGS. 15 and 16, the light emitting device includes a plurality of support members 153 and 153A aligned around the first and second connection electrodes 141 and 143. A peripheral portion of the first connection electrode 141 is covered with the first support member 153 and a peripheral portion of the second connection electrode 143 is covered with the second support member 153A. The first and second support members 153 and 153A may include insulating materials or conductive materials.

A width W3 of the first support member 153 is wider than a width of the first connection electrode 141, so that the first support member 153 may serve as a thermal and electrical conductive path. A width W4 of the second support member 153A is wider than a width of the second connection electrode 143, so that the second support member 153A may serve as a thermal and electrical conductive path.

A distance D7 between the first and second support members 153 and 153A is at least ½ of a length of one lateral side of the light emitting structure 120.

An insulating material including a ceramic material can be further disposed between first and second support members 153 and 153A. In this case, the ceramic material is aligned on the same horizontal plane with the bottom surfaces of the first and second support members 153 and 153A. An insulating material may be filled between the first and second support members 153 and 153A, but the embodiment is not limited thereto.

As shown in FIG. 15, a transmissive resin layer 160 may be further formed between the substrate 111 and the phosphor layer 161. The transmissive resin layer 160 may include a resin material having the refractive index lower than that of the substrate 111, such as silicon or epoxy.

The substrate 111 is disposed on the top surface S1 thereof with the first pattern portion including the protrusions 11 and the second pattern portion including the concaves 12 having a size smaller than a size of the protrusions 11. The transmissive resin layer 160 may be formed among the protrusions 11. The thickness of the transmissive resin layer 160 corresponds to the distance between the top surface S1 of the substrate 111 and the bottom surface of the phosphor layer 161 and is equal to, higher than, or lower than the thickness (or height) of the protrusion 11. In addition, the transmissive resin layer 160 bonds the phosphor layer 161 to the upper portion of the substrate 111 so that the interfacial loss of the light travelling to the transmissive resin layer 160 through the substrate 111 can be minimized. The phosphor layer 161 may be disposed on the concaves 12 formed in the protrusions 11 and the transmissive resin layer 160 is formed in the concaves 12.

Figure 17:
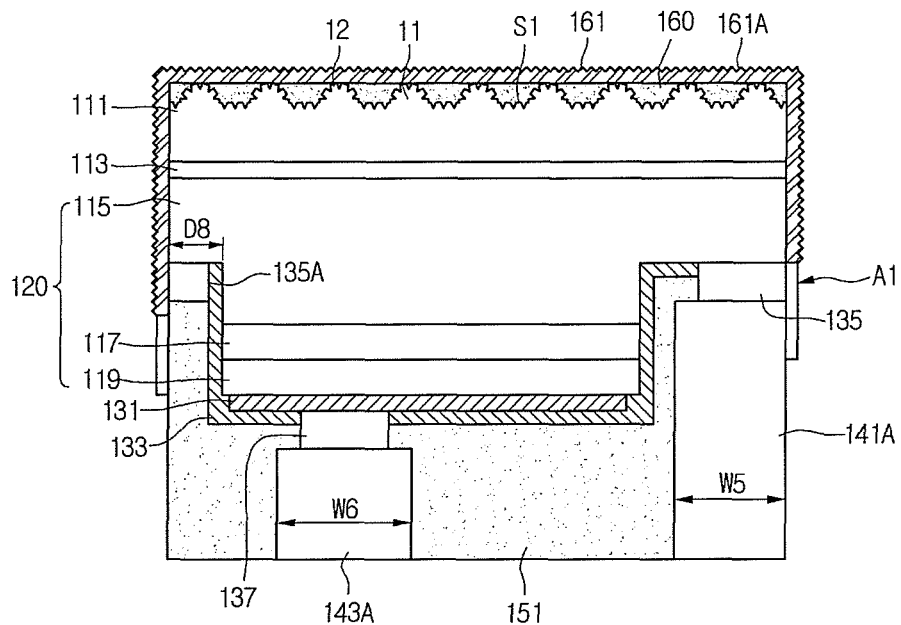
FIG. 17 is a side sectional view of a light emitting device according to the sixth embodiment.

FIG. 17 is a side sectional view showing a light emitting device according to the sixth embodiment.

Referring to FIG. 17, a width W5 of a first connection electrode 141A may be wider than a width of the first electrode 135 and lateral sides of the first connection electrode 141A and the first electrode 135 may be aligned on the same plane with the lateral sides of the light emitting structure 120 and the substrate 111. The predetermined region A1 of the light emitting structure 120 may be etched such that the etch region of the first conductive semiconductor layer 115 can be exposed. An edge region of the light emitting structure 120 is spaced apart from the lateral side of the light emitting structure 120 by a predetermined distance D8 along the edge region of the first conductive semiconductor layer 115 and can be formed in a loop shape. A part 135A of the first electrode 135 is formed in a loop shape along the edge region of the first conductive semiconductor layer 115. The loop shape may include an open loop shape or a closed loop shape.

A width W6 of a second connection electrode 143A may be wider than a width of the second electrode 137.

The light extracting structure, such as roughness, can be disposed on a surface 161A of the phosphor layer 161.

The transmissive resin layer 160 is disposed between the phosphor layer 161 and the substrate 111. The transmissive resin layer 160 can make contact with the protrusions 11 and the top surface S1 of the substrate 111 and may be disposed in the concaves 12.

Figure 18:
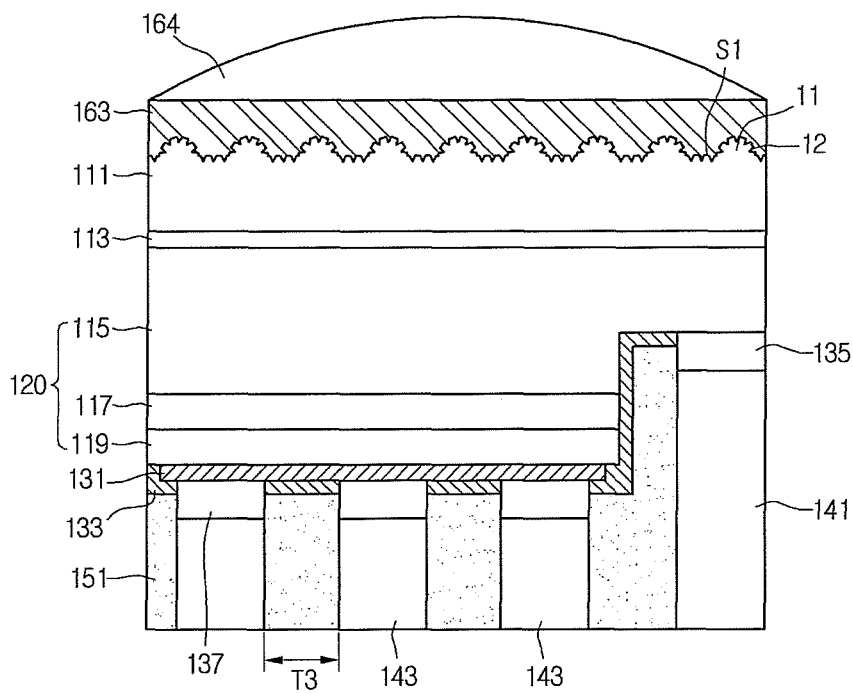
FIG. 18 is a side sectional view of a light emitting device according to the seventh embodiment.

FIG. 18 is a side sectional view showing a light emitting device according to the seventh embodiment.

Referring to FIG. 18, a phosphor layer 163 is disposed on the top surface of the substrate 111, and a lens 164 is disposed on the phosphor layer 163. The substrate 111 is disposed on the top surface S1 thereof with the first pattern portion including a plurality of protrusions 11 and the second pattern portion including a plurality of concaves 12 having a size smaller than a size of the protrusions 11. The phosphor layer 163 is disposed on the top surface of the substrate 111 with a predetermined thickness. The phosphor layer 163 may be disposed in the concaves 12 of the second pattern portion, but the embodiment is not limited thereto.

The lens 164 may be disposed on the phosphor layer 163 as a convex lens. In addition, the lens 164 may have a concave lens shape or an aspheric lens shape having a concavo-convex pattern. Further, the lens 164 may have a shape in which the center of a top surface and/or a bottom surface of the lens 164 is concaved as a total reflection surface.

A plurality of second electrodes 137 are formed under the reflective electrode layer 131, and second connection electrodes 143 are aligned under the second electrodes 137. The second connection electrodes 143 are spaced apart from each other at a predetermined interval T3. When viewed from the bottom of the light emitting device, the second connection electrodes 143 are aligned in the form of a dot matrix. The support members 151 are disposed between first and second connection electrodes 141 and 143 and between the second connection electrodes 143 to serve as an insulating support layer. Since the second connection electrodes 143 are disposed under the light emitting structure, the strength of the support member 151 can be reinforced and the electric contact efficiency can be improved. In addition, the bonding defect can be prevented from occurring at the second connection electrode 143 of the light emitting device. A plurality of first connection electrodes 141 can be provided and the embodiment is not limited thereto.

Figure 19:
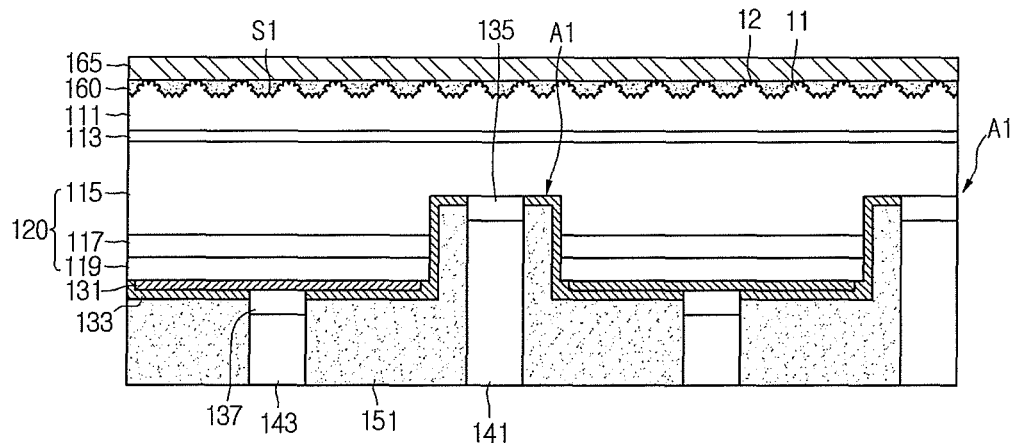
FIG. 19 is a side sectional view of a light emitting device according to the eighth embodiment.

FIG. 19 is a side sectional view showing a light emitting device according to the eighth embodiment.

Referring to FIG. 19, predetermined regions A1 of the light emitting structure 120 are etching regions to expose the first conductive semiconductor layer 115 at various regions. The first electrodes 135 are disposed under the first conductive semiconductor layer 115 and the second electrodes 137 are disposed under the reflective electrode layer 131. Since the first and second electrodes 135 and 137 are alternately aligned, the current can be uniformly supplied. A phosphor layer 165 is disposed on the substrate 111. Since the light emitting structure 120 is prepared as a plurality of cells, the brightness can be improved. The substrate 111 is disposed on the top surface S1 thereof with the first pattern portion including a plurality of protrusions 11 and the second pattern portion including a plurality of concaves 12 having a size smaller than a size of the protrusions 11. The transmissive resin layer 160 is disposed between the substrate 111 and the phosphor layer 165. The transmissive resin layer 160 makes contact with the protrusions 11 and the concaves 12 and may bond the phosphor layer 165.

Figure 20:
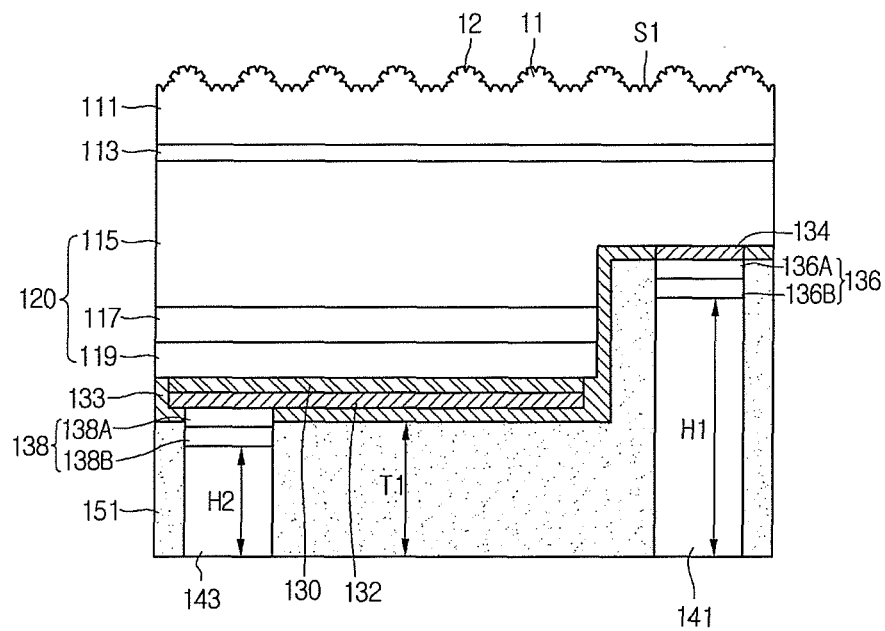
FIG. 20 is a side sectional view of a light emitting device according to the ninth embodiment.

FIG. 20 is a side sectional view showing a light emitting device according to the ninth embodiment. In the following description of the ninth embodiment, the same reference numerals will be assigned to the elements and structures that have been described in the first embodiment and detailed description thereof will be omitted in order to avoid redundancy.

Referring to FIG. 20, the reflective electrode layer 130 and the second electrode pad 132 are disposed under the light emitting structure 120 and the reflective electrode layer 130 serves as an ohmic and reflective electrode under the second conductive semiconductor layer 119. The second electrode pad 132 has a layered shape or a pattern shape. The substrate 111 is disposed on the light emitting structure 120. The substrate 111 is disposed on the top surface S1 thereof with the first pattern portion including a plurality of protrusions 11 and the second pattern portion including a plurality of concaves 12 having a size smaller than a size of the protrusions 11. The structure of the first pattern portion and the structure of the second pattern portion formed in the first pattern portion may vary, and the embodiment is not limited thereto.

A first electrode pad 134 is disposed under the first conductive semiconductor layer 115. The first electrode pad 134 makes contact with the first conductive semiconductor layer 115 and is bonded between a first electrode bonding layer 136 and the first conductive semiconductor layer 115. The first electrode bonding layer 136 is bonded between the first electrode pad 134 and the first connection electrode 141 to electrically connect the first electrode pad 134 with the first connection electrode 141. The first electrode bonding layer 136 includes a first bonding electrode 136A and a second bonding electrode 136B under the first bonding electrode 136A. The first bonding electrode 136A is bonded to the first electrode pad 134 and the second bonding electrode 136B is bonded between the first connection electrode 141 and the first bonding electrode 136A.

The first electrode pad 134 has the structure with a material and a thickness the same as those of the stack structure of the second electrode pad 132, which will be described later. For instance, the first and second electrode pads 134 and 132 include an adhesive layer, a reflective layer under the adhesive layer, a diffusion barrier layer under the reflective layer, and a bonding layer under the diffusion barrier layer. The first electrode bonding layer 136 is bonded between the first connection electrode 141 and the first electrode pad 134 to improve the bonding property between the first connection electrode 141 and the first electrode pad 134.

The first bonding electrode 136A of the first electrode bonding layer 136 is bonded with the second bonding electrode 136B bonded to the first connection electrode 141, so that the physical bonding and electrical connection property of the first connection electrode 141 can be improved.

The reflective electrode layer 130 is formed under the second conductive semiconductor layer 119 and the second electrode pad 132 is formed under the reflective electrode layer 130. A bottom surface area of the reflective electrode layer 130 may be equal to or smaller than a top surface area of the second electrode pad 132, but the embodiment is not limited thereto. A second electrode bonding layer 138 is formed between the second electrode pad 132 and the second connection electrode 143 to improve the bonding strength between the second electrode pad 132 and the second connection electrode 143.

The second electrode bonding layer 138 connects the second electrode pad 132 with the second connection electrode 143. The second electrode bonding layer 138 includes a third bonding electrode 138A and a fourth bonding electrode 138B under the third bonding electrode 138A. The third bonding electrode 138A is bonded to the second electrode pad 132 and the fourth bonding electrode 138B is bonded between the second connection electrode 143 and the third bonding electrode 138A.

The second electrode bonding layer 138 is bonded between the second connection electrode 143 and the second electrode pad 132 to improve the bonding property between the second connection electrode 143 and the second electrode pad 132. The first electrode pad 134 serves as a first electrode and the second electrode pad 132 serves as a second electrode.

Figure 21:
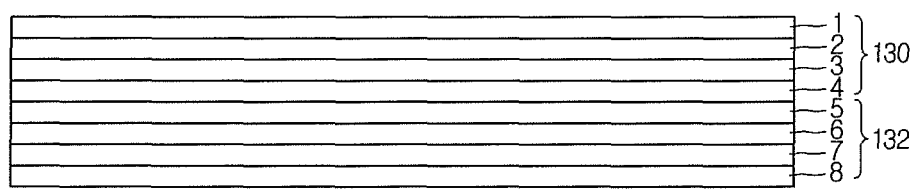
FIG. 21 is a view showing an example of a reflective electrode layer and a second electrode pad of FIG. 20.

FIG. 21 is a view showing an example of the reflective electrode layer and the second electrode pad according to the embodiment.

Referring to FIG. 21, the reflective electrode layer 130 includes an ohmic contact layer 1, a reflective layer 2 under the ohmic contact layer 1, a diffusion barrier layer 3 under the reflective layer 2, and a protective layer 4 under the diffusion barrier layer 3.

The ohmic contact layer 1 may include one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), SnO, InO, InZnO, ZnO, IrOx, RuOx, NiO, Ni, Cr and an alloy including at least two of the above elements. The ohmic contact layer 11 may include at least one layer and has a thickness of about 1 to 1,000 Å.

The reflective layer 2 formed under the ohmic contact layer 1 may include a material having reflectivity of about 70% or above. For instance, the reflective layer 12 may include one selected from the group consisting of Al, Ag, Ru, Pd, Rh, Pt, Ir and an alloy having at least two of the above elements. A metal of the reflective layer 12 makes ohmic-contact with the bottom surface of the second conductive semiconductor layer. In this case, the ohmic contact layer 1 can be omitted. The reflective layer 2 may have a thickness of about 1 to 10,000 Å.

The diffusion barrier layer 3 may include one selected from the group consisting of Au, Cu, Hf, Ni, Mo, V, W, Rh, Ru, Pt, Pd, La, Ta, Ti and an alloy having at least two of the above elements. The diffusion barrier layer 3 prevents the interlayer diffusion at the boundary region between two different layers. The diffusion barrier layer 3 may have a thickness of about 1 to 10,000 Å.

The protective layer 4 may include one selected from the group consisting of Au, Cu, Hf, Ni, Mo, V, W, Rh, Ru, Pt, Pd, La, Ta, Ti and an alloy having at least two of the above elements. The protective layer 14 may have a thickness of about 1 to 10,000 Å. The reflective electrode layer 130 may not include at least one of the ohmic contact layer 1, the diffusion barrier layer 3 and the protective layer 4.

The second electrode pad 132 includes an adhesive layer 5, a reflective layer 6 under the adhesive layer 5, a diffusion barrier layer 7 under the reflective layer 6 and a bonding layer 8 under the diffusion barrier layer 7. The adhesive layer 5 is bonded to the reflective electrode layer 130 and include one selected from the group consisting of Cr, Ti, Co, Ni, V, Hf and an alloy thereof. The adhesive layer 5 has a thickness of about 1 to 1,000 Å. The reflective layer 6 is formed under the adhesive layer 5 and includes one selected from the group consisting of Ag, Al, Ru, Rh, Pt, Pd and an alloy thereof. The reflective layer 6 has a thickness of about 1 to 10,000 Å. The diffusion barrier layer 7 is formed under the reflective layer 6 and includes one selected from the group consisting of Ni, Mo, W, Ru, Pt, Pd, La, Ta, Ti and an alloy thereof. The diffusion barrier layer 7 has a thickness of about 1 to 10,000 Å. The bonding layer 8 includes one selected from the group consisting of Al, Au, Cu, Hf, Pd, Ru, Rh, Pt and an alloy thereof. The bonding layer 8 has a thickness of about 1 to 10,000 Å. The second electrode pad 132 may not include the reflective layer 6.

At least one of the reflective electrode layer 130 and the second electrode pad 132 can be applied to the reflective electrode layer and the second electrode pad shown in FIG. 1 or disclosed in other embodiments, and the embodiment is not limited thereto.

Figure 22:
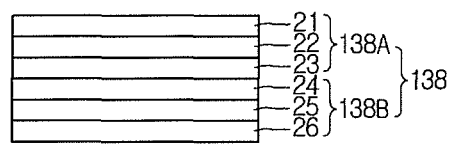
FIG. 22 is a view showing an example of a second electrode bonding layer of FIG. 20.

FIG. 22 is a view showing an example of the second electrode bonding layer of FIG. 20.

Referring to FIG. 22, the second electrode bonding layer 138 includes a third bonding electrode 138A and a fourth bonding electrode 138B, in which the third bonding electrode 138A includes at least three metal layers. The third bonding electrode 138A includes an adhesive layer 21, a support layer 22 under the adhesive layer 21, and a protective layer 23 under the support layer 22. The adhesive layer 21 is bonded to the second electrode pad and includes one selected from the group consisting of Cr, Ti, Co, Cu, Ni, V, Hf and an alloy including at least two of the above elements. The adhesive layer 21 has a thickness of 1~1,000 Å. The support layer 22 is thicker than the adhesive layer 21 and includes one selected from the group consisting of Ag, Al, Au, Co, Cu, Hf, Mo, Ni, Ru, Rh, Pt, Pd and an alloy including at least two of the above elements. The support layer 22 has a thickness of 1~500,000 Å or 1,000~100,000 Å. The protective layer 23 protects the first conductive semiconductor layer from external influence and includes one selected from the group consisting of Au, Cu, Ni, Hf, Mo, V, W, Rh, Ru, Pt, Pd, La, Ta, Ti and an alloy including at least two of the above elements. The protective layer 23 has a thickness of 1~50,000 Å.

The adhesive layer 21 and the support layer 22 of the third bonding electrode 138A may be repeatedly stacked by at least one periodicity.

The fourth bonding electrode 138B includes at least three metal layers. In detail, the fourth bonding electrode 138B includes an adhesive layer 24, a diffusion barrier layer 25 under the adhesive layer 24, and a bonding layer 26 under the diffusion barrier layer 25. The adhesive layer 24 is bonded to the third bonding electrode 138A and includes one selected from the group consisting of Cr, Ti, Co, Ni, V, Hf and an alloy including at least two of the above elements. The adhesive layer 24 has a thickness of 1~1,000 Å. The diffusion barrier layer 25 prevents the interlayer diffusion and includes one selected from the group consisting of Ni, Mo, Hf, W, Ru, Pt, Pd, La, Ta, Ti and an alloy including at least two of the above elements. The diffusion barrier layer 25 has a thickness of 1~10,000 Å. The bonding layer 26 is bonded to the first connection electrode and includes one selected from the group consisting of Au, Cu, Ni, Hf, Mo, V, W, Rh, Ru, Pt, Pd, La, Ta, Ti and an alloy including at least two of the above elements. The bonding layer 26 has a thickness of 1~10,000 Å. The adhesive layer 24 and the diffusion barrier layer 25 of the fourth bonding electrode 138B may be repeatedly stacked by at least one periodicity. The structure of the second electrode bonding layer shown in FIG. 22 can be applied to the electrode shown in FIG. 1 or disclosed in other embodiments, and the embodiment is not limited thereto.

Figure 23:
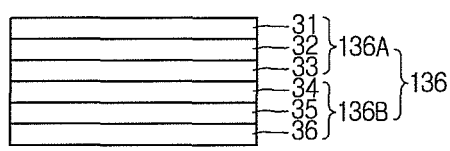
FIG. 23 is a view showing an example of a first electrode bonding layer of FIG. 20.

FIG. 23 is a view showing an example of the first electrode bonding layer of FIG. 20.

Figure 25:
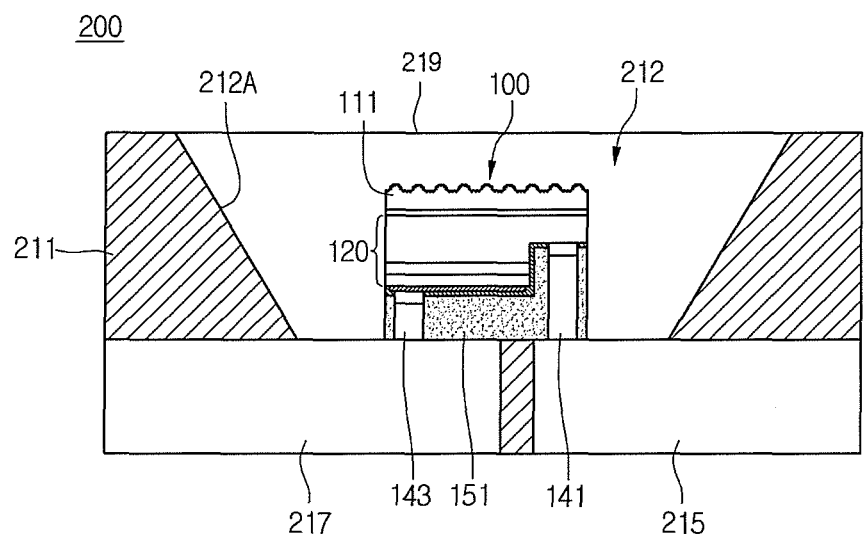
FIG. 25 is a view showing a light emitting device package having the light emitting device of FIG. 1.

Referring to FIG. 23, the first electrode bonding layer 136 includes a first bonding electrode 136A and a second bonding electrode 136B, in which the first bonding electrode 136A includes a metal layer the same as that of the third bonding layer 138A shown in FIG. 25. For instance, the first bonding electrode 136A may have a stack structure including an adhesive layer 31, a support layer 32 under the adhesive layer 31 and a protective layer 33 under the support layer 32. The second bonding electrode 136B includes a metal layer the same as that of the second bonding layer 138B. For instance, the second bonding electrode 136B may have a stack structure including an adhesive layer 34, a diffusion barrier layer 35 under the adhesive layer 34 and a bonding layer 36 under the diffusion barrier layer 35. Thus, the first bonding electrode 136A is disposed between the first electrode pad and the second bonding electrode 136B, and the second bonding electrode 136B is disposed between the first bonding electrode 136A and the first connection electrode 141. The structure of the first and second bonding electrodes 136A and 136B refers to the stack structure of the third and fourth bonding electrodes shown in FIG. 22. The structure of the first electrode bonding layer shown in FIG. 23 can be applied to the electrode shown in FIG. 1 or disclosed in other embodiments, and the embodiment is not limited thereto.

Figure 24:
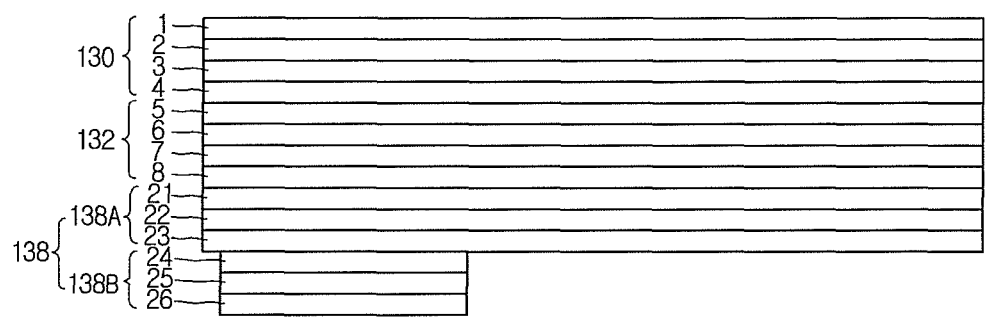
FIG. 24 is a view showing another example of a second electrode bonding layer of FIG. 20.

FIG. 24 is a view showing another example of the second electrode bonding layer of FIG. 20.

Referring to FIGS. 20 and 24, a top surface area of the third bonding electrode 138A of the second electrode bonding layer 138 may be equal to a bottom surface area of the second electrode pad 132. The top surface area of the third bonding electrode 138A of the second electrode bonding layer 138 may be larger than the top surface area of the fourth bonding electrode 138B and equal to or smaller than the bottom surface area of the second electrode. The structure of the second electrode pad and the second electrode bonding layer shown in FIG. 24 can be applied to the electrode shown in FIG. 1 or disclosed in other embodiments, and the embodiment is not limited thereto.

FIG. 25 is a view showing a light emitting device package having the light emitting device of FIG. 1.

Referring to FIG. 25, the light emitting device package 200 includes a body 211, first and second lead electrodes 215 and 217 installed in the body 211, a molding member 219 and the light emitting device 100.

The body 211 is injection molded by using one of a high reflective resin (for instance, PPA), a polymeric material or a plastic material and can be prepared as a substrate having a single layer or a multiple layers. The body 211 includes a cavity 212 having an open top surface, in which a sidewall of the cavity 212 is inclined or vertical to a bottom surface of the cavity 212.

The first and second lead electrodes 215 and 217 are disposed in the cavity 212 such that the first and second lead electrodes 215 and 217 are spaced apart from each other.

The light emitting device 100 is bonded onto the first and second lead electrodes 215 and 217 through the flip scheme. In detail, the first connection electrode 141 of the light emitting device 100 is bonded to the first lead electrode 215 and the second connection electrode 143 of the light emitting device 100 is bonded to the second lead electrode 217.

The distance between the top surface of the first lead electrode 215 and the bottom surface of the light emitting device 100, that is, the bottom surfaces of the first connection electrode 141, the second connection electrode 143 and the support member 151 may be equal to the distance between the top surface of the second lead electrode 217 and the bottom surface of the light emitting device 100.

The support member 151 of the light emitting device 100 is disposed on the first lead electrode 215 and the second lead electrode 217 to dissipate the heat through the entire surface of the support member 151.

The molding member 219 is formed in the cavity 212. The molding member 219 includes a transmissive resin material, such as silicon or epoxy. The molding member 219 may further include a phosphor material.

The most of the light generated from the light emitting device 100 is extracted through the top surface and the lateral sides of the light emitting device 100 and the extracted light is dissipated to the outside through the molding member 219. Since the first and second pattern portions are disposed on the top surface of the light emitting device 100 as shown in FIG. 1, the light extraction efficiency of the light passing through the top surface of the substrate can be more improved.

One or a plurality of light emitting devices can be mounted in the light emitting device package 200, but the embodiment is not limited thereto. If the light emitting device having the phosphor layer according to another embodiment is mounted in the light emitting device package, the phosphor material may not be added to the molding member 219. In addition, various phosphor materials different from each other or phosphor materials emitting similar colors can be added to the molding member 219.

Figure 26:
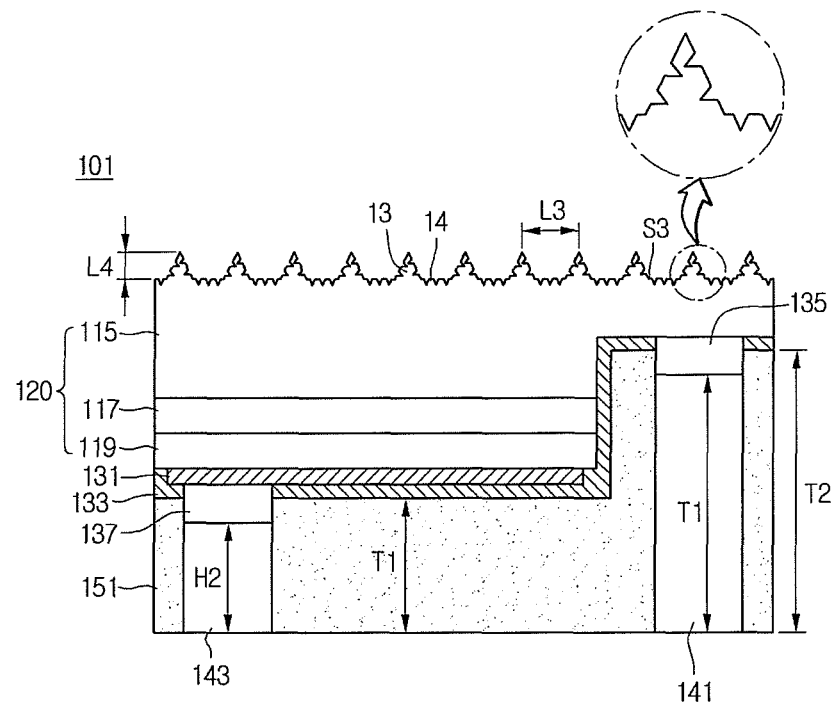
FIG. 26 is a side sectional view of a light emitting device according to the tenth embodiment.

FIG. 26 is a side sectional view of a light emitting device according to the tenth embodiment.

Referring to FIG. 26, the light emitting device 101 includes a first conductive semiconductor layer 115, an active layer 117, a second conductive semiconductor layer 119, a reflective electrode layer 131, an insulating layer 133, a first electrode 135, a second electrode 137, a first connection electrode 141, a second connection electrode 143 and a support member 151.

The top surface of the light emitting device 101 is the top surface S3 of the first conductive semiconductor layer 115 and the bottom surface of the light emitting device 101 is the bottom surface of the support member 151. The top surface S3 of the first conductive semiconductor layer 115 is opposite to the bottom surface of the support member 151. The light emitting device 101 can be obtained by removing the substrate from the structure shown in FIG. 1 so that the thickness of the light emitting device 101 can be thin. The thickness of the support member 151 can be increased to support the light emitting device 101.

The first conductive semiconductor layer 115 is disposed on the top surface S3 thereof with a third pattern portion having a third concavo-convex structure including a plurality of protrusions 13 and a fourth pattern portion having a fourth concavo-convex structure disposed on the third concavo-convex structure and including a plurality of concaves 14. The fourth concavo-convex structure is disposed on the third concavo-convex structure and defined by a micro concavo-convex configuration having a size smaller than a size of the protrusions 13.

The protrusions 13 of the third pattern portion may protrude from the top surface S3 of the first conductive semiconductor layer 115 or may have an embossing shape. In addition, the third pattern portion may include the concaves concaved or engraved lower than the top surface S3 of the first conductive semiconductor layer 115. The concaves 14 of the fourth pattern portion may be disposed on the surface of the protrusions 13 and the top surface S3 of the first conductive semiconductor layer 115 substrate 111 with a size smaller than a size of the protrusions 13. The concaves 14 may have an intaglio shape or a recess shape. In addition, the fourth pattern portion may have an embossing shape or a convex shape and may be formed with micro protrusions having a size smaller than that of the protrusions 13.

The third pattern portion includes the third concavo-convex structure including the protrusions 13 having the embossing shape and the flat top surface, and the fourth pattern portion includes the fourth concavo-convex structure disposed on the third concavo-convex structure and having the intaglio shape.

When viewed from the top, the third pattern portion may be arranged in the form of a matrix or a lattice.

For the purpose of convenience of explanation, according to the embodiment, the third pattern portion will be described as protrusions 13 and the fourth pattern portion will be described as concaves 14, but the embodiment is not limited thereto. The first conductive semiconductor layer 115 may be disposed at the uppermost layer of the light emitting device 101. However, it is also possible to dispose the first semiconductor layer at the uppermost layer of the light emitting device 101 and the embodiment is not limited thereto.

The active layer 117 is disposed on the bottom surface of the first conductive semiconductor layer 115. A plurality of protrusions 13 protrude upward from the top surface S3 of the first conductive semiconductor layer 115, which is opposite to the bottom surface of the first conductive semiconductor layer 115, and the concaves 14 are formed in the protrusions 13. The protrusions 13 may have a side sectional shape of a hemisphere, a cone, a polygonal cone, a column such as a cylinder or a polygonal column, or a truncated cone. When viewed from the top, each protrusion 13 may have a circular shape, a polygonal shape, or a mixed shape of a sphere and a surface.

The concaves 14 are concaved down with respect to the surface of each protrusion 13. The concaves 14 may have a side sectional shape of a hemisphere, a cone, a polygonal cone, a column such as a cylinder or a polygonal column, or a truncated cone. When viewed from the top, each concave 14 may have a circular shape, a polygonal shape, or a mixed shape of a sphere and a surface. The concaves 14 may be concaved down from the top surface S3 of the first conductive semiconductor layer 115. A maximum width of the concave 14 may be smaller than a maximum width of the protrusion 13.

A size of the concave 14 may be equal to or smaller than 50% based on a size of the protrusion 13. For instance, the concave 14 may have the size in the range of ½ to 1/100 based on the size of the protrusion 13. The size of the protrusion 13 may be at least one of a maximum width, a length of one lateral side, a radius, a thickness and a height L4 of the protrusion 13 and the size of the concave 14 may be at least one of a maximum width, a length of each lateral side, a height, a depth, a radius and a thickness of the concave 14.

The width or the height L4 of the protrusion 13 may be in the range of 0.1 µm to 10 µm, for instance, may be smaller than the thickness of the first conductive semiconductor layer 115 in the range of 0.1 µm to 3 µm. The width of the protrusion 13 may be larger than the height or the thickness of the protrusion 13, but the embodiment is not limited thereto. The width of the concave 14, that is, the maximum width of the concave 12 is smaller than the width of the protrusion 13 in the range of 0.1 nm to 100 nm or 0.1 nm to 100 µm in an irregular case. A pitch L1 between two protrusions 13 may be in the range of 0.1 µm to 100 µm, and a pitch between two concaves 14 may be in the range of 0.1 µm to 100 µm.

The protrusions 13 may change the critical angle of incident light and the concaves 14 may change the critical angle of light incident onto the protrusions 13 and the top surface S3 of the first conductive semiconductor layer 115. If the first and second patterns are disposed on the first conductive semiconductor layer 115 with different sizes from each other, the total reflection rate of the incident light may be lowered so that the light extraction efficiency can be improved.

The protrusions 13 may be arranged in a regular interval L3 or a random interval. In addition, the concaves 12 may be arranged in a regular interval or a random interval. The interval of the micro concavo-convex parts of the fourth pattern portion may be narrower than the interval L3 of the protrusions 13. Due to the third and fourth pattern portions according to the embodiment, the substrate disposed on the light emitting structure 120 can be removed, so that the travelling path of the light may be shortened. Thus, the loss of light caused by the total reflection of the light in the light emitting device can be reduced.

A light emitting structure 120 can be defined by the first conductive semiconductor layer 115, the second conductive semiconductor layer 119, and the active layer 117. The light emitting structure 120 includes the group III-V compound semiconductor. For instance, the light emitting structure 120 includes the semiconductor having the compositional formula of $In_xAl_yGa_{1-x-y}N$ ($0 \leq x \leq 1$, $0 \leq y \leq 1$, and $0 \leq x+y \leq 1$) and can emit the light having a predetermined peak wavelength in the wavelength range of an ultraviolet ray band to a visible ray band.

The light emitting structure 120 of the light emitting device 101 may be defined by the first conductive semiconductor layer 115, the active layer 117 and the second conductive semiconductor layer 119. The light emitting structure 120 may have one of an n-p junction structure, a p-n junction structure, an n-p-n junction structure, and a p-n-p junction structure. In this case, the symbols "n" and "p" represent n and p type semiconductor layers, respectively, and the symbol "-" represents that two layers are directly or indirectly stacked on each other. Hereinafter, the second conductive semiconductor layer 119 will be referred to as the uppermost layer of the light emitting structure 120 for the purpose of convenience of explanation.

The light emitting device 101 can be obtained by removing the substrate from the light emitting device shown in FIG. 1. The top surface of the first conductive semiconductor layer 115 is disposed at the top side of the light emitting device 101.

The reflective electrode layer 131 is formed under the second conductive semiconductor layer 119. The reflective electrode layer 131 includes at least one of an ohmic contact layer, a reflective layer, a diffusion barrier layer and a protective layer. The reflective electrode layer 131 may include the structure of the ohmic contact layer/reflective layer/diffusion barrier layer/protective layer, the reflective layer/diffusion barrier layer/protective layer, the ohmic contact layer/reflective layer/protective layer, the reflective layer/diffusion barrier, or the reflective layer. The structure of the reflective electrode layer 131 is shown in FIG. 21.

The reflective electrode layer 131 may include the stack structure of a transmissive electrode layer/a reflective layer. The reflective electrode layer 131 may include one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), SnO, InO, InZnO, ZnO, IrOx, and RuOx. The reflective layer may be formed under the transmissive electrode layer. The reflective layer includes a first layer having a first refractive index and a second layer having a second refractive index. The reflective layer may include the stack structure in which at least two pairs of the first and second layers are alternately stacked. The first refractive index is different from the second refractive index and the first and second layers may include a material having the refractive index in the range of 1.5 to 2.4. For instance, the first and second layers may include a conductive material or an insulating material. Such a structure may be defined as a DBR (distributed bragg reflection) structure.

A light extracting structure, such as a roughness, can be disposed on a surface of at least one of the second conductive semiconductor layer 119 and the reflective electrode layer 131. The light extracting structure may vary the critical angle of the incident layer to improve the light extraction efficiency.

The first and second connection electrodes 141 and 143 may serve as a lead for supplying power and a heat dissipation path. The first and second connection electrodes 141 and 143 may have a column shape. For instance, the first and second connection electrodes 141 and 143 may have a spherical shape, a cylindrical shape, a polygonal column shape or a random shape. The polygonal column shape may be an equiangular column shape or not, and the embodiment is not limited thereto. The top and bottom surfaces of the first and second connection electrodes 141 and 143 may have a circular shape or a polygonal shape, but the embodiment is not limited thereto. The bottom surface area of the first and second connection electrodes 141 and 143 may be different from the top surface area of the first and second connection electrodes 141 and 143. For instance, the bottom surface area of the first and second connection electrodes 141 and 143 may be larger or smaller than the top surface area of the first and second connection electrodes 141 and 143.

At least one of the first and second connection electrodes 141 and 143 is smaller than a width of a bottom surface of the light emitting structure 120 and larger than a diameter or a width of a bottom surface of the first and second electrodes 135 and 137.

The diameter or the width of the first and second connection electrodes 141 and 143 is in the range of 1 µm~100,000 µm and the height of first and second connection electrodes 141 and 143 is in the range of 1 µm~100,000 µm. The height H1 of the first connection electrode 141 may be longer than the height H2 of the second connection electrode 143 and bottom surfaces of the first and second connection electrodes 141 and 143 may be aligned on the same plane (that is, horizontal plane).

The first and second connection electrodes 141 and 143 may be prepared as a single layer by using one metal or an alloy. The width and the height of the single layer is in the range of 1 µm~100,000 µm. For instance, the single layer has the thickness larger than the thickness of the second connection electrode 143.

The first and second connection electrodes 141 and 143 may include one selected from the group consisting of Ag, Al, Au, Cr, Co, Cu, Fe, Hf, In, Mo, Ni, Si, Sn, Ta, Ti, W and an alloy thereof. In order to improve the adhesive strength with respect to the first and second electrodes 135 and 137, the first and second connection electrodes 141 and 143 may be plated with a metal including one selected from the group consisting of In, Sn, Ni, Cu and an alloy thereof. At this time, the plating thickness may be in the range of 1~100,000 Å.

A plating layer can be further disposed on the surfaces of the first and second connection electrodes 141 and 143. The plating layer may include Tin or an alloy thereof, Ni or an alloy thereof, or Tin-Ag—Cu. At this time, the plating layer may have a thickness of about 0.5 µm~10 µm. The plating layer can improve the bonding strength with respect to other bonding layers.

The insulating layer 133 may be formed under the reflective electrode layer 131. In detail, the insulating layer 133 can be disposed on the bottom surface of the second conductive semiconductor layer 119, lateral sides of the second conductive semiconductor layer 119 and the active layer 117, and the bottom surface of the predetermined region A1 of the first conductive semiconductor layer 115. The insulating layer 133 is disposed on the lower region of the light emitting structure 120 except for the region for the reflective electrode layer 131, the first electrode 135 and the second electrode 137 to electrically protect the lower portion of the light emitting structure 120.

The insulating layer 133 includes an insulating material or an insulating resin formed by using oxide, nitride, fluoride or sulfide including at least one of Al, Cr, Si, Ti, Zn and Zr. For instance, the insulating layer 133 may include one selected from the group consisting of $SiO_2$, $Si_3N_4$, $Al_2O_3$ and $TiO_2$. The insulating layer 133 may be prepared as a single layer or multiple layers, but the embodiment is not limited thereto. The insulating layer 133 prevents the layer-to-layer short of the light emitting structure 120 when a metal structure is formed under the light emitting structure for the purpose of flip bonding.

The insulating layer 133 can be formed only on the surface of the light emitting structure 120 without being disposed on the bottom surface of the reflective electrode layer 131. Since the support member 151 having the insulating property is disposed on the bottom surface of the reflective electrode layer 131, the insulating layer 133 may not need to extend to the bottom surface of the reflective electrode layer 131.

The insulating layer 133 has the DBR structure in which the first and second layers having refractive indexes different from each other are alternately aligned. In detail, the first layer includes one of $SiO_2$, $Si_3N_4$, $Al_2O_3$, and $TiO_2$ and the second layer includes materials except for the materials of the first layer.

The insulating layer 133 may have the thickness in the range of 100 to 10,000 Å. If the insulating layer 133 is prepared as the multiple layers, each layer may have the thickness in the range of 1 to 50,000 Å or 100 to 10,000 Å. The thickness of each layer of the insulating layer 133 having the multiple layers may vary the reflective efficiency according to the emission wavelength. In this case, the reflective electrode layer may be omitted.

The first and second connection electrodes 141 and 143 may include Ag, Al, Au, Cr, Co, Cu, Fe, Hf, In, Mo, Ni, Si, Sn, Ta, Ti, W and an alloy thereof. In addition, the first and second connection electrodes 141 and 143 may have a plating layer including In, Sn, Ni, Cu and an alloy thereof to improve the adhesive strength with respect to the first and second electrodes 135 and 137. In this case, the plating layer has the thickness in the range of 1~100,000 Å. The first and second connection electrodes 141 and 143 may be used as a single metal, such as a solder ball or a metal bump, but the embodiment is not limited thereto.

The support member 151 serves as a support layer to support the light emitting device 100. The support member 151 includes an insulating material. For instance, the insulating material may be a resin including silicon or epoxy. In addition, the insulating material may include paste or insulating ink. The insulating material may also include a resin selected from the group consisting of a polyacrylate resin, an epoxy resin, a phenolic resin, a polyamides resin, a polyimide resin, an unsaturated polyesters resin, a polyphenylene ether resin (PPE), a polyphenylene oxide resin (PPO), a polyphenylene sulfides resin, a cyanate ester resin, benzocyclobutene (BCB), Polyamido-amine Dendrimers (PAMAM), Polypropylene-imine, Dendrimers (PPI), PAMAM-OS (organosilicon) having an internal structure of PAMAM and an outer surface of organosilicon, and a combination thereof. The material for the support member 151 may be different from the material for the insulating layer 133.

At least one of compounds, such as oxide, nitride, fluoride or sulfide including at least one of Al, Cr, Si, Ti, Zn and Zr, can be added to the support member 151. The compound added to the support member 151 may be a thermal diffusion agent. The thermal diffusion agent is a powder particle having a predetermined size, a grain, filler or an additive. In the following description, the support member 151 including the thermal diffusion agent will be described for the purpose of convenience of the explanation. The thermal diffusion agent may include an insulating material or a conductive material having a size of 1 Å~100,000 Å. In order to improve the thermal diffusion efficiency, the thermal diffusion agent may have a size of 1,000 Å~50,000 Å. The grain of the thermal diffusion agent may have a spherical shape or an irregular shape, but the embodiment is not limited thereto.

The thermal diffusion agent includes a ceramic material. The ceramic material includes at least one of LTCC (low temperature co-fired ceramic), HTCC (high temperature co-fired ceramic), alumina, quartz, calcium zirconate, forsterite, SiC, graphite, fused-silica, mullite, cordierite, zirconia, beryllia, and aluminum nitride. The ceramic material may include metal nitride having thermal conductivity higher than that of nitride or oxide. For instance, the metal nitride may include a material having the thermal conductivity equal to or higher than 140 W/mK. For example, the ceramic material includes one selected from the group consisting of SiO2, SixOy, Si3N4, SixNy, SiOxNy, Al2O3, BN, Si3N4, SiC(SiC—BeO), BeO, CeO, and AlN. The thermal conductive material may include C-component, such as diamond or CNT.

The support member 151 can be prepared as a single layer or multiple layers, and the embodiment is not limited thereto. The support member 151 is provided therein with ceramic powder, so the strength and the thermal conductivity of the support member 151 can be improved.

In addition, the amount of the thermal diffusion agent added to the support member 151 may be 1~99 wt %. In order to improve the thermal diffusion efficiency, 50~99 wt % of the thermal diffusion agent can be added to the support member 151. Since the thermal diffusion agent is added to the support member 151, the thermal conductivity can be more improved at the interior of the support member 151. In addition, the support member 151 has the thermal expansion coefficient of 4-11 [×10$^6$/° C.]. The above thermal expansion coefficient is equal or similar to the thermal expansion coefficient of the sapphire substrate, so the wafer may not be warped or damaged caused by the difference in the thermal expansion coefficient between the support member 151 and the light emitting structure 120 disposed on the sapphire substrate, which is the growth substrate, thereby improving the reliability of the light emitting device.

Figure 27:
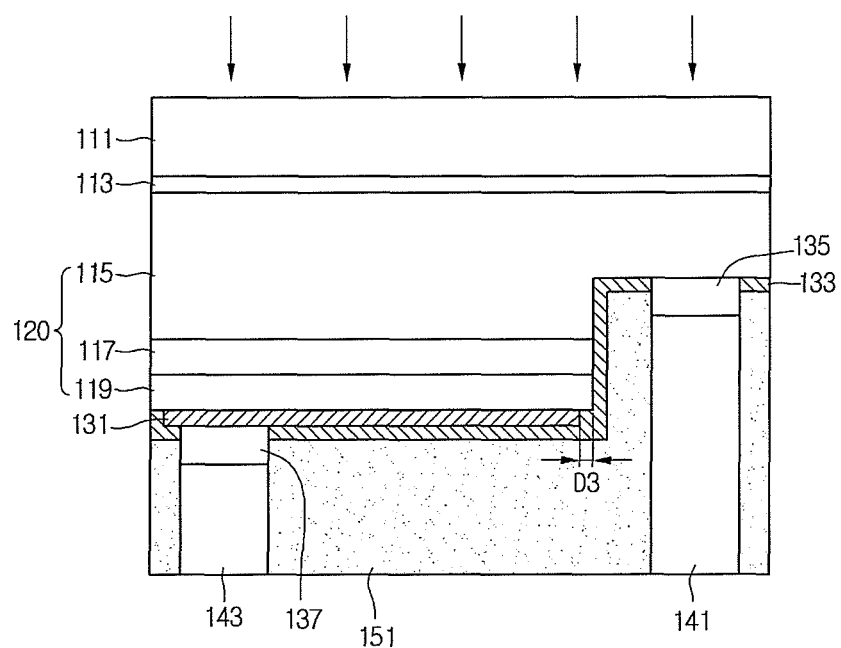
FIGS. 27 to 29 are views showing the manufacturing process for the light emitting device shown in FIG. 26.

The bottom surface area of the support member 151 is substantially equal to the top surface area of the light emitting structure 120, that is, the top surface area of the support member 151. In addition, the bottom surface area of the support member 151 is equal to the top surface area of the first conductive semiconductor layer 115. Referring to FIG. 27, a length D1 of a first lateral side of the support member 151 is substantially the same as a length of a first lateral side of the light emitting structure 120 shown in FIG. 26, and a length D2 of a second lateral side of the support member 151 is substantially the same as a length of a second lateral side of the light emitting structure 120 shown in FIG. 26. In addition, a distance D5 between the first and second connection electrodes 141 and 143 is an interval between two adjacent electrode pads and corresponds to ½ or more with respect to the length of one lateral side of the light emitting device 101.

The bottom surface of the support member 151 is a substantially flat surface or an irregular surface, but the embodiment is not limited thereto.

A thickness T1 of the first region of the support member 151 is thicker than a thickness of the second connection electrode 143. Alternatively, the thickness T1 of the first region of the support member 151 may be thinner than the thickness H2 of the second connection electrode 143. If the thickness of the insulating layer 133 is thicker than the thickness of the second connection electrode 143, the thickness of the support member 151 may become thin. A thickness T2 of the second region of the support member 151 is thicker than a thickness T2 of the first connection electrode 141. The support member 151 may have the thickness T1 in the range of 1 µm~100,000 µm or 50 µm~1,000 µm.

The bottom surface of the support member 151 is lower than the bottom surfaces of the first and second electrodes 135 and 137 and is aligned on the same plane (that is, horizontal plane) with the bottom surfaces of the first and second connection electrodes 141 and 143

The support member 151 makes contact with outer peripheral surfaces of the first and second electrodes 135 and 137 and first and second connection electrodes 141 and 143. Thus, heat induced from the first and second electrodes 135 and 137 and first and second connection electrodes 141 and 143 can be diffused and dissipated through the support member 151. The thermal conductivity of the support member 151 can be improved by the thermal diffusion agent contained in the support member 151, so that the support member 151 can dissipate the heat through the whole surface of the support member 151. Thus, the reliability of the light emitting device 100 can be improved against heat.

In addition, the lateral side of the support member 151 can be aligned on the same plane (that is, vertical plane) with the lateral sides of the light emitting structure 120 and the substrate 111.

The light emitting device 101 is mounted through the flip scheme, so the most of light is emitted toward the top surface of the light emitting structure 120 and some light is emitted through the lateral sides of the light emitting structure 120. Thus, the light loss caused by the first and second electrodes 135 and 137 can be reduced. Accordingly, the light extraction efficiency and heat dissipation efficiency of the light emitting device 101 can be improved.

Figure 28:
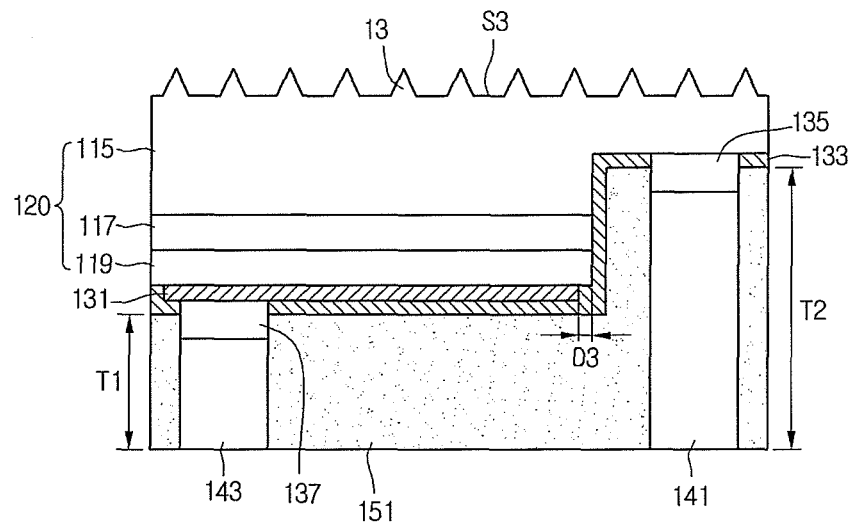
Figure 29:
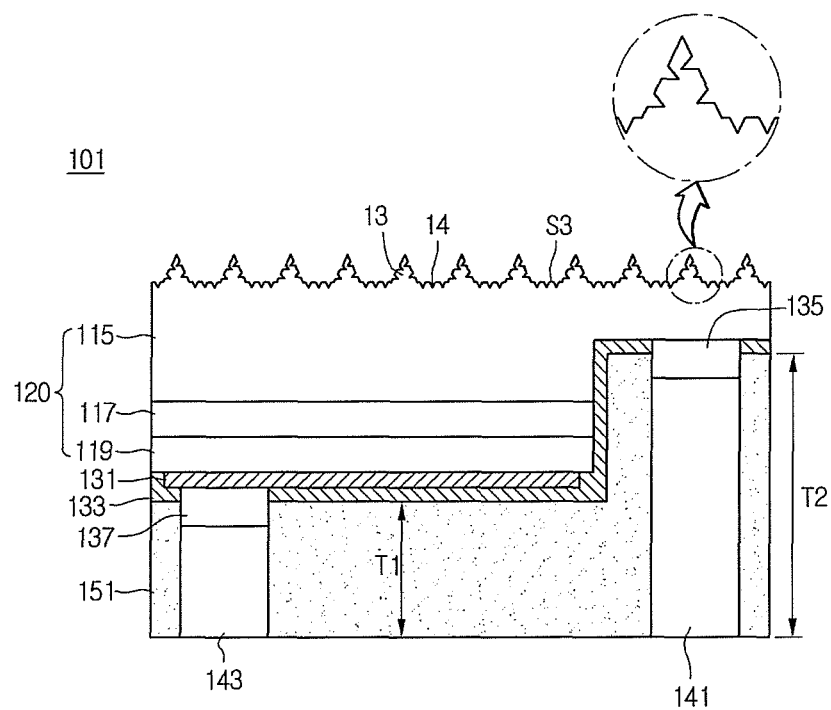

FIGS. 27 to 29 are views showing the manufacturing process for the light emitting device.

Referring to FIG. 27, if the wafer as shown in FIG. 9 is rotated by an angle of 180°, the substrate 111 is located at the uppermost position of the light emitting device as shown in FIG. 27. In this state, the substrate 111 is subject to the lift off process. The lift off process is adopted to remove the substrate in the physical scheme and/or the chemical scheme. According to the physical scheme, laser is irradiated onto the substrate 111 to remove the substrate 111. In addition, according to the chemical scheme, a hole is formed in the substrate 111 and the semiconductor layer between the substrate 111 and the first conductive semiconductor layer 115 is removed through the wet etching, thereby separating the substrate 111 from the light emitting structure 120.

Referring to FIGS. 27 and 28, if the substrate 111 is removed, the first semiconductor layer 113 is exposed as shown in FIG. 11 so that the first semiconductor layer 113 can be removed through the wet etching process. Alternatively, the first semiconductor layer 114 may not be removed. Then, the upper portion of the first conductive semiconductor layer 115 is etched through a first etching scheme to form the third pattern portion having the third concavo-convex structure including a plurality of protrusions 13. The first etching scheme includes at least one of a wet etching and a dry etching. A part of the third pattern portion is bulged or concaved from the flat top surface of the first conductive semiconductor layer 115.

Referring to FIG. 29, the upper portion of the first conductive semiconductor layer 115 is etched through a second etching scheme to form the fourth pattern portion including a plurality of concaves 14. The second etching scheme includes at least one of a wet etching and a dry etching. A part of the fourth pattern portion is bulged or concaved from the flat top surface S3 of the first conductive semiconductor layer 115 as a recess or a roughness.

The light emitting device 101 is packaged in the wafer level and divided into individual chips through the scribing, breaking and/or cutting work, so that the light emitting device as shown in FIG. 29 can be provided. Since the light emitting device is packaged in the wafer level, the light emitting device can be mounted on the module substrate through the flip bonding scheme without using the wire. In addition, since the light exit surface is aligned toward the top surface and lateral sides of the light emitting structure 120, other than the electrode, the light loss can be reduced and the brightness and light distribution can be improved.

The bottom surface area of the support member 151 may be equal to or smaller than the top surface area of the light emitting structure 120 and the height of the support member 151 may be higher than thickness of the first and second electrodes 135 and 137 to the extent that the support member 151 can be aligned on the same horizontal plane with the bottom surfaces of the connection electrodes 141 and 143.

Figure 30:
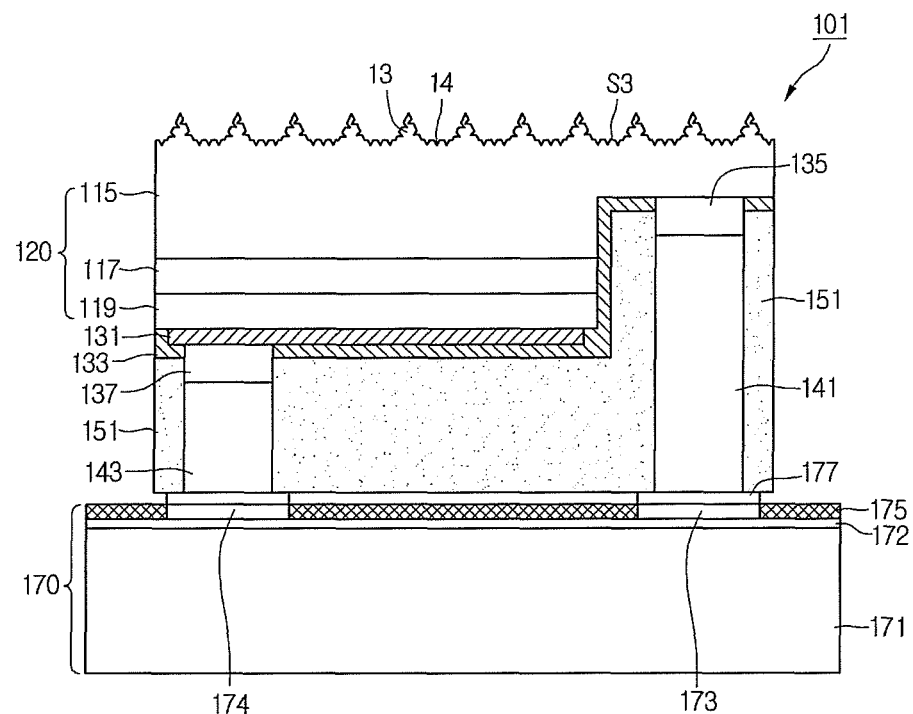
FIG. 30 is a side sectional view of a light emitting apparatus having the light emitting device shown in FIG. 26.

FIG. 30 is a view showing a light emitting apparatus having the light emitting device shown in FIG. 26.

Referring to FIG. 30, the light emitting device 101 is mounted on a module substrate 170 through a flip scheme.

An insulating layer 172 is disposed on a metal layer 171 of the module substrate 170 and first and second pads 173 and 174 are disposed on the insulating layer 172. The first and second pads 173 and 174 are land patterns for supplying power. A protective layer 175 is disposed on the insulating layer 172 except for a region for the first and second pads 173 and 174. The protective layer 175 is a solder resist layer or an insulating layer and includes a white protective layer or a green protective layer. The protective layer 175 effectively reflects the light, so that the quantity of reflected light can be increased.

The module substrate 170 may include a printed circuit board (PCB) having a circuit pattern (not shown). The module substrate 170 may also include a resin PCB, a metal core PCB (MCPCB), or a flexible PCB (FPCB), but the embodiment is not limited thereto.

The first connection electrode 141 of the light emitting device 101 is aligned corresponding to the top surface of the first pad 173, and the second connection electrode 143 of the light emitting device 101 is aligned corresponding to the top surface of the second pad 174. The first pad 173 is bonded with the first connection electrode 141 by a bonding material 177, and the second pad 174 is bonded with the second connection electrode 143 by the bonding material 177.

A distance between the bottom surfaces of the first and second connection electrodes 141 and 143 of the light emitting device 101 and the top surface of the module substrate 170 is equal to a distance between the bottom surface of the support member 151 and the top surface of the module substrate 170.

Although it has been described that one light emitting device 101 is mounted on the module substrate 170, a plurality of light emitting devices can be arrayed on the module substrate 170, and the embodiment is not limited thereto. In addition, the light emitting device 101 is provided on the upper portion thereof with the third and fourth pattern portions, so that the light extraction efficiency can be improved.

Figure 31:
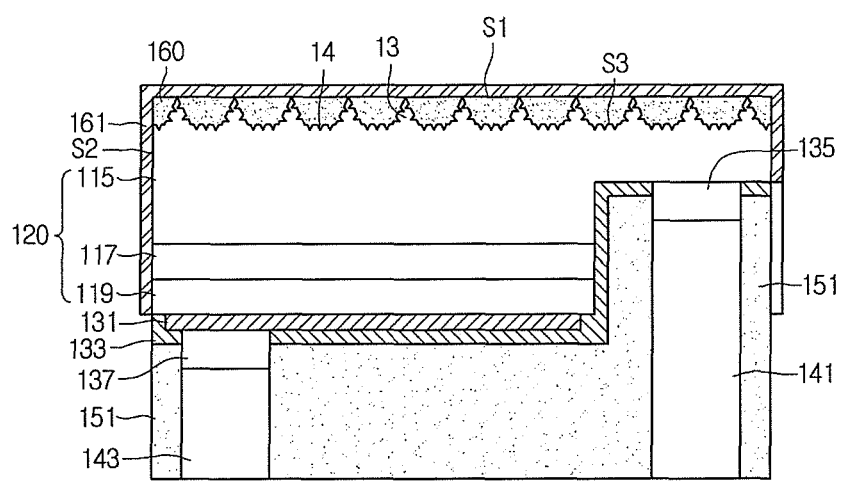
FIG. 31 is a side sectional view of a light emitting device according to the eleventh embodiment.

FIG. 31 is a side sectional view showing a light emitting device according to the eleventh embodiment.

Referring to FIG. 31, the light emitting device includes a phosphor layer 161 disposed on a top surface of the light emitting structure 120 in opposition to the support member 151. The phosphor layer 161 may include a phosphor film or a coated layer and can be prepared as a single layer or multiple layers.

The transmissive resin layer 160 is formed between the first conductive semiconductor layer 115 and the phosphor layer 161 and the transmissive resin layer 160 may have the thickness equal to or thicker than the thickness of the protrusion 13 of the third pattern portion. The transmissive resin layer 160 may include a resin material, such as silicon or epoxy, but the embodiment is not limited thereto. The transmissive resin layer 160 is bonded to the phosphor layer 161. The transmissive resin layer 160 is disposed in the concave 14.

The phosphor layer 161 includes a transmissive resin layer containing phosphor materials. The transmissive resin layer includes silicon or epoxy, and the phosphor material includes one selected from the group consisting of YAG, TAG, silicate, nitride, and oxy-nitride-based material. The phosphor material includes at least one of a red phosphor material, a yellow phosphor material and a green phosphor material and excites a part of the light emitted from the active layer 117 in such a manner that the light has various wavelengths.

The phosphor layer 161 is disposed on a top surface S1 of the substrate 111 and lateral sides S2 of the substrate 111 and the light emitting structure 120. The phosphor layer 161 has the thickness in the range of 1~100,000 μm or 1~10,000 μm.

The phosphor layer 161 may include various phosphor layers different from each other, in which a first layer is one of red, yellow and green phosphor layers, and a second layer is disposed on the first layer and different from the first layer. Two different phosphor layers can be disposed on first and second regions, which are not overlapped with each other, respectively. A protective layer including a transmissive resin material can be disposed on the lateral sides of the phosphor layer 161 and the light emitting structure, but the embodiment is not limited thereto.

Figure 32:
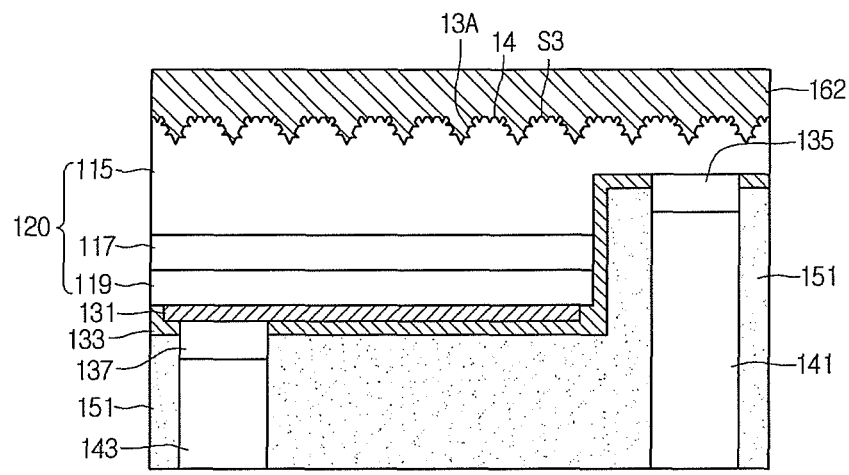
FIG. 32 is a side sectional view of a light emitting device according to the twelfth embodiment.

FIG. 32 is a side sectional view showing a light emitting device according to the twelfth embodiment.

Referring to FIG. 32, a plurality of protrusions 115A are formed at an upper portion of the first conductive semiconductor layer 115. The protrusions 115A protrude in opposition to the support member 151 to change the critical angle of the light incident through the first conductive semiconductor layer 115. Thus, the light extraction efficiency of the light emitting device can be improved. The protrusions 115A have lens shapes or polygonal shapes and are arranged in the form of a stripe pattern or a matrix. Each protrusion 115A may have a three-dimensional structure, such as a polygonal horn structure.

The first conductive semiconductor layer 115 is disposed on the top surface S3 thereof with the third pattern portion including a plurality of first concaves 13A concaved from the top surface S3 of the first conductive semiconductor layer 115 and the fourth pattern portion including second concaves 14 having the size equal to or less than 50% based on the size of the first concaves 13A is disposed on the top surface S3 planarized with the first concaves 13A. Thus, the micro concavo-convex structure can be disposed on the top surface S3 of the first conductive semiconductor layer 115 in addition to the concavo-convex structure including the first concaves 13A. The interval of the micro concavo-convex structure may be narrower than the interval of the first concaves 13A. The size and the shape of the first concaves 13A and the second concaves 14 are shown in FIG. 26.

A phosphor layer 162 is disposed at an upper portion of the first conductive semiconductor layer 115. A bottom surface of the phosphor layer 162 has a concavo-convex shape extending along the protrusions 13A and a top surface of the phosphor layer 162 has a second concavo-convex structure, which is the micro concavo-convex structure defined by the fourth pattern portion. The phosphor layer 162 may be disposed in the second concaves 14.

The phosphor layer 162 can be disposed on the top surface or a part of the top surface of the first conductive semiconductor layer 115. In addition, the phosphor layer 162 can be disposed on the lateral sides of the light emitting structure 120, but the embodiment is not limited thereto.

Figure 33:
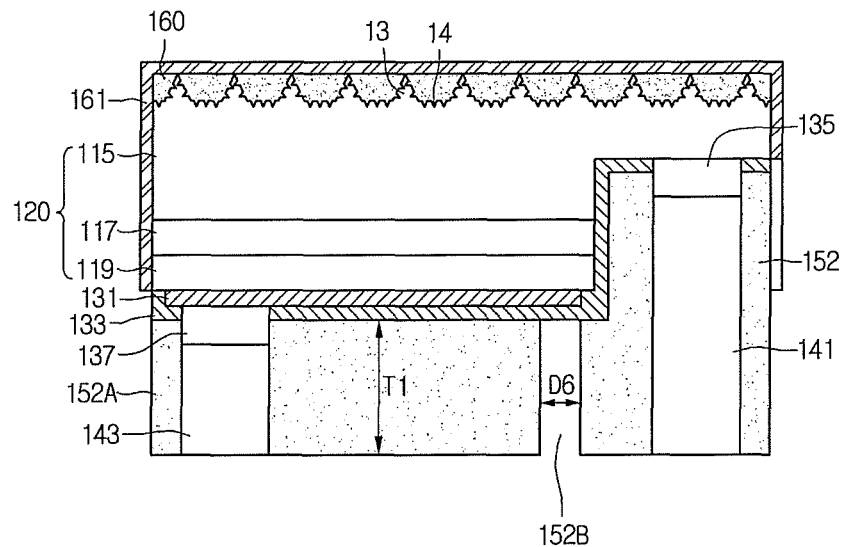
FIGS. 33 and 34 are a side sectional view and a bottom view of a light emitting device according to the thirteenth embodiment, respectively.
Figure 34:
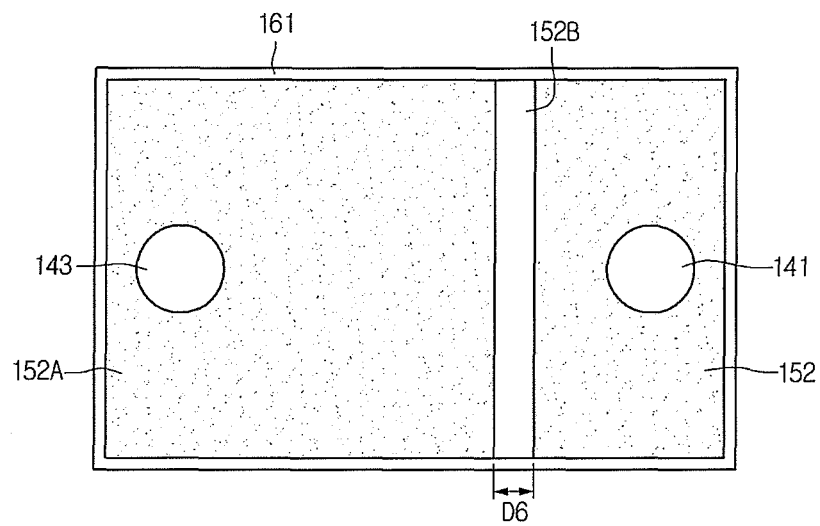

FIG. 33 is a view showing a light emitting device according to the thirteenth embodiment and FIG. 34 is a bottom view of FIG. 33.

Referring to FIGS. 33 and 34, a division slot 152B is formed between support members 152 and 152A. The division slot 152B divides the support members 152 and 152A from each other. The first support member 152 is disposed under one side of the light emitting structure 120 around the first connection electrode 141. The second support member 152A is disposed under the other side of the light emitting structure 120 around the second connection electrode 143.

The division slot 152B physically and electrically separates the first support member 152 from the second support member 152A and exposes the insulating layer 133 formed under the division slot 152B. An insulating material may be filled in the division slot 152B and the bottom surface of the insulating material is aligned on the same plane with the bottom surfaces of the first and second support members 152 and 152A.

The first and second support members 152 and 152A may include the insulating material or the conductive material. The insulating material includes a resin material having the thermal diffusion agent. The conductive material includes carbon, SiC or a metal. If the first and second support members 152 and 152A include the conductive material, the first and second electrodes 141 and 142 include materials different from the conductive material. Since the first and second support members 152 and 152A including the conductive material are separated from each other by the division slot 152B, the electric short can be prevented.

The division slot 152B has a width D6 corresponding to a distance between the first and second support members 152 and 152A, and a depth corresponding to the height T1 of the second support member 152A. The division slot 152B prevents the electric interference between the first and second support members 152 and 152A.

The bottom surfaces of the first and second support members 152 and 152A are aligned on the same plane (that is, horizontal plane) with the bottom surfaces of the first and second connection electrodes 141 and 143. The first and second support members 152 and 152A can be mounted through the first and second connection electrodes 141 and 143 even if the first and second support members 152 and 152A include the conductive materials.

An insulating material including a ceramic material can be further disposed between first and second support members 152 and 152A. In this case, the ceramic material is aligned on the same horizontal plane with the bottom surfaces of the first and second support members 152 and 152A.

The transmissive resin layer 160 may be disposed on the first conductive semiconductor layer 115 as well as in the concaves 14.

Figure 35:
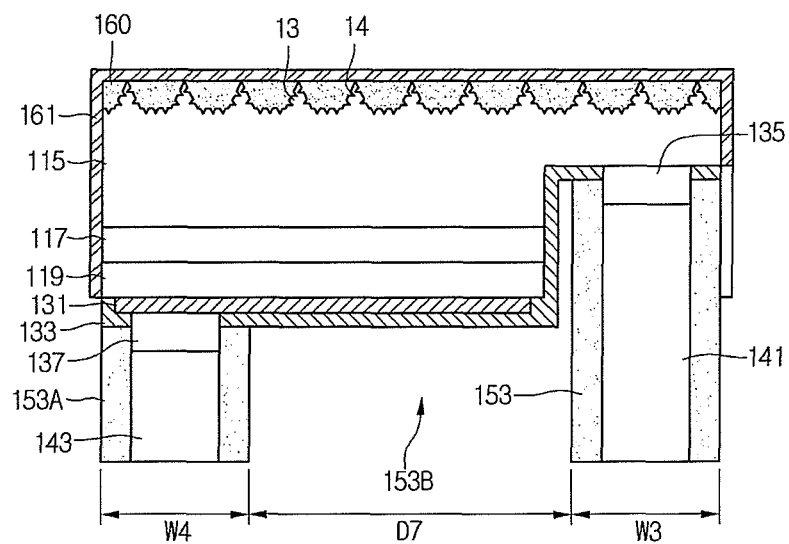
FIGS. 35 and 36 are a side sectional view and a bottom view of a light emitting device according to the fourteenth embodiment, respectively.
Figure 36:
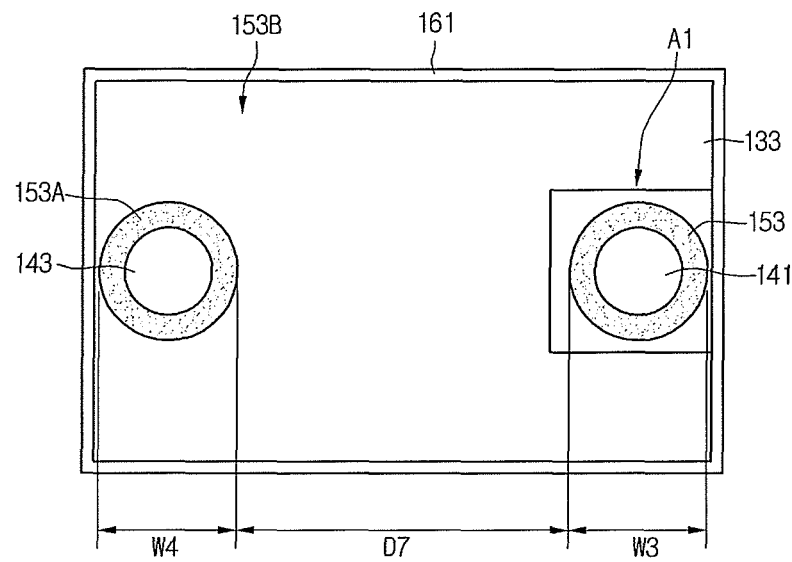

FIG. 35 is a side sectional view showing a light emitting device according to the fourteenth embodiment and FIG. 36 is a bottom view of FIG. 35.

Referring to FIGS. 35 and 36, the light emitting device includes a plurality of support members 153 and 153A aligned around the first and second connection electrodes 141 and 143. A peripheral portion of the first connection electrode 141 is covered with the first support member 153 and a peripheral portion of the second connection electrode 143 is covered with the second support member 153A. The first and second support members 153 and 153A may include insulating materials or conductive materials.

A width W3 of the first support member 153 is wider than a width of the first connection electrode 141, so that the first support member 153 may serve as a thermal and electrical conductive path together with the first connection electrode 141. A width W4 of the second support member 153A is wider than a width of the second connection electrode 143, so that the second support member 153A may serve as a thermal and electrical conductive path together with the second connection electrode 143.

A distance D7 between the first and second support members 153 and 153A is at least ½ of a length of one lateral side of the light emitting structure 120.

An insulating material including a ceramic material can be further disposed between first and second support members 153 and 153A. In this case, the ceramic material is aligned on the same plane (horizontal plane) with the bottom surfaces of the first and second support members 153 and 153A.

The transmissive resin layer 160 may be disposed on the first conductive semiconductor layer 115 as well as in the concaves 14.

Figure 37:
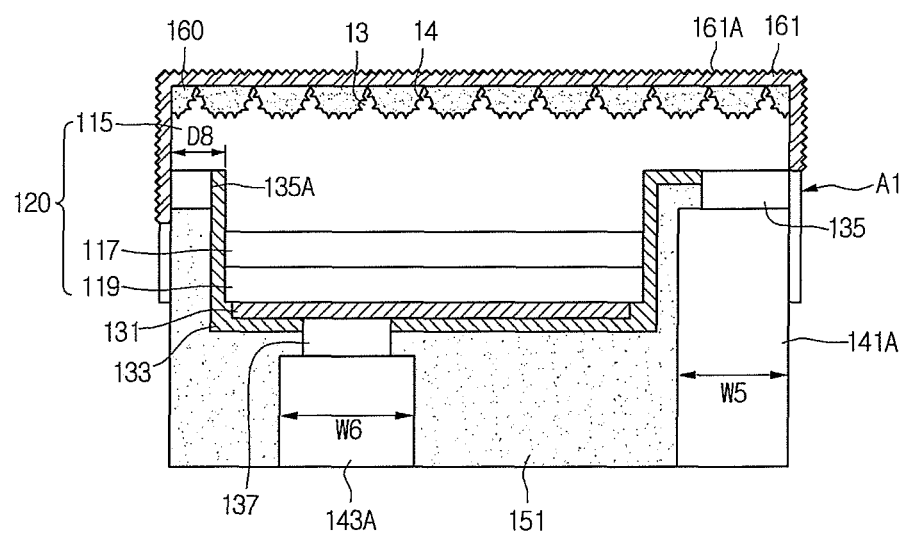
FIG. 37 is a side sectional view of a light emitting device according to the fifteenth embodiment.

FIG. 37 is a side sectional view showing a light emitting device according to the fifteenth embodiment.

Referring to FIG. 37, a width W5 of a first connection electrode 141A may be wider than a width of the first electrode 135 and lateral sides of the first connection electrode 141A and the first electrode 135 may be aligned on the same plane (vertical plane) with the lateral sides of the light emitting structure 120. The predetermined region A1 of the light emitting structure 120 may be etched such that the etch region of the first conductive semiconductor layer 115 can be exposed. An edge region of the light emitting structure 120 is spaced apart from the lateral side of the light emitting structure 120 by a predetermined distance D8 along the edge region of the first conductive semiconductor layer 115 and can be formed in a loop shape. A part 135A of the first electrode 135 is formed in a loop shape along the edge region of the first conductive semiconductor layer 115. The loop shape may include an open loop shape or a closed loop shape.

A width W6 of a second connection electrode 143A may be wider than a width of the second electrode 137.

The light extracting structure, such as roughness, can be disposed on a surface 161A of the phosphor layer 161.

The protrusions 13 of the third pattern portion and the concaves 14 of the fourth pattern portion are formed at an upper portion of the first conductive semiconductor layer 15 with different sizes from each other. The transmissive resin layer 160 is formed between the first conductive semiconductor layer 115 and the phosphor layer 161. The transmissive resin layer 160 is disposed on the first conductive semiconductor layer 115 as well as in the concaves 14.

Figure 38:
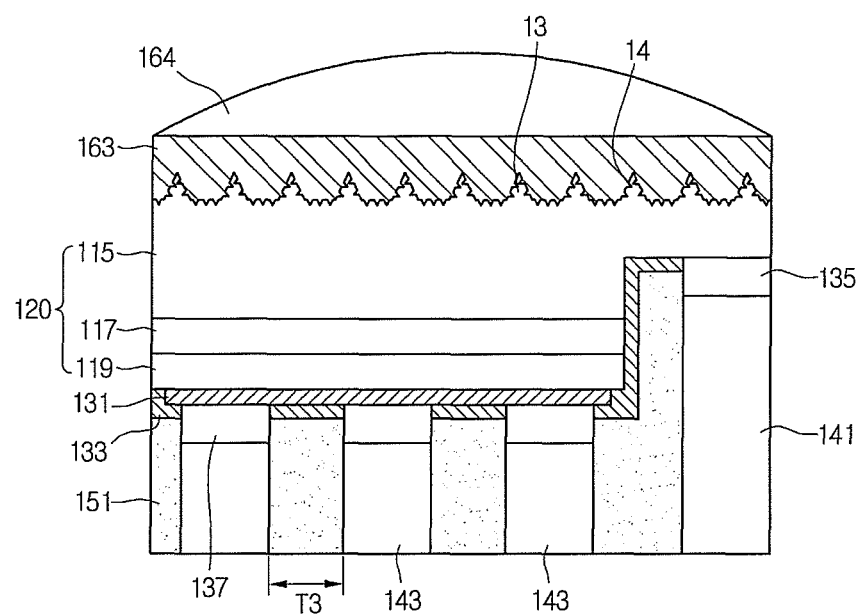
FIG. 38 is a side sectional view of a light emitting device according to the sixteenth embodiment.

FIG. 38 is a side sectional view showing a light emitting device according to the sixteenth embodiment.

Referring to FIG. 38, the light emitting device includes the first conductive semiconductor layer 115, the phosphor layer 163 and the lens 164. The phosphor layer 163 is disposed on the top surface of the first conductive semiconductor layer 115, and the lens 164 is disposed on the phosphor layer 163. The top surface of the first conductive semiconductor layer 115 may be formed with the first and second pattern portions, but the embodiment is not limited thereto. According to the embodiment, a first semiconductor layer, for instance, a buffer layer or a low conductive semiconductor layer may be further formed between the phosphor layer 163 and the first conductive semiconductor layer 115. In addition, the protrusions 13 of the third pattern portion may be disposed on the first conductive semiconductor layer 115 and the first semiconductor layer. Further, the concaves 14 of the fourth patterns portion may be disposed on the top surfaces of the protrusions 13 and the first semiconductor layer. The phosphor layer 163 may be disposed in the concaves 14.

The phosphor layer 163 has a predetermined thickness and the lens 164 disposed on the phosphor layer 163 has a convex lens shape. The lens 164 may also have a concave lens shape or an aspheric lens shape having a concavo-convex pattern, and the embodiment is not limited thereto. The lens 164 may be formed at the center of the top surface thereof with a recess concaved down with respect to peripheral regions.

A plurality of second electrodes 137 are formed under the reflective electrode layer 131, and second connection electrodes 143 are aligned under the second electrodes 137. The second connection electrodes 143 are spaced apart from each other at a predetermined interval T3. When viewed from the bottom of the light emitting device, the second connection electrodes 143 are aligned in the form of a dot matrix. The support members 151 are disposed between first and second connection electrodes 141 and 143 and between the second connection electrodes 143 to serve as an insulating support layer. Since the second connection electrodes 143 are disposed under the light emitting structure, the strength of the support member 151 can be reinforced and the electric contact efficiency can be improved. In addition, the bonding defect can be prevented from occurring at the second connection electrode 143 of the light emitting device. A plurality of first connection electrodes 141 can be provided and the embodiment is not limited thereto.

Figure 39:
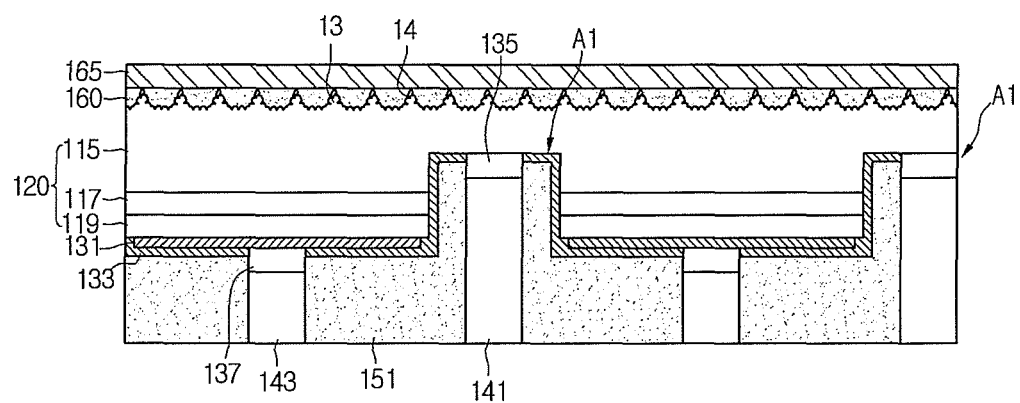
FIG. 39 is a side sectional view of a light emitting device according to the seventeenth embodiment.

FIG. 39 is a side sectional view showing a light emitting device according to the seventeenth embodiment.

Referring to FIG. 39, predetermined regions A1 of the light emitting structure 120 are etching regions to expose the first conductive semiconductor layer 115 at various regions. The first electrodes 135 are disposed under the first conductive semiconductor layer 115 and the second electrodes 137 are disposed under the reflective electrode layer 131. Since the first and second electrodes 135 and 137 are alternately aligned, the current can be uniformly supplied. The light emitting structure 120 is defined by a plurality of cells, so that the brightness can be improved. The first conductive semiconductor layer 115 is formed at the upper portion thereof with the third pattern portion including a plurality of protrusions 13 and the fourth pattern portion including a plurality of concaves 14 having a size equal to or less than 50% based on a size of the protrusions 13 of the third pattern portion. Due to the third pattern portion and the fourth pattern portion having the micro concavo-convex structure, the critical angle of the incident light can be changed. Thus, the quantity of light extracted through the upper portion of the light emitting structure 120 can be increased. The transmissive resin layer 160 may be disposed between the light emitting structure 120 and the phosphor layer 165, but the embodiment is not limited thereto. The transmissive resin layer 160 may be disposed on the first conductive semiconductor layer 115 as well as in the concaves 14.

Figure 40:
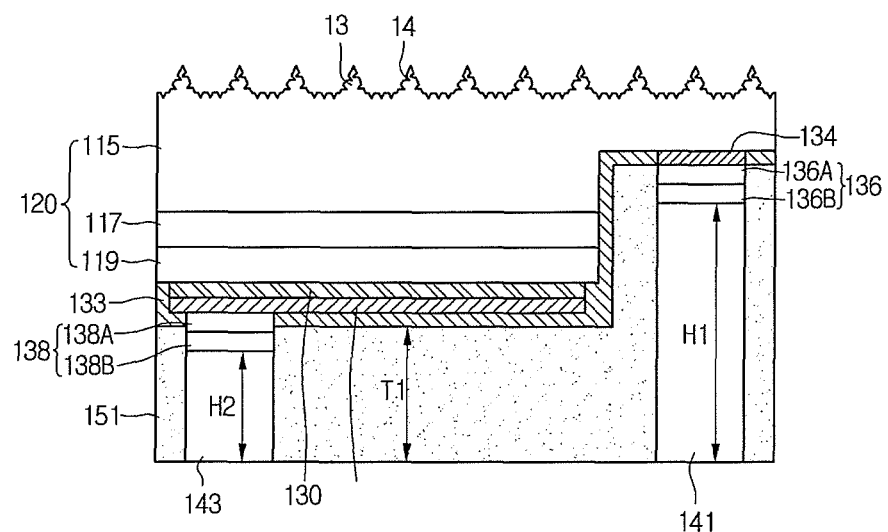
FIG. 40 is a side sectional view of a light emitting device according to the eighteenth embodiment.

FIG. 40 is a side sectional view showing a light emitting device according to the eighteenth embodiment. In the following description of the ninth embodiment, the same reference numerals will be assigned to the elements and structures that have been described in the first embodiment and detailed description thereof will be omitted in order to avoid redundancy.

Referring to FIG. 40, the reflective electrode layer 130 and the second electrode pad 132 are disposed under the light emitting structure 120 and the reflective electrode layer 130 serves as an ohmic and reflective electrode under the second conductive semiconductor layer 119. The second electrode pad 132 has a layered shape or pattern shape.

A first electrode pad 134 is disposed under the first conductive semiconductor layer 115. The first electrode pad 134 makes contact with the first conductive semiconductor layer 115 and is bonded between a first electrode bonding layer 136 and the first conductive semiconductor layer 115. The first electrode bonding layer 136 is bonded between the first electrode pad 134 and the first connection electrode 141 to electrically connect the first electrode pad 134 with the first connection electrode 141. The first electrode bonding layer 136 includes a first bonding electrode 136A and a second bonding electrode 136B under the first bonding electrode 136A. The first bonding electrode 136A is bonded to the first electrode pad 134 and the second bonding electrode 136B is bonded between the first connection electrode 141 and the first bonding electrode 136A.

The first electrode pad 134 has the structure with a material and a thickness the same as those of the stack structure of the second electrode pad 132, which will be described later. For instance, the first and second electrode pads 134 and 132 include an adhesive layer, a reflective layer under the adhesive layer, a diffusion barrier layer under the reflective layer, and a bonding layer under the diffusion barrier layer. The first electrode bonding layer 136 is bonded between the first connection electrode 141 and the first electrode pad 134 to improve the bonding property between the first connection electrode 141 and the first electrode pad 134.

The first bonding electrode 136A of the first electrode bonding layer 136 is bonded with the second bonding electrode 136B bonded to the first connection electrode 141, so that the physical bonding and electrical connection property of the first connection electrode 141 can be improved.

The reflective electrode layer 130 is formed under the second conductive semiconductor layer 119 and the second electrode pad 132 is formed under the reflective electrode layer 130. A bottom surface area of the reflective electrode layer 130 may be equal to or smaller than a top surface area of the second electrode pad 132, but the embodiment is not limited thereto. A second electrode bonding layer 138 is formed between the second electrode pad 132 and the second connection electrode 143 to improve the bonding strength between the second electrode pad 132 and the second connection electrode 143.

The second electrode bonding layer 138 connects the second electrode pad 132 with the second connection electrode 143. The second electrode bonding layer 138 includes a third bonding electrode 138A and a fourth bonding electrode 138B under the third bonding electrode 138A. The third bonding electrode 138A is bonded to the second electrode pad 132 and the fourth bonding electrode 138B is bonded between the second connection electrode 143 and the third bonding electrode 138A.

The second electrode bonding layer 138 is bonded between the second connection electrode 143 and the second electrode pad 132 to improve the bonding property between the second connection electrode 143 and the second electrode pad 132. The first electrode pad 134 serves as a first electrode and the second electrode pad 132 serves as a second electrode.

Figure 41:
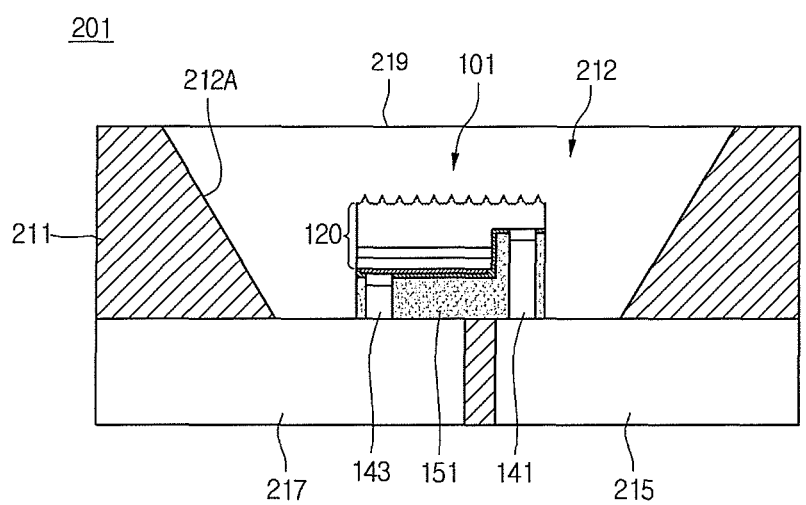
FIG. 41 is a sectional view showing a light emitting device package having the light emitting device of FIG. 26.

FIG. 41 is a sectional view showing a light emitting device package having the light emitting device of FIG. 26.

Referring to FIG. 41, the light emitting device package 201 includes a body 211, first and second lead electrodes 215 and 217 installed in the body 211, a molding member 219 and the light emitting device 101.

The body 211 is injection molded by using one of a high reflective resin (for instance, PPA), a polymeric material or a plastic material and can be prepared as a substrate having a single layer or a multiple layers. The body 211 includes a cavity 212 having an open top surface, in which a sidewall 212A of the cavity 212 is inclined or vertical to a bottom surface of the cavity 212.

The first and second lead electrodes 215 and 217 are disposed in the cavity 212 such that the first and second lead electrodes 215 and 217 are spaced apart from each other.

The light emitting device 100 according to the previous embodiment(s) is bonded onto the first and second lead electrodes 215 and 217 through the flip scheme. In detail, the first connection electrode 141 of the light emitting device 101 is bonded to the first lead electrode 215 and the second connection electrode 143 of the light emitting device 101 is bonded to the second lead electrode 217.

The distance between the top surface of the first lead electrode 215 and the bottom surface of the light emitting device 100, that is, the bottom surfaces of the first connection electrode 141, the second connection electrode 143 and the support member 151 may be equal to the distance between the top surface of the second lead electrode 217 and the bottom surface of the light emitting device 100, but the embodiment is not limited thereto.

The support member 151 of the light emitting device 101 is disposed on the first lead electrode 215 and the second lead electrode 217 to dissipate the heat through the entire surface of the support member 151.

The molding member 219 is formed in the cavity 212. The molding member 219 includes a transmissive resin material, such as silicon or epoxy. The molding member 219 may further include a phosphor material.

The most of the light generated from the light emitting device 100 is extracted through the top surface and the lateral sides of the light emitting device 100 and the extracted light is dissipated to the outside through the molding member 219. The quantity of the light extracted through the top surface of the light emitting device 100 may be increased due to the third and fourth pattern portions shown in FIG. 26, so the light loss in the light emitting device 101 can be reduced.

One or a plurality of light emitting devices can be mounted in the light emitting device package 201, but the embodiment is not limited thereto. If the light emitting device having the phosphor layer as shown in FIG. 31 is mounted in the light emitting device package, the phosphor material may not be added to the molding member 219. In addition, various phosphor materials different from each other or phosphor materials emitting similar colors can be added to the molding member 219.

<Lighting System>

The light emitting device according to the embodiment is applicable to a lighting system. The lighting system includes a structure in which a plurality of light emitting devices are arrayed. The lighting system includes a display apparatus shown in FIGS. 42 and 43, a light unit shown in FIG. 44, a lighting lamp, a signal lamp, a headlamp for a vehicle, and an electronic display.

Figure 42:
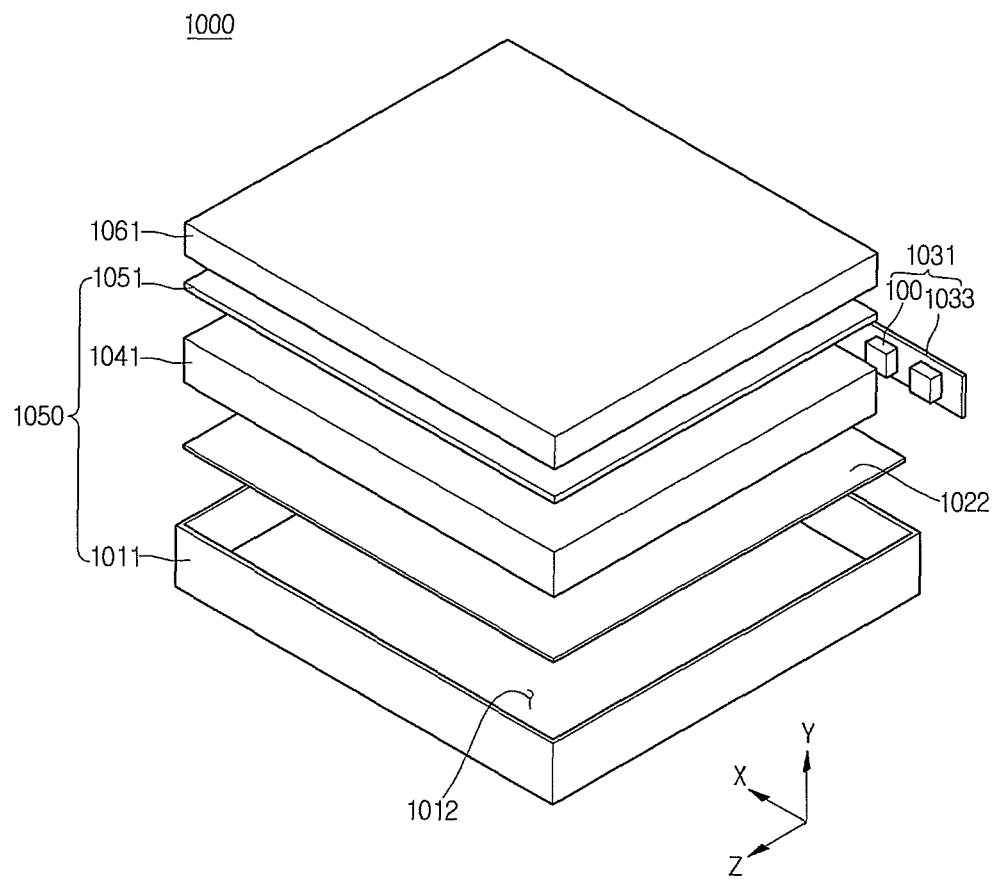
FIG. 42 is a perspective view showing a display apparatus having the light emitting device according to the embodiment.

FIG. 42 is an exploded perspective view showing a display apparatus having the light emitting device according to the embodiment.

Referring to FIG. 42, a display apparatus 1000 according to the embodiment includes a light guide plate 1041, a light emitting module 1031 to supply light to the light guide plate 1041, a reflective member 1022 under the light guide plate 1041, an optical sheet 1051 on the light guide plate 1041, a display panel 1061 on the optical sheet 1051, and a bottom cover 1011 to receive the light guide plate 1041, the light emitting module 1031, and the reflective member 1022, but the embodiment is not limited thereto.

The bottom cover 1011, the reflective sheet 1022, the light guide plate 1041, the optical sheet 1051, and the light unit 1050 may be defined as a light unit 1050.

The light guide plate 1041 diffuses the light supplied from the light emitting module 1031 to provide surface light. The light guide plate 1041 may include a transparent material. For example, the light guide plate 1041 may include one of acryl-based resin, such as PMMA (poly methyl methacrylate, PET (polyethylene terephthalate), PC (polycarbonate), COC (cyclic olefin copolymer) and PEN (polyethylene naphtha late) resin.

The light emitting module 1031 is disposed on at least one side of the light guide plate 1041 to supply the light to at least one side of the light guide plate 1041. The light emitting module 1031 serves as the light source of the display device.

At least one light emitting module 1031 is disposed to directly or indirectly supply the light from one side of the light guide plate 1041. The light emitting module 1031 may include a board 1033 and the light emitting device according to the embodiments or the light emitting device 100. The light emitting device or the light emitting device 100 are arranged on the board 1033 while being spaced apart from each other at the predetermined interval.

The board 1033 may include a printed circuit board (PCB) including a circuit pattern (not shown). In addition, the board 1033 may also include a metal core PCB (MCPCB) or a flexible PCB (FPCB) as well as a typical PCB, but the embodiment is not limited thereto. If the light emitting device 100 is installed on the side of the bottom cover 1011 or on a heat dissipation plate, the board 1033 may be omitted. The heat dissipation plate partially makes contact with the top surface of the bottom cover 1011.

In addition, the light emitting device 100 are arranged such that light exit surfaces to discharge light of the light emitting device 100 are spaced apart from the light guide plate 1041 by a predetermined distance on the board 1033, but the embodiment is not limited thereto. The light emitting device 100 may directly or indirectly supply the light to a light incident surface, which is one side of the light guide plate 1041, but the embodiment is not limited thereto.

The reflective member 1022 is disposed below the light guide plate 1041. The reflective member 1022 reflects the light, which is traveled downward through the bottom surface of the light guide plate 1041, toward the display panel 1061, thereby improving the brightness of the light unit 1050. For example, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving section 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for example, is an LCD panel including first and second transparent substrates, which are opposite to each other, and a liquid crystal layer interposed between the first and second substrates. A polarizing plate can be attached to at least one surface of the display panel 1061, but the embodiment is not limited thereto. The display panel 1061 displays information by allowing the light to pass therethrough. The display device 1000 can be applied to various portable terminals, monitors of notebook computers, monitors or laptop computers, and televisions.

The optical sheet 1051 is disposed between the display panel 1061 and the light guide plate 1041 and includes at least one transmissive sheet. For example, the optical sheet 1051 includes at least one selected from the group consisting of a diffusion sheet, a horizontal and vertical prism sheet, and a brightness enhanced sheet. The diffusion sheet diffuses the incident light, the horizontal and vertical prism sheet concentrates the incident light onto the display panel 1061, and the brightness enhanced sheet improves the brightness by reusing the lost light. In addition, a protective sheet can be disposed on the display panel 1061, but the embodiment is not limited thereto.

The light guide plate 1041 and the optical sheet 1051 can be disposed in the light path of the light emitting module 1031 as optical members, but the embodiment is not limited thereto.

Figure 43:
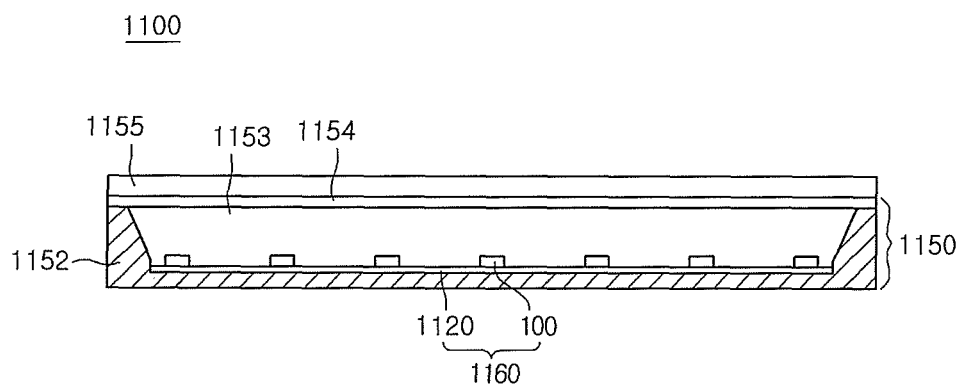
FIG. 43 is a sectional view showing a display apparatus according to the embodiment.

FIG. 43 is a sectional view showing a display apparatus according to the embodiment.

Referring to FIG. 43, the display device 1100 includes a bottom cover 1152, a board 1120 on which the light emitting device 100 are arrayed, an optical member 1154, and a display panel 1155.

The board 1120 and the light emitting device 100 may constitute the light emitting module 1160. In addition, the bottom cover 1152, at least one light emitting module 1160, and the optical member 1154 may constitute the light unit. The bottom cover 1151 can be disposed with a receiving section 1153, but the embodiment is not limited thereto. The light emitting module 1160 includes a board 1120, and a plurality of light emitting devices 100 arranged on the board 1120 or a light emitting device 100.

The optical member 1154 may include at least one selected from the group consisting of a lens, a light guide plate, a diffusion sheet, a horizontal and vertical prism sheet, and a brightness enhanced sheet. The light guide plate may include PC or PMMA (Poly methyl methacrylate). The light guide plate can be omitted. The diffusion sheet diffuses the incident light, the horizontal and vertical prism sheet concentrates the incident light onto a display region, and the brightness enhanced sheet improves the brightness by reusing the lost light.

The optical member 1154 is disposed above the light emitting module 1160 in order to convert the light emitted from the light emitting module 1160 into the surface light.

Figure 44:
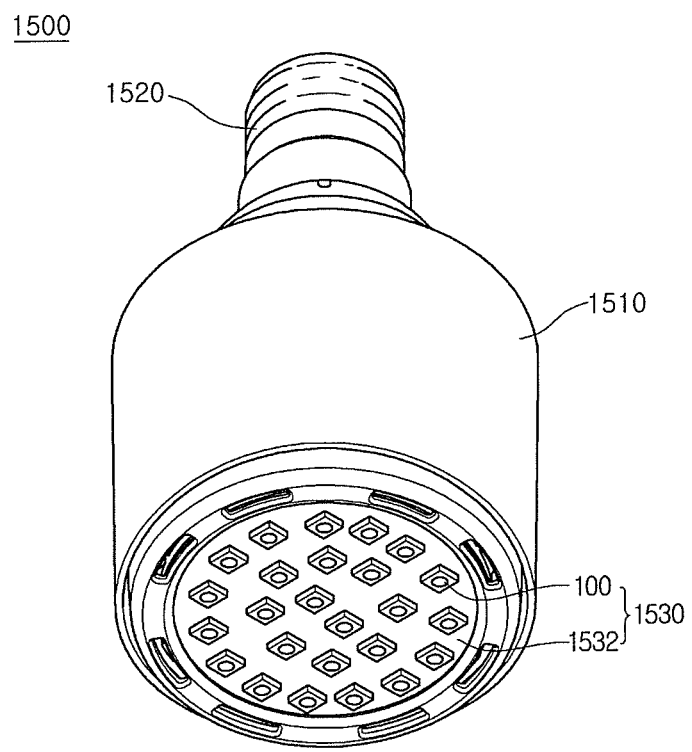
FIG. 44 is an exploded perspective view showing of a lighting unit having the light emitting device according to the embodiment.

FIG. 44 is an exploded perspective view showing of a lighting unit having the light emitting device according to the embodiment.

Referring to FIG. 44, the lighting unit 1500 may include a case 1510, a light emitting module 1530 including in the case 1510, and a connection terminal 1520 including in the case 1510 and supplied with an electric power from an external power supply.

The case 1510 may be preferably formed of a material having good heat shielding characteristics, for example, a metal material or a resin material.

The light emitting module 1530 may include a board 1532, and at least one light emitting device 100 according to the embodiments mounted on the board 1532. The light emitting device 100 may include a plurality of light emitting device packages which are arrayed apart by a predetermined distance from one another in a matrix configuration.

The board 1532 may be an insulator substrate on which a circuit pattern is printed, and may include, for example, a printed circuit board (PCB), a metal core PCB, a flexible PCB, a ceramic PCB, an FR-4 substrate, etc.

Also, the board 1532 may be formed of a material to efficiently reflect light, and a surface thereof may be formed in a color capable of efficiently reflecting light, for example, in white color, or silver color.

The at least one light emitting device 100 may be mounted on the board 1532. Each of the light emitting devices 100 may include at least one light emitting diode (LED) chip. The LED chip may include a color LED emitting red, green, blue or white light, and a UV LED emitting ultraviolet (UV).

The light emitting module 1530 may have a combination of various light emitting devices so as to obtain desired color and luminance. For example, the light emitting module 1530 may have a combination of a white LED, a red LED, and a green LED so as to obtain a high color rendering index (CRI).

The connection terminal 1520 may be electrically connected to the light emitting module 1530 to supply power. The connection terminal 1520 may be screwed and coupled to an external power in a socket type, but the present disclosure is not limited thereto. For example, the connection terminal 1520 may be made in a pin type and inserted into an external power, or may be connected to the external power through a power line.

A method of manufacturing a light emitting device according to the embodiment includes the steps of forming a light emitting structure including a first conductive semiconductor layer, an active layer and a second first conductive semiconductor layer on a substrate; etching the light emitting structure such that the first conductive semiconductor layer is partially exposed; forming a reflective electrode layer on the light emitting structure; forming an insulating layer on the reflective electrode layer and the light emitting structure; forming a first electrode on the first conductive semiconductor layer and forming a second electrode on the reflective electrode layer; forming a first connection electrode on the first electrode and forming a second connection electrode on the second electrode; forming a support layer on the insulating layer such that the support layer has a height corresponding to a top surface of the first and second connection electrodes; removing the substrate after the support member has been formed; and etching a top surface of the light emitting structure where the substrate is removed to form a third pattern portion having at least one of a concave shape and a convex shape and a fourth pattern portion having a micro concavo-convex structure with a width smaller than a width of a protrusion of the third pattern portion on the top surface of the light emitting structure and on the protrusion, wherein a ceramic-based thermal diffusion agent is formed in the support member.

A method of manufacturing a light emitting device according to the embodiment includes the steps of forming a light emitting structure including a first conductive semiconductor layer, an active layer and a second first conductive semiconductor layer on a substrate; etching the light emitting structure such that the first conductive semiconductor layer is partially exposed; forming a reflective electrode layer on the light emitting structure; forming an insulating layer on the reflective electrode layer and the light emitting structure; forming a first electrode on the first conductive semiconductor layer and forming a second electrode on the reflective electrode layer; forming a first connection electrode on the first electrode and forming a second connection electrode on the second electrode; forming a support layer on the insulating layer such that the support layer has a height corresponding to a top surface of the first and second connection electrodes; and etching a bottom surface of the substrate to form a first pattern portion having at least one of a concave shape and a convex shape and a second pattern portion having a micro concavo-convex structure with a size smaller than a size of the first pattern portion on a top surface of the substrate and the first pattern portion, wherein a ceramic-based thermal diffusion agent is formed in the support member.

The embodiment has the following effects. According to the embodiment, the mounting process for the light emitting device can be improved in the flip mounting scheme. According to the embodiment, the light emitting device is packaged in the wafer level, so that the packaging process can be omitted, thereby reducing the manufacturing steps. According to the embodiment, the light extraction efficiency of the light emitting device can be improved. According to the embodiment, the light dissipation efficiency of the light emitting device can be improved. According to the embodiment, concavo-convex structures having different sizes from each other are disposed on the top surface of the substrate so that the light extraction efficiency can be improved. According to the embodiment, concavo-convex structures having different sizes from each other are disposed on the top surface of the light emitting structure so that the light extraction efficiency can be improved. According to the embodiment, the reliability of the light emitting apparatus having the light emitting device, which is mounted through the flip scheme, the display device and the lighting device can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a transmissive substrate;
a first pattern portion disposed on a top surface of the transmissive substrate and including a plurality of protrusions;
a second pattern portion disposed on the top surface of the transmissive substrate and the plurality of protrusions, and the second pattern portion including a plurality of concaves;
a light emitting structure disposed under a bottom surface of the transmissive substrate and including a first conductive semiconductor layer, a second conductive semiconductor layer and an active layer between the first conductive semiconductor layer and the second conductive semiconductor layer;
a transmissive resin layer on the plurality of protrusions and the plurality of concaves;
a first semiconductor layer disposed between the light emitting structure and the transmissive substrate and physically contacted with the bottom surface of the transmissive substrate;
a first electrode under the first conductive semiconductor layer;
a reflective electrode layer under the second conductive semiconductor layer;
a second electrode under the reflective electrode layer;
a first connection electrode under the first electrode;
a second connection electrode under the second electrode;
an insulating support member disposed under the reflective electrode layer; and
an insulating layer between the insulating support member and the reflective electrode layer,
wherein the first connection electrode and the second connection electrode are overlapped with the first conductive semiconductor layer in a vertical direction,
wherein a thickness of the insulating support member is greater than a thickness of the insulating layer in the vertical direction,
wherein the plurality of concaves includes a plurality of first concaves in the plurality of protrusions and a plurality of second concaves in a region of the top surface of the transmissive substrate disposed between the plurality of protrusions,
wherein each first concave of the plurality of first concaves has a concave shape from a curved top surface of a protrusion of the plurality of protrusions,
wherein each first concave of the plurality of first concaves has a bottom portion having a width smaller than a width of a top portion thereof,
wherein each first concave of the plurality of first concaves is recessed in a direction inward from the curved top surface of a protrusion of the plurality of protrusions,
wherein each first concave of the plurality of first concaves has a width gradually narrowed toward the bottom surface of the transmissive substrate, wherein each second concave of the plurality of second concaves has a width gradually narrowed in a direction toward the bottom surface of the transmissive substrate, wherein the plurality of second concaves are spaced apart from each other, wherein a bottom portion of each protrusion of the plurality of protrusions has a width smaller than a width of the first connection electrode, wherein the insulating support member includes a ceramic-based thermal diffusion agent, wherein the insulating support member includes a first support member around the first electrode and the first connection electrode, a second support member around the second electrode and the second connection electrode, and a divided slot disposed between the first support member and the second support member, the first support member being completely separated from the second support member by the divided slot, and wherein a depth of the divided slot is the same as a thickness of the second support member of the insulating support member in the vertical direction.

2. The light emitting device of claim 1, wherein the plurality of first concaves are spaced apart from each other.

3. The light emitting device of claim 2, further comprising a phosphor layer on the transmissive resin layer, wherein a part of the phosphor layer contacts a part of the plurality of protrusions.

4. The light emitting device of claim 3, wherein the transmissive resin layer is disposed between the transmissive substrate and the phosphor layer, wherein a part of the transmissive resin layer is disposed in each concave of the plurality of concaves, wherein the transmissive resin layer has a thickness smaller than a thickness of the transmissive substrate in the vertical direction.

5. The light emitting device of claim 3, wherein the phosphor layer includes a lateral portion disposed on a plurality of side surfaces of the light emitting structure.

6. The light emitting device of claim 2, further comprising a printed circuit board under the insulating support member, wherein the printed circuit board includes a first electrode pad connected to the first connection electrode and a second electrode pad connected to the second connection electrode, and wherein a bottom surface of the insulating support member is spaced apart from a top surface of the printed circuit board.

7. The light emitting device of claim 1, wherein the plurality of protrusions have a hemispheric shape, and wherein the plurality of protrusions are aligned at a regular interval and the plurality of concaves are aligned at an irregular interval.

8. The light emitting device of claim 7, wherein the top portion of each concave of the plurality of first concaves has the width corresponding to 50% or less based on the width of the bottom portion of each protrusion of the plurality of protrusions.

9. The light emitting device of claim 8, wherein the width of the bottom portion of each protrusion of the plurality of protrusions is in a range of 0.1 μm to 10 μm.

10. The light emitting device of claim 1, wherein the ceramic-based thermal diffusion agent comprises at least one of oxide, nitride, fluoride and sulfide including at least one of Al, Cr, Si, Ti, Zn and Zr.

11. The light emitting device of claim 1, wherein a distance between the first and second connection electrodes is ½ or more of a length of one lateral side of the transmissive substrate, wherein a lower surface of the insulating layer is exposed through the divided slot, and wherein a width of the divided slot is greater than the width of the first connection electrode.

12. The light emitting device of claim 1, wherein the thickness of the insulating layer is smaller than a thickness of the first electrode and a thickness of the second electrode, and wherein the first insulating support member contacts lateral surfaces of the first electrode and the first connection electrode.

13. The light emitting device of claim 12, wherein the insulating layer includes a Distributed Bragg Reflection (DBR) structure in which first and second layers having refractive indexes different from each other are alternately aligned.

14. A light emitting device comprising:

a transmissive substrate;

a first pattern portion disposed on a top surface of the transmissive substrate and including a plurality of protrusions;

a second pattern portion disposed on the top surface of the transmissive substrate and the plurality of protrusions, and the second pattern portion including a plurality of concaves;

a buffer layer physically contacted with a bottom surface of the transmissive substrate and formed of a semiconductor layer;

a first semiconductor layer under the buffer layer;

an active layer under the first semiconductor layer, a second semiconductor layer under the active layer;

a transmissive resin layer on the plurality of protrusions and the plurality of concaves;

a first electrode under the first semiconductor layer;

a reflective electrode layer under the second semiconductor layer;

a second electrode under the reflective electrode layer;

a first connection electrode under a bottom surface of the first electrode;

a second connection electrode under a bottom surface of the second electrode;

an insulating support member disposed under the reflective electrode layer; and an insulating layer between the insulating support member and the reflective electrode layer, wherein the plurality of concaves are disposed on protrusions of the plurality of protrusions, wherein the first electrode and the second electrode contact the insulating layer, wherein the transmissive resin layer has a thickness smaller than a thickness of the transmissive substrate in a vertical direction, wherein the plurality of concaves includes a plurality of first concaves in each of the plurality of protrusions and a plurality of second concaves in a region of the top surface of the transmissive substrate disposed between the plurality of protrusions, wherein each first concave of the plurality of first concaves has a concave shape from a curved top surface of a protrusion of the plurality of protrusions, wherein each first concave of the plurality of first concaves has a bottom portion having a width smaller than a width of a top portion thereof, wherein each second concave of the plurality of second concaves has a bottom portion having a width smaller than a width of a top portion thereof, wherein each first concave of the plurality of first concaves is formed in a direction inward from the curved top surface of a protrusion of the plurality of protrusions, wherein each first concave of the plurality of first concaves has a width gradually narrowed toward the bottom surface of the transmissive substrate, wherein each second concave of the plurality of second concaves has a width gradually narrowed toward the bottom surface of the transmissive substrate, wherein the plurality of first concaves are spaced apart from each other, wherein the plurality of second concaves are spaced apart from each other, and wherein a bottom portion of each protrusion of the plurality of protrusions has a width smaller than a width of the first connection electrode, wherein the insulating support member includes a first support member around the first electrode and the first connection electrode, a second support member around the second electrode and the second connection electrode, and a divided slot between the first support member and the second support member, the first support member being completely separated from the second support member by the divided slot, wherein a depth of the divided slot is the same as a thickness of the second support member of the insulating support member in the vertical direction, and wherein the insulating layer includes a Distributed Bragg Reflection (DBR) structure in which first and second layers having refractive indexes different from each other are alternately aligned.

15. The light emitting device of claim 14, further comprising a phosphor layer disposed on the transmissive resin layer, wherein a top surface of the phosphor layer has a roughness on a surface.

16. The light emitting device of claim 15, wherein a part of the phosphor layer contacts a part of the plurality of protrusions.

17. The light emitting device of claim 16, wherein the transmissive resin layer is disposed between the transmissive substrate and the phosphor layer, wherein a part of the transmissive resin layer is disposed in each concave of the plurality of concaves.

18. The light emitting device of claim 17, wherein the transmissive resin layer is disposed between protrusions of the plurality of protrusions, wherein the first connection electrode and the second connection electrode are overlapped with the first semiconductor layer in the vertical direction, wherein a thickness of the insulating support member is greater than a thickness of the insulating layer in the vertical direction, wherein the first insulating support member contacts lateral surfaces of the first electrode and the first connection electrode.

19. The light emitting device of claim 14, wherein the insulating support member includes a ceramic-based thermal diffusion agent, wherein the ceramic-based thermal diffusion agent comprises at least one of oxide, nitride, fluoride and sulfide including at least one of Al, Cr, Si, Ti, Zn and Zr.

20. The light emitting device of claim 14, further comprising a printed circuit board under the insulating support member, wherein the printed circuit board includes a first electrode pad connected to the first connection electrode and a second electrode pad connected to the second connection electrode, and wherein a bottom surface of the insulating support member is spaced apart from a top surface of the printed circuit board, wherein the width of the first connection electrode is wider than a width of the first electrode, and a width of the second connection electrode is wider than a width of the second electrode, and wherein a distance between the first and second connection electrodes is ½ or more of a length of one lateral side of the transmissive substrate.

* * * * *